(12) United States Patent
Tomishima et al.

(10) Patent No.: US 6,480,946 B1
(45) Date of Patent: Nov. 12, 2002

(54) MEMORY SYSTEM FOR SYNCHRONIZED AND HIGH SPEED DATA TRANSFER

(75) Inventors: Shigeki Tomishima, Hyogo (JP); Masatoshi Ishikawa, Hyogo (JP); Tsukasa Ooishi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/283,758

(22) Filed: Apr. 2, 1999

(30) Foreign Application Priority Data

Nov. 9, 1998 (JP) ............................................. 10-318169

(51) Int. Cl.[7] ...................... G06F 12/00; G06F 13/42; G06F 1/12; H04L 7/00; H04L 5/00
(52) U.S. Cl. ...................... 711/167; 711/170; 713/400; 713/503; 713/401
(58) Field of Search ................................. 711/167, 170; 713/400, 401, 500, 503; 365/233; 710/128, 126

(56) References Cited

U.S. PATENT DOCUMENTS

| | | | | |
|---|---|---|---|---|
| 5,893,158 A | * | 4/1999 | Furuta | 711/150 |
| 6,034,878 A | * | 3/2000 | Osaka | 365/52 |
| 6,109,929 A | * | 8/2000 | Jasper | 439/74 |
| 6,178,518 B1 | * | 1/2001 | Toda | 713/600 |
| 6,211,703 B1 | * | 4/2001 | Takekuma | 326/101 |

OTHER PUBLICATIONS

"Rambus Inc. Formulates Specifications for Direct Rambus DRAMs, Targeting Main Memory of PCs in 1999(Part 2)", Nikkei Electronics, Feb. 23, 1998, pp. 163–176.
"Source Synchronization and Timing Vernier Techniques for 1.2GB/s SLDRAM Interface", Y. Morooka et al., 1998 IEEE International Solid–State Circuits Conference, Digest Technical Papers, pp. 1–5, Figures 1–5 and Table 1.
"Rambus Inc. formulates specifications for Direct Rambus DRAM's, targeting main memory of PCs in 1999 (Part 2)", Nikkei Electronics, Feb. 23, 1998, pp. 163–176.

* cited by examiner

Primary Examiner—Do Hyun Yoo
Assistant Examiner—Kimberly McLean
(74) Attorney, Agent, or Firm—McDermott, Will & Emery

(57) ABSTRACT

A plurality of memory devices are connected parallel to each other commonly to signal lines extending in one direction, and signals are transmitted in one direction along the signal lines. The sum of the time of signal propagation from a transmission unit to a selected memory device and the time of signal propagation from the selected memory devices to a reception unit is constant for every memory device. Therefore, offset in access times to the memory chips in the memory system can be eliminated.

20 Claims, 41 Drawing Sheets

CL=2
BST=8

CL=1.5
BST=8

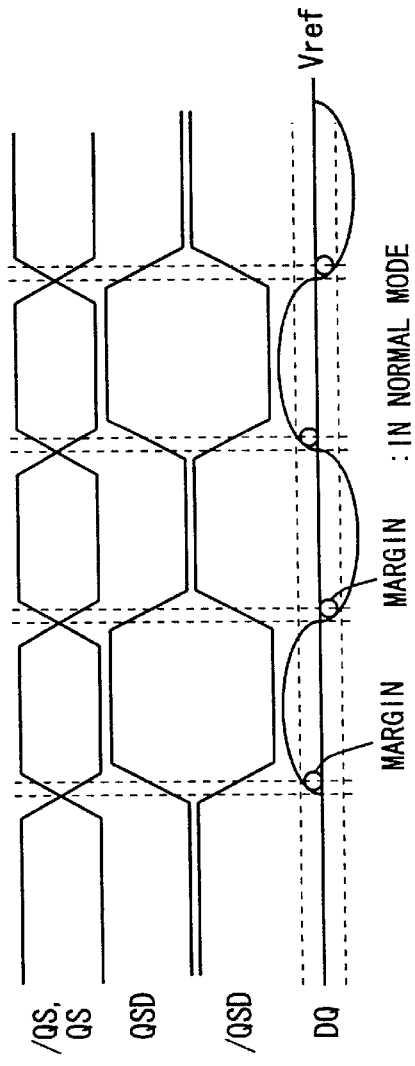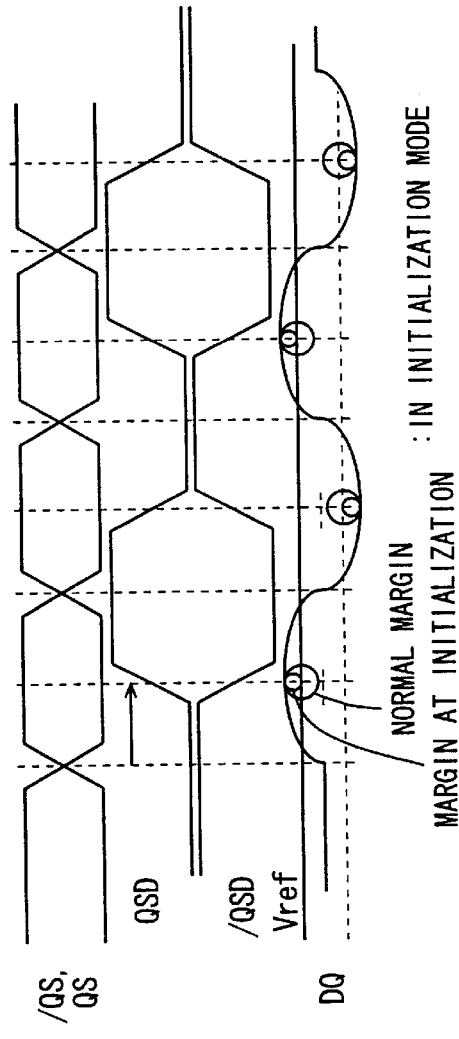

CHIP ADDRESS (CALCULATION OF DELAY
OVER ENTIRE LINE LENGTH)

MEMORY SYSTEM FOR SYNCHRONIZED AND HIGH SPEED DATA TRANSFER

BACKGROUND OF THE INVENTION

1. Field of the Invention

The present invention relates to a memory system and, more specifically, to such a memory system that a plurality of discrete memory devices connected parallel to a bus transmit/receive signals to and from a commonly provided controller. More specifically, the present invention relates to a memory system in which the plurality of discrete memory devices are memory devices operating in synchronization with a clock signal.

2. Description of the Background Art

FIG. 56 shows an example of a conventional memory system configuration. In FIG. 56, a plurality of discrete memory devices (memory chips) CH#0 to CH#n are arranged in parallel. A clock signal line CKBS for transmitting a clock signal CLK from a clock driver CKD, a command/address bus CDBS for transmitting an address and a command for designating an operation mode, and a data bus DTBS for transferring data DQ are provided common to the memory chips CH#0 to CH#n. The clock signal line CKBS, the command/address bus CDBS and the data bus DTBS are coupled to a memory controller MC controlling operations of memory chips CH#0 to CH#n.

Memory controller MC transmits a command designating an operation mode and an address on command/address bus CDBS in synchronization with clock signal CLK on clock signal line CKBS. Each of the memory chips CH#0 to CH#n take in the command and address signals applied on command/address bus CDBS in synchronization with clock signal CLK, to perform the designated operation. Data bus DTBS is a bi-directional data bus and the data bus transmits write data from memory controller MC to memory chips CH#0 to CH#n at the time of data write and, transmits data read from memory chips CH#0 to CH#n to memory controller MC at the time of data read.

As it is possible to transfer data in synchronization with clock signal CLK, data transfer at high speed is realized. Further, as the plurality of memory chips CH#0 to CH#n are provided in parallel, a memory system having large storage capacity can be implemented.

A memory chip for such a memory system may include a synchronous dynamic random access memory (SDRAM), a SYNCLINK DRAM (SLDRAM) and a Rambus DRAM (RDRAM)).

In a memory system using these clock synchronous memories, every data bus DTBS is a bi-directional data bus, and write data D and read data Q are both transferred through data bus DTBS.

In a conventional memory system, time of arrival of data DQ transmitted through data bus DTBS at memory controller MC differs among memory chips CH#0 to CH#n. In order to realize accurate data transmission/reception between memory controller MC and each of the memory chips CH#0 to CH#n, a clock signal (DCLK or QS) used for taking data only is utilized (DDR SDRAM (double data rate SDRAM), an SLDRAM, a direct RDRAM and so on).

At the time of data write, memory controller MC transmits both the write data and a data write strobe clock signal providing a timing for taking the write data. At the time of data read, memory chips CH#0 to CH#n transmit the read data and a clock signal (QS) for data taking together to memory controller MC. Therefore, as data and the clock signal providing the timing for data taking are transmitted over the same distance, there is only a little skew between the clock signal and the data, and hence data can be taken in at a relatively accurate timing.

In the conventional memory system, however, taking of the command designating an operation mode and the address signal is performed simply in synchronization with the clock signal CLK with no consideration at all of the skew (derived from line resistance and line capacitance) between the clock signal CLK and the command/address. Therefore, it is necessary that memory chips CH#0 to CH#n start up internal operation taking into account a margin for the skew between the clock signal and the command or address, which necessity hinders high speed access.

Further, the distance between memory chip CH#0 and memory controller MC is the shortest while the distance between memory chip CH#n and memory controller MC is the longest. Thus, time of data transfer between memory chip CH#0 and memory controller MC is the shortest, while the time of data transfer between memory chip CH#n and memory controller MC is the longest. In order to eliminate difference among time periods of signal propagation from memory chips CH#0 to CH#n (signal flight time), the number of memory chips CH#0 to CH#n may be made as small as possible to shorten the length of data bus DTBS. In that case, however, the number of memory chips contained in the memory system is limited, making it difficult to provide a memory system having large strange capacity.

Let us consider an approach in which flight times of data when data are read from memory chips CH#0 to CH#n are made equal, so that memory chips CH#0 to CH#n come to have the same response to a command. Here, it becomes necessary to make longer the latency of memory chip CH#0 and to make shorter the latency of memory chip CH#n. Here, the latency refers to the number of clock cycles necessary from an application of a read command until valid data is output to data bus DTBS. Therefore, in this case, it is necessary for memory chips closer to memory controller MC to have the latency longer than necessary, which means that performance of memory chips closer to memory controller MC is degraded.

When read data Q and write data D are to be transmitted through bi-directional data bus DTBS, it is necessary that read data Q arrives at memory controller MC and thereafter write data D is transmitted to bi-directional data bus DTBS. Therefore, if the data bus DTBS is long and data is to be read from the farthest memory chip CH#n, the write data cannot be transmitted to data bus DTBS until after the read data arrives at memory controller MC. This lowers efficiency in use of data bus DTBS, hindering implementation of a high speed memory system. In a data write, it is necessary to read data while preventing collision with the write data, taking into account the time period necessary for the write data to arrive at the farthest memory chip CH#n, which similarly lowers the efficiency in use of the data bus DTBS.

SUMMARY OF THE INVENTION

A object of the present invention is to provide a memory system which significantly improves efficiency in use of the. data bus.

Another object of the present invention is to provide a memory system capable of efficient data transfer without unnecessarily degrading performance of the memory chip.

A further object of the present invention is to provide a memory system capable of accurate transmission/reception of signals including data between memory chips and a controller, regardless of the distance between the controller and the memory chips.

In accordance with a first aspect, the memory system includes a first signal bus arranged between a first port and a second port arranged opposing to the first port, coupled to the first and second ports, for transmitting signals including data in one direction from the first port to the second port, and a plurality of first individual memory devices coupled to the first signal bus in parallel with each other, for communicating signals with the first signal bus.

According to the second aspect, the memory system includes a plurality of individual memory devices arranged on a first surface of a base board, a line disposed electrically continuous over the first surface and a second surface opposing to the first surface of the base board, to which the plurality of individual memory devices are coupled in common, and a control unit coupled in common to the plurality of individual memory devices through the line for transmitting and receiving signals to and from the plurality of individual memory devices through the line. Along one direction of the line, the sum of a line length from the control unit to one individual memory device and line length from the one individual memory device to the control unit is substantially the same for each one of the plurality of individual memory devices.

As the signals including data are transmitted along one direction, respective individual memory devices come to have the same signal flight time, and therefore high speed access is possible. Further, it is unnecessary to change latency dependent on the position of the memory device, and therefore initialization procedure is simplified, and the memory devices can be operated with full performance.

Further, as the line transmitting the signal and data is arranged over opposing surfaces of the base board, it becomes possible to arrange a transmission/reception unit at one side end of the base board, which facilitates connection to an external device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 42A is a timing chart related to an operation in a normal operation mode of the circuit shown in FIG. 41, and FIG. 42B is a timing chart related to an operation in an initialization mode.

DESCRIPTION OF THE PREFERRED EMBODIMENTS

First Embodiment

Figure 1:
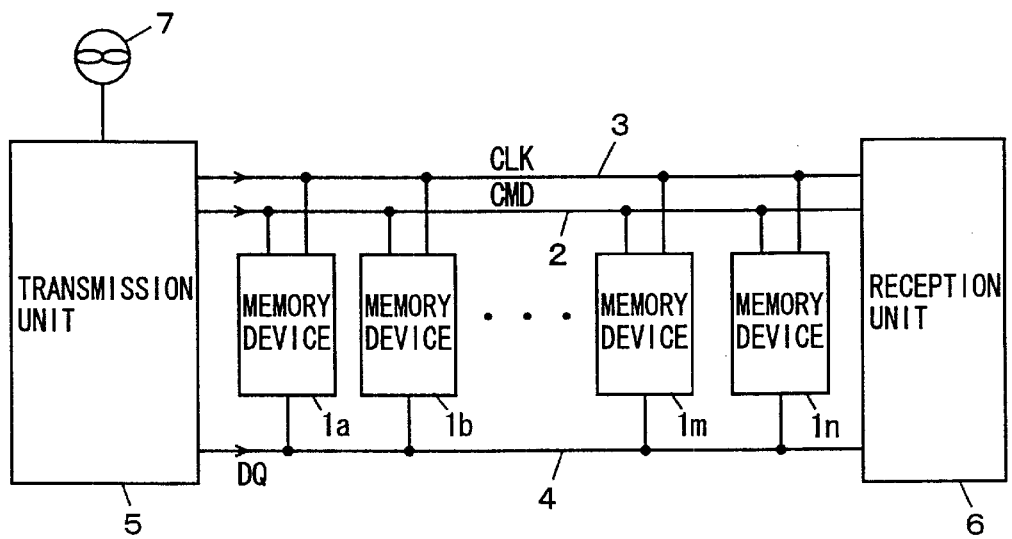
FIG. 1 is a schematic diagram representing a configuration of a memory system in accordance with a first embodiment of the present invention.

FIG. 1 is a schematic diagram representing a configuration of the memory system in accordance with the first embodiment of the present invention. Referring to FIG. 1, a plurality of memory devices 1a–1n each operating in synchronization with a clock signal are arranged in parallel. Each of the memory devices 1a to 1n may be a single chip, or a memory module having a plurality of memory chips (provided that delay time in the memory module is negligible).

Figure 56:
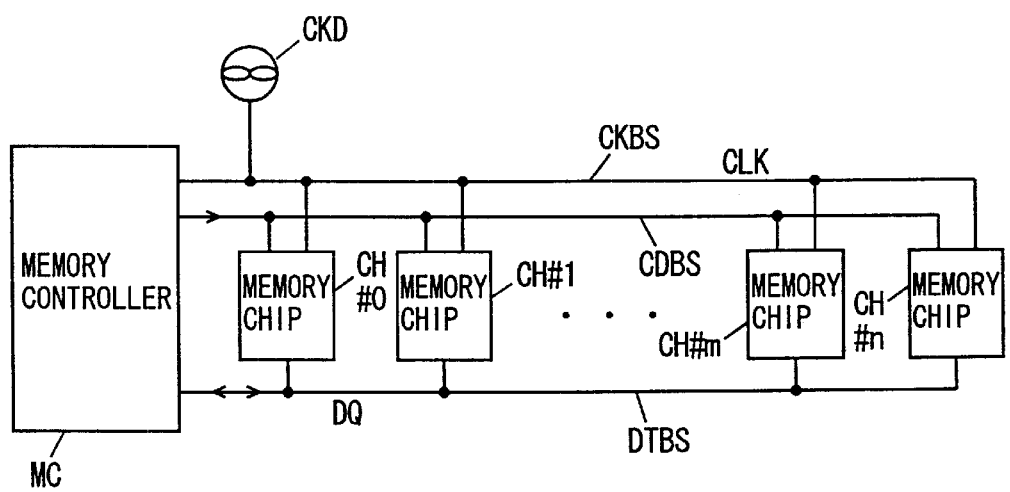
FIG. 56 is a schematic diagram representing a configuration of a conventional memory system.

A clock signal line 3 transmitting a clock signal CLK defining an operation cycle, a command bus 2 for transmitting a command CMD and a data bus 4 for transmitting data DQ are arranged commonly to memory devices 1a to 1n. Command bus 2 also transmits an address signal. At opposing ends of clock signal line 3, command bus 2 and data bus 4, a transmission unit 5 and a reception unit 6 are arranged. Transmission unit 5 and reception unit 6 has the function of transmission and reception with memory controller MC shown in FIG. 56, respectively.

Transmission unit 5 transmits a command CMD and an address to command bus 2 in synchronization with clock signal CLK from a clock driver 7, and also transmits clock signal CLK to clock signal line 3. Transmission unit 5 further transmits write data DQ to data bus 4. Reception unit 6 receives clock signal CLK applied through clock signal line 3, the command/address applied through command bus 2, and data DQ applied through data bus 4. Therefore, command bus 2, clock signal line 3 and data bus 4 transmit signals along one direction from transmission unit 5 to reception unit 6. The sum of distance to transmission unit 5 and the distance to reception unit 6 is the same for every memory device. Therefore, as will be described in detail later, the skew between clock signal CLK and each of the command, address and the data can be eliminated. The reason for this is that the signal flight time in a data write is the same for each of the memory devices 1a to 1n, and that the sum of the time period for transmission of the command/address and the time period for transmission of the read data to the reception unit is the same in the data read.

Figure 2A:
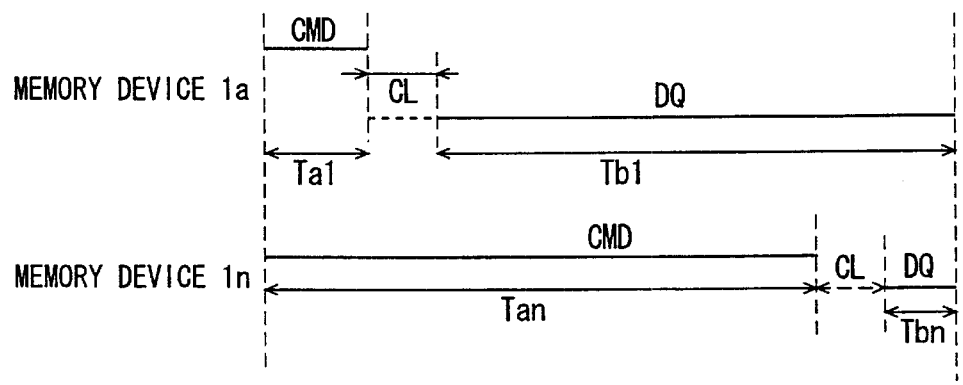
FIG. 2A represents signal propagation time in a data read and FIG. 2B represents signal propagation time in a data write, in the memory system shown in FIG. 1.

FIG. 2A is a schematic illustration representing the flight time of signals in a data read for memory devices 1a to 1n. Referring to FIG. 2A, memory devices 1a to 1n all have the same column latency (read latency) CL. In FIG. 2A, the command CMD and the address arrive at memory device 1a from transmission unit 5 after the lapse of a time period Ta1. Memory device 1a performs a memory cell selecting operation in accordance with the command CMD and the address taken in synchronization with the clock signal CLK, and after the lapse of column latency CL, transmits valid data to data bus 4. Data DQ on data bus 4 is transmitted to reception unit 6 after the lapse of a time period Tb1.

At memory device 1n, the command CMD and the address from transmission unit 5 arrive after the lapse of a time period Tan. Memory device 1n performs a memory selecting operation in accordance with the command CMD and the address taken in synchronization with clock signal CLK, and outputs data to data bus 4 after the lapse of column latency CL. The data DQ from memory device In arrives at reception unit 6 after the lapse of a time period Tbn. The distance between transmission unit 5 and reception unit 6 is constant. Therefore, in a data read, the following relation holds.

$$Ta1+Tb1+CL=Tan+Tbn+CL$$

Therefore, as the column latency CL is the same for every one of the memory devices 1a to 1n, the sum of the time period necessary for the command to reach the memory device and the time necessary for reading data in accordance with the command and for the read out data to reach the reception unit is the same for all the memory devices 1a to 1n (Ta+Tb=constant).

Therefore, even when column latency CL is set at a minimum value in accordance with the characteristic features of memory devices 1a to 1n, the memory devices 1a to 1n are capable of transmitting read data to transmission unit 6 with the same response characteristic to a command output from transmission unit 5.

The command, the address and the clock signal are transmitted in a common one direction through transmitting command bus 2 and clock signal line 3, and there is not any skew therebetween. Further, the read data and clock signal CLK are also transmitted in the same direction and there is not any skew therebetween at the time of arrival at reception unit 6. Accordingly, it is possible to initialize all the memory devices 1a to 1n in the same state, complicated initialization procedure is unnecessary, and therefore procedure in starting up the memory system is simplified. Further, in reception unit 6, when the command CMD arrives, the read data is transmitted through data bus 4 after the lapse of column latency CL of the memory devices 1a to 1n, and therefore sampling of valid data is facilitated.

Figure 2B:
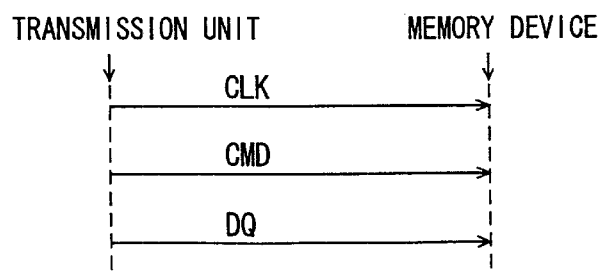

FIG. 2B is a schematic diagram representing flight time of each signal at the time of data write. As shown in FIG. 2B, when the data is written, clock signal CLK, command CMD, the address and write data DQ are transmitted in one direction from transmission unit 5. Therefore, clock signal CLK, command CMD, the address and the write data DQ arrive at the memory device, to which the data is to be written, at the same timing. Accordingly, it is possible for the memory device to take the write data in response to the clock signal accurately (as there is no skew generated among the signals and the data).

First Modification

Figure 3:
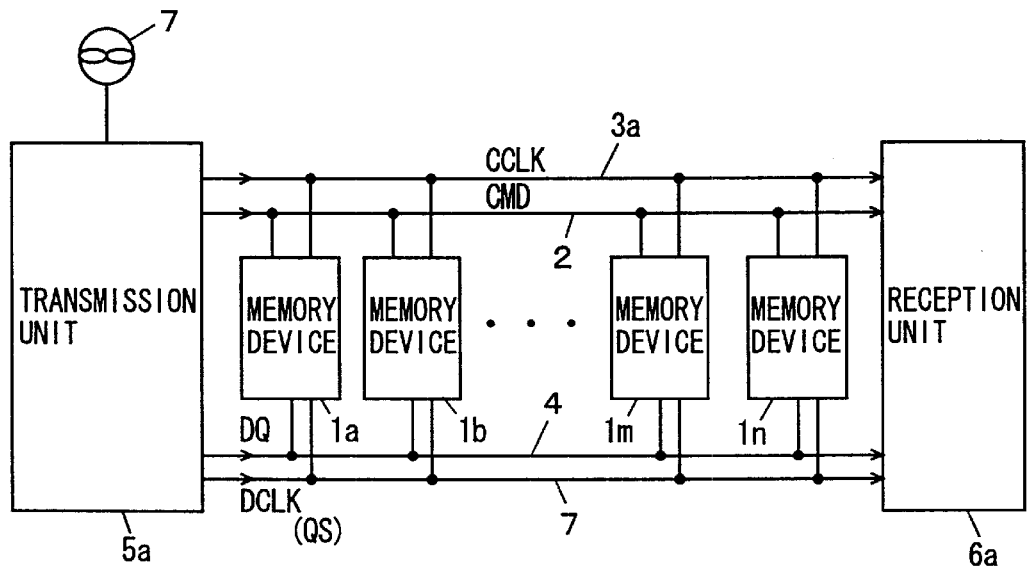
FIG. 3 is a schematic diagram representing a configuration of a modification of the first embodiment in accordance with the present invention.

FIG. 3 is a schematic diagram representing configuration of a first modification in accordance with the first embodiment of the present invention.

In the configuration shown in FIG. 3, between transmission unit 5a and reception unit 6a, a strobe clock signal line 7 is provided for transmitting a clock signal DCLK (or QS) for data strobe. Strobe clock signal line 7 is coupled commonly to memory devices 1a to 1n. Clock signal DCLK on strobe clock signal line provides a data write timing to memory devices 1a to 1n when data is to be written. When data is to be read, memory devices 1a to 1n transmit a clock signal (QS) providing a timing of sampling read data to strobe clock signal line 7, simultaneously with the read data.

For command bus 2 transmitting the command CMD and the address, a command clock signal CCLK providing a timing of taking the command and the address is transmitted through a clock signal line 3a. Command clock signal line 3a is also arranged extending from transmission unit 5a to reception unit 6a and coupled commonly to memory devices 1a to 1n. Command clock signal CCLK defines an operation cycle of memory devices 1a to 1n.

In the configuration shown in FIG. 3, memory devices 1a to 1n each are a DDR DRAM or an SLDRAM. Even in this configuration in which a clock signal DCLK for data strobe is transmitted using strobe clock signal line 7 separate from the clock signal CCLK for taking the command and the address, similar effects as obtained by the configuration shown in FIG. 1 can be provided, as the data bus 4 and strobe clock signal line 7 have the same length and transmit signals in the same direction, and command clock signal line 3a and command bus 2 have the same length and transmit signals in the same direction. Clock signal line 7 for data strobe is arranged close to data bus 4, and therefore skew between data DQ and clock signal DCLK derived from line resistance and parasitic capacitance can be reduced, whereby data sampling with higher accuracy is possible.

Figure 4:
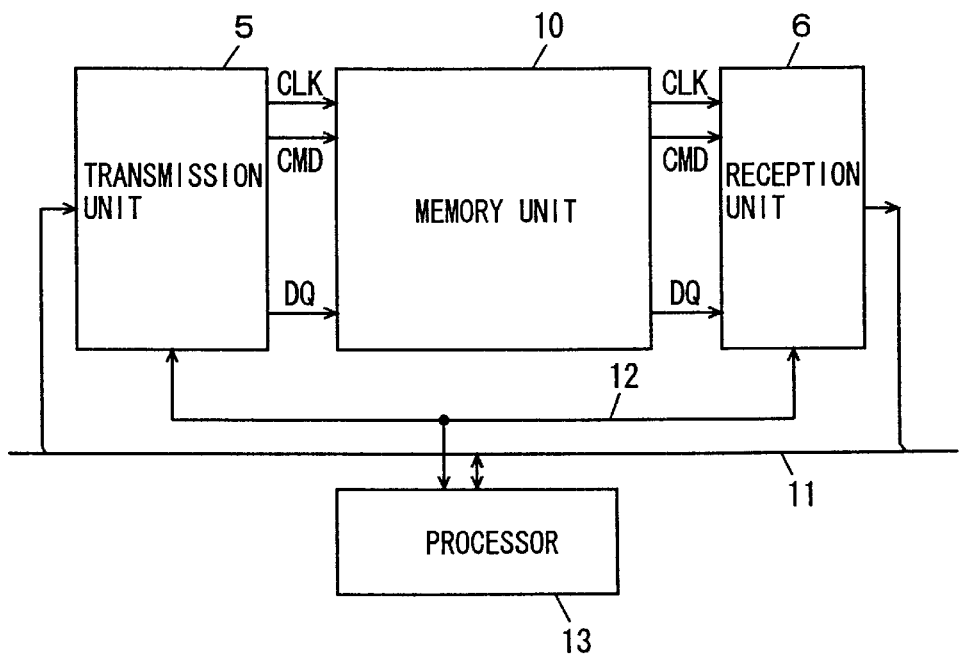
FIG. 4 is a schematic diagram representing a configuration of a processing system using the memory system in accordance with the first embodiment of the present invention.

FIG. 4 is a schematic diagram representing an exemplary configuration of a data processing system using the memory system in accordance with the first embodiment of the present invention. Referring to FIG. 4, in this example, a memory unit 10 is arranged between transmission unit 5 and reception unit 6. Memory unit 10 includes memory devices 1a to 1n, clock signal line 3 (3a), command bus 2 and data bus 4, which are shown in FIGS. 1 and 3. Memory unit 10 may be implemented in the form of a module, as a unit (memory unit 10, transmission unit 5 and reception unit 6 are provided by individual devices).

Transmission unit 5 and reception unit 6 are coupled to a processor 13 through a system data bus 11 and a control bus 12. At the time of a data write, processor 13 provides a write instruction through control bus 12 and transmits write data through system data bus 11 to transmission unit 5. Upon reception of a data write request from processor 13, transmission unit 5 detects state of use of the bus in memory unit 10, and outputs a signal indicating acknowledgement or non-acknowledgement of data reception to processor 13, in accordance with the detected result. When the data bus in memory unit 10 is free, allowing data transmission, transmission unit 5 provides an acknowledge signal through control bus 12 to processor 13, and processor 13 transmits data together with the address to transmission unit 5 through system data bus 11.

At the time of a data read, processor 13 receives a data transmission request from reception unit 6 and when system data bus 11 is free, processor 13 transmits a data reception acknowledge to reception unit 6 through control bus 12. In system data bus 11, data is transmitted from processor 13 to transmission unit 5, and data is transmitted from reception unit 6 to processor 13. Other control devices may be connected to system data bus 11, or the data bus may be used only for the system.

Because of this handshaking (transmission/reception of request/acknowledge signals) among transmission unit 5, reception unit 6 and processor 13, accurate data transfer is possible in accordance with the state of the data bus in memory unit 10. This configuration is equivalent to a configuration in which the operations performed by the conventional memory controller MC for data transmission to and from processor 13 are allocated to transmission unit 5 and reception 6, respectively.

Figure 5:
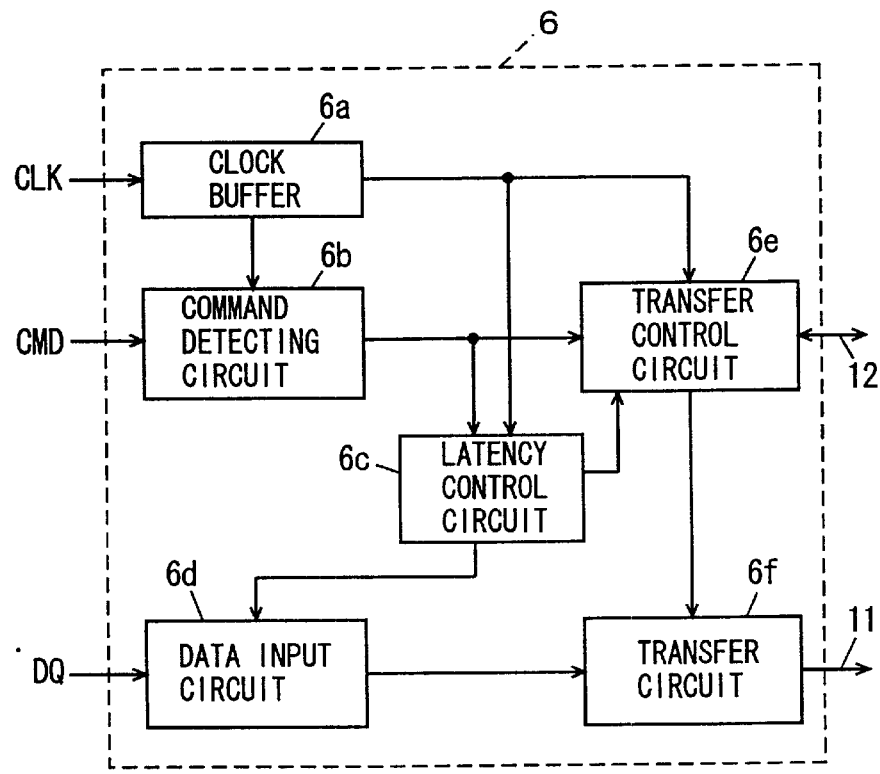
FIG. 5 is a schematic diagram representing a configuration of the reception unit shown in FIG. 4.

FIG. 5 is a schematic diagram showing a configuration of reception unit 6 shown in FIG. 4. Referring to FIG. 5, reception unit 6 includes: a clock buffer 6a receiving clock signal CLK (CCLK) for generating an internal clock signal; a command detecting circuit 6b operating in synchronization with the internal clock signal from clock buffer 6a for detecting whether the command CMD is a read command instructing data reading or not; a latency control circuit 6c operating in synchronization with the internal clock signal from clock buffer 6a, activated in response to a read command detection instructing signal from command detecting circuit 6b for counting a prescribed latency period (a time period of clock signal CLK necessary from application of a read command until an output of valid data); a data input circuit 6d activated under the control of latency control circuit 6c for taking data DQ applied through the data bus; and a transfer control circuit 6e for asking processor 13 as to whether signal transfer is necessary or not through control bus 12, in response to the read command detecting signal from command detecting circuit 6b, and when a data transfer permission is applied through control bus 12, successively transferring data applied to data input circuit 6a. through transfer circuit 6f and system data bus 11 after the lapse of the latency period.

In the configuration of the reception unit shown in FIG. 5, the clock signal CLK and the command CMD from the transmission unit are applied at the same timing to clock buffer 6a and command detecting circuit 6b (transfer pathes have the same length). Latency control circuit 6c stores column latency CL information set in memory devices 1a to 1n and, when the read command is detected, activates the data input circuit 6d after the lapse of column latency CL. Data input circuit 6d takes the data DQ in synchronization with the internal clock signal applied from latency control circuit 6c or clock buffer 6a. Transfer circuit 6f successively takes the data from data input circuit 6b. In accordance with transfer control designating signal from transfer control circuit 6e, transfer circuit 6f transmits data through system data bus 11 to processor 13.

When strobe clock signal QS is used, latency control is unnecessary. In accordance with data strobe clock signal QS, data input circuit 6d takes in data.

Figure 6:
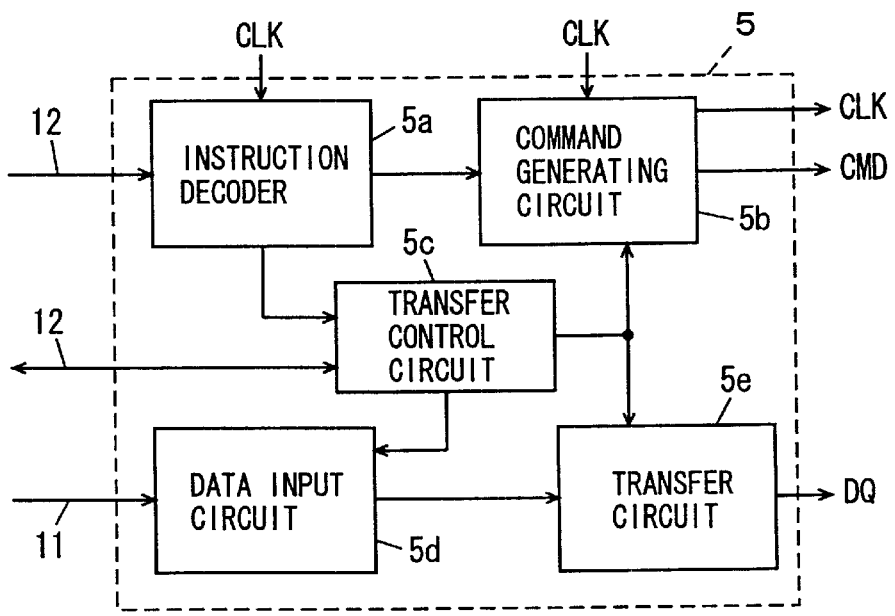
FIG. 6 is a schematic diagram representing a configuration of the transmission unit shown in FIG. 4.

FIG. 6 is a schematic diagram representing a configuration of transmission unit 5 shown in FIG. 4. Referring to FIG. 6, transmission unit 5 includes: an instruction decoder 5a for decoding an instruction applied from the processor through control bus 12; a command generating circuit 5b for generating a command for writing data in accordance with a data store instruction from instruction decoder 5a; a transfer control circuit 5c responsive to the store instruction from instruction decoder 5a for adjusting data transfer from processor 13 through control bus 12 and for permitting data transfer to system bus 11 when reception of data is possible; a data input circuit 5d for taking in data applied through system bus 11 under the control of transfer control circuit 5c; and a transfer circuit 5e for transferring the data taken by data input circuit 5d as write data DQ under the control of transfer control circuit 5c. Further, command generating circuit 5b transmits the generated command CMD together with clock signal CLK under the control of transfer control circuit 5c.

An instruction applied to instruction decoder 5a through control bus 12 includes an instruction directing an access to memory unit 10 such as a load instruction or a store instruction generated from a cash controller at the time of a cash miss, for example. When an instruction designating an access to the memory unit is applied, transfer control circuit 5c monitors the state of accessing to memory unit 10 and, based on the result of monitoring, controls data transfer in the handshake manner with processor 13.

Command generating circuit 5b generates, in accordance with the instruction decoded by instruction decoder 5a, a command necessary for executing the applied instruction. When a data access instruction is received, for example, it generates an active command for driving a memory array of the memory unit to an active state, a command indicating data write or data read, a precharge command indicating end of data access, and so on. Further, address information is applied to instruction decoder 5a through control bus 12, and in accordance with the address information included in the instruction applied to instruction decoder 5a, command generating circuit 5b generates an address to memory unit 10.

When access to memory unit 10 is possible, transfer control circuit 5c activates command generating circuit 5b and transfer circuit 5e at prescribed timings, and executes writing of data.

The command generated by command generating circuit 5b may be in the form of a packet (SLDRAM, direct DRAM) or in the common form in which one command designating one instruction is generated in one clock cycle in accordance with the type of memory devices 1a to 1n included in the memory unit. Such form of the command is appropriately determined in accordance with the type of the memory device used. When data strobe clock signal CCLK is used, transfer circuit 5e transmits the data strobe clock signal.

Commands necessary for the read/write operation are generated in transmission unit 5, and applied to memory unit 10, and when data is to be written, write data is transferred from transfer circuit 5e. When data is to be read, transfer circuit 5e is in an output high-impedance state, and an input circuit of reception unit 6 takes data in.

Here, the instruction is applied to instruction decoder 5a through control bus 12. An instruction bus and an address bus may be provided separate from control bus 12.

As described above, according to the first embodiment of the present invention, a plurality of memory devices are connected in parallel, and the clock signal, the command, the address and the data are transferred along one direction. Therefore, access time in these memory devices are all the same, and therefore data access with full performance of the memory devices is possible. Further, as the data, command, address and clock signal are transferred in the same direction, there is not any skew generated among the clock, command, address and data, and therefore accurate data access is possible.

Second Embodiment

Figure 7:
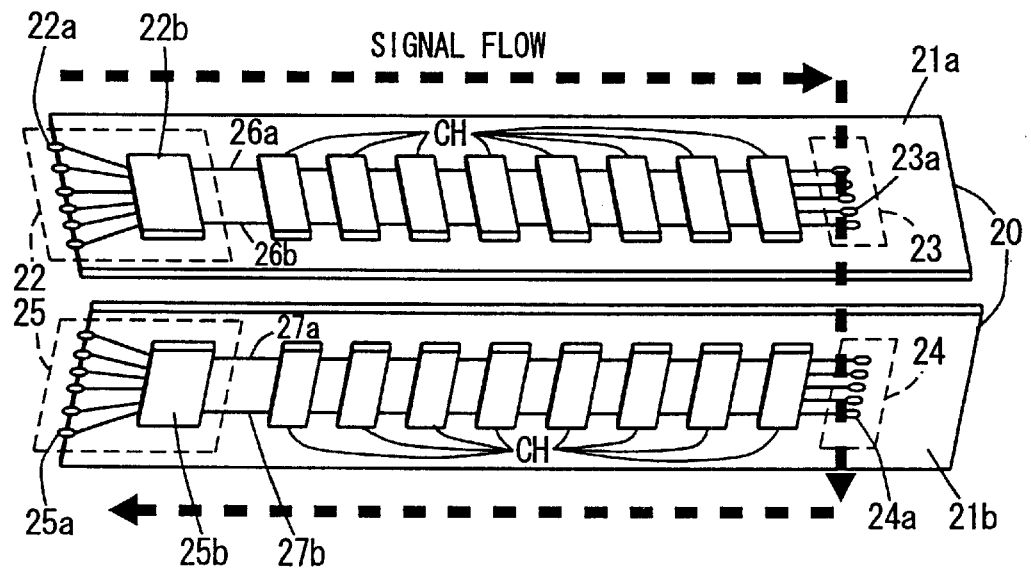
FIG. 7 is a schematic illustration showing a configuration of the memory system in accordance with a second embodiment of the present invention.

FIG. 7 is a schematic illustration showing the configuration of the memory system in accordance with the second embodiment of the present invention. Referring to FIG. 7, the memory system includes a plurality of memory chips CH arranged on a first surface 21a of a base board 20, and a plurality of memory chips CH arranged on a second surface 21b of base board 20. Base board 20 may be a mounting board used when a memory module is formed, or it may be a printed circuit board used for board level assembly. Memory chips CH may be a flip chip or a package device.

On a first surface 21a of base board 20, a first port 22 for an interface with an outside is arranged, and at a position opposing to the first port 22, a second port 23 is arranged. Between the first and second ports 22 and 23, memory chips CH are arranged, and the first port 22, memory chips CH and second port 23 are coupled through conductor lines 26a and 26b. The lines 26a and 26b include the clock signal line for transmitting the clock signal, the command bus for transmitting the command and the address and the data bus for transmitting the data, as in the first embodiment described above. The lines 26a and 26b transmit the clock signal, the command, the address and the data from the first port 22 to the second port 23. Memory chips CH are coupled commonly to lines 26a and 26b, and operate in the similar manner as in the first embodiment.

Similarly, on a second surface 21b of base board 20, a third port 24 electrically coupled to the second port 23, and a fourth port 25 for an interface with an external unit or device are provided. The third and fourth ports 24 and 25 are arranged opposing to each other on the second surface 21b, and memory chips CH are coupled to the third and fourth ports 24 and 25 through conductor lines 27a and 27b. Similar to lines 26a and 26b, lines 27a and 27b transmit signals from the third port to the fourth port 25.

The first port includes a terminal 22a for connection with an external unit or device, and a transmission unit 22b for transmitting a necessary signal to lines 26a and 26b in accordance with a signal applied from the external unit or device (for example, a processor) through terminal 22a. The second port 23 includes a via hole formed on the first surface 2 1a of base board 20. The third port 24 includes a via hole 24a formed on the second surface 21b of base board 20. Via holes 23a and 24b are formed to penetrate through base board 20, and through via holes 23a and 24b formed in the second and third ports 23 and 24, lines 26a and 26b formed on the first surface 2 1a are electrically connected to lines 27a and 27b formed on the second surface 21b. Via holes 23a and 24b refer to a same one via hole.

The fourth port 25 includes a reception unit 25b receiving a signal applied through lines 27a and 27b and generating a signal to be transmitted to the external unit or device, and a terminal 25a receiving the signal from reception unit 25b and transmitting the signal to the external unit or device.

As represented by dotted arrows in FIG. 7, on the first surface 21a of base board 20, the signal flows from the first port 22 to the second port 23, transmitted through via holes 23a and 24a to the second surface 21b, and thereafter flows from the third port 24 to the fourth port 25. Therefore, lines 26a, 26b, 27a and 27b transmit the signal only in one direction. Therefore, similar to the first embodiment described above, there is no signal skew generation in memory chips CH, and therefore it is possible that memory chips CH have the same response time. This is because the sum of the distance from the transmission unit 22b and the. distance to the reception unit 25b is always the same for every memory chip CH.

Further, as memory chips CH and lines 26a, 26b, 27a and 27b are arranged on both surfaces of base board 20, it is possible to arrange memory chips CH at a high density without increasing the area of the base board.

Further, as the first and fourth ports 22 and 25 for providing an interface with the outside are disposed on an end portion of one side of base board 20, a line for contacting the external unit or device can be arranged on one side of base board 20, and thus system layout is facilitated. When the base board 20 is a module board or a circuit board such as a slot, it is possible to arrange a socket for electrical contact with the external unit or device at one end of base board 20, which facilitates contact with the external device.

In the arrangement shown in FIG. 7, memory chips CH may be provided only on one of the first and second surfaces 2 1a and 21b of base board 20. What is necessary is that lines are continuously arranged over the first and second surfaces 21a and 21b, and the signal flight time is the same for every memory chip CH.

Further, each of the conductor lines 26a, 26b, 27a and 27b can include a plurality of signal lines, and can be formed into a signal bus.

First Modification

Figure 8:
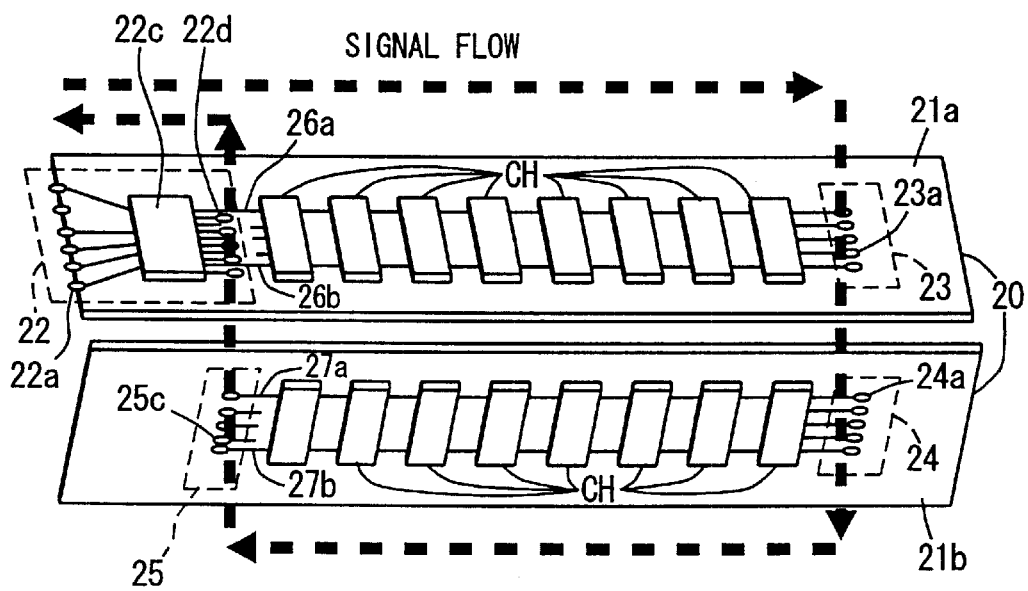
FIG. 8 is a schematic illustration showing a configuration of a modification of the second embodiment in accordance with the present invention.

FIG. 8 is a schematic illustration of a first modification of the second embodiment in accordance with the present invention. In the structure shown in FIG. 8, first port 22 includes a terminal 22a for an interface with the outside, a memory controller 22c connected to terminal 22a for transmitting/receiving a signal to and from the external device (or unit), and a via hole 22d reaching the second surface 21b. Lines 26a and 26b are connected to a transmitting section of memory controller 22c, and lines 26a and 26b are commonly coupled to the memory chips CH disposed on the first surface 21a and transmit signals to the second port 23.

Via hole 22d formed in the first port 22 communicates with via hole 25c formed in the fourth port 25 provided on the second surface 21b. Through via holes 25c and 22d, lines 27a and 27b disposed on the second surface 21b are connected to memory controller 22c. Except for these points, the structure is the same as that shown in FIG. 7, and corresponding portions are denoted by the same reference characters.

In the arrangement shown in FIG. 8, memory controller 22c with functions of both transmission and reception is provided at the first port 22. Therefore it is unnecessary to divide memory controller 22 into a transmission unit and a reception unit, and the number of terminals can be reduced. In the arrangement of FIG. 8, a transmission signal from memory controller 22c is transmitted through lines 26a and 26b to memory chip CH disposed on the first surface 2a. The signal transmitted on lines 26a and 26b are transmitted to the second surface 21b through via hole 23a provided in the second port 23, which communicates with via hole 24a formed in the third port 24 of the second surface 21b, and the signal on lines 26a and 26b are transmitted through the first and third ports 23 and 24 to lines 27a and 27b provided on the second surface 21b. The signal transmitted to lines 27a and 27b are transmitted to memory chip CH arranged on the second surface 21b, and to the fourth port 25. The signal which has been transmitted to the fourth port 25 is transmitted to the receiving section of memory controller 22 through via hole 25c and via hole 22d formed in the first port 22. Therefore, in this case also, the signal flow is in one direction, and therefore signal flight time is the same for every memory chip CH.

Figure 9:
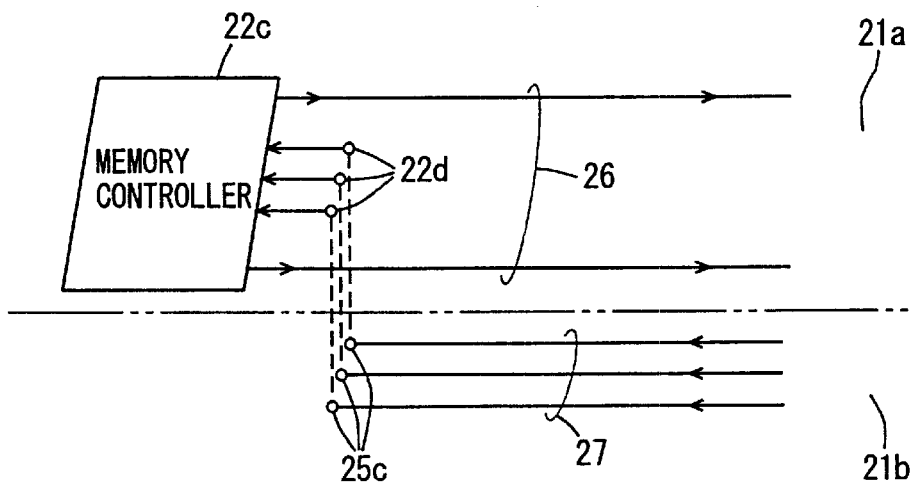
FIG. 9 is a schematic diagram representing layout of signal lines in the vicinity of the memory controller shown in FIG. 8.

FIG. 9 shows in enlargement the portion of the first and fourth ports. Referring to FIG. 9, the receiving unit of memory controller 22c is connected to line 27 arranged on the second surface 21b through via holes 22d and 22c. The signal from memory controller 22c is transmitted to line 26 (26a, 26b) on the first surface 21a. Therefore, in this case also, the direction of signal propagation is one way, and therefore signal communication with the memory chip CH is possible without any collision between a transmission signal and a reception signal.

The configuration shown in FIGS. 8 and 9 allows arrangement of terminals for signal transmission/reception concentrated on one side of base board 20, which facilitates connection with an external unit or device.

Second Modification

Figure 10:
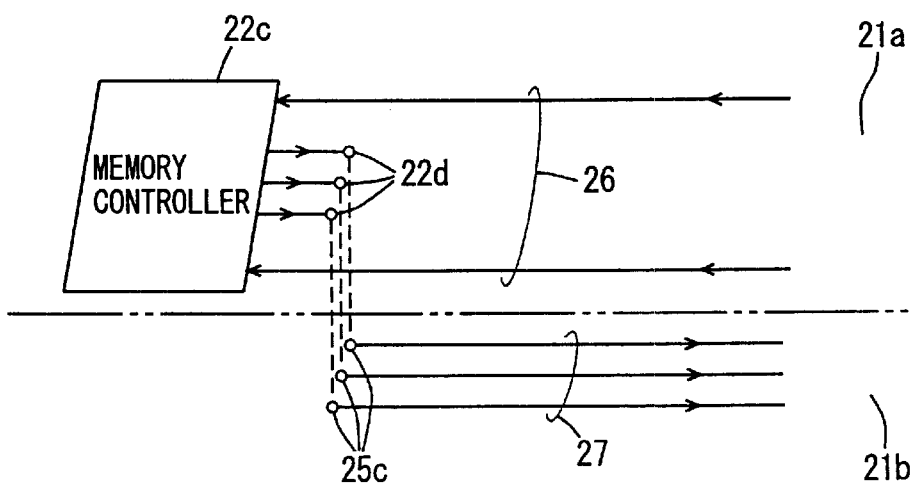
FIG. 10 is a schematic diagram representing a configuration of a modification of the second embodiment in accordance with the present invention.

FIG. 10 is a schematic illustration of a second modification of the second embodiment in accordance with the present invention. In a configuration shown in FIG. 1, a signal transmitted from memory controller 22c is transmitted to line 27 disposed on the second surface 21b of the base board through via holes 22d and 25c. The signal transmitted to line 27 is transmitted through a via hole, not shown, to line 26 disposed on the first surface 2 1a and transmitted to controller 22c. In this arrangement shown in FIG. 10, the signal flow is in reverse direction to that of FIGS. 8 and 9. In this example also, the signal flight time is the same for every memory chip, and similar effect can be obtained. The operation of the structure shown in FIG. 10 is the same as that of FIG. 8 except the direction of signal flow.

In the structures shown in FIGS. 8 to 10 also, memory chips CH may be provided only on one surface of base board 20.

Third Modification

Figure 11:
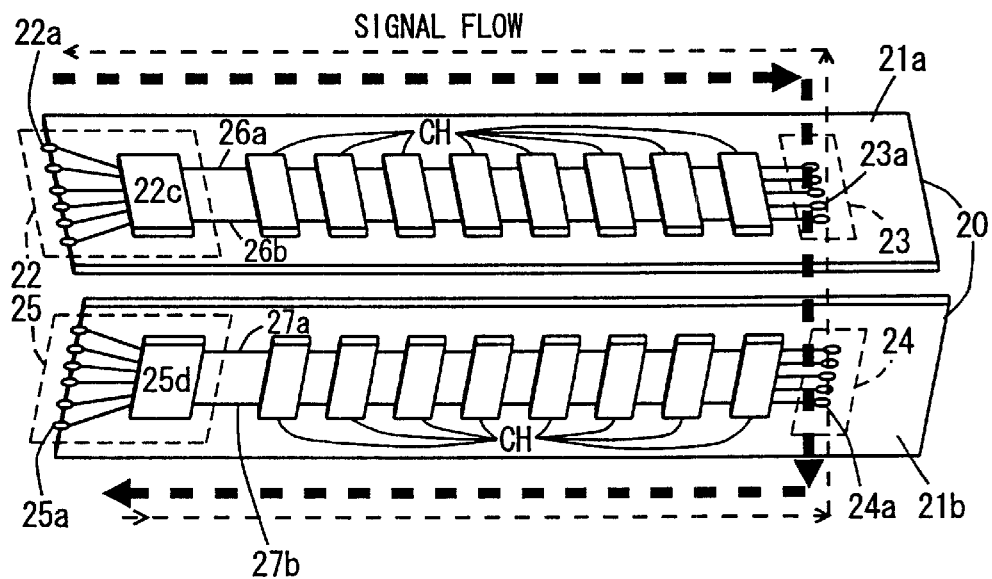
FIG. 11 is a schematic illustration showing the configuration of the modification of the second embodiment in accordance with the present invention.

FIG. 11 is a schematic illustration of a third memory in accordance with the second embodiment of the present invention. In the structure shown in FIG. 11, memory controller 22c having both transmission and reception functions is provided in the first port 22, and a memory controller 25d having both transmission and reception functions is provided in the fourth port 25. Memory controllers 22c and 25d are connected to each other through lines 26a, 26b, 27a and 27b disposed on the first and second surfaces 21a and 21b of base board 20.

In the structure shown in FIG. 11, a signal from memory controller 22c is transmitted on lines 26a and 26b and through via holes 23a and 24a, to lines 27a and 27b and further to a receiving section of memory controller 25c. A signal from memory controller 25d is transmitted on lines 27a and 27b and through via holes 24a and 23a, to lines 26a and 26b. Thereafter, the signal is transmitted to the receiving section of memory controller 22c.

As shown in FIG. 11, as memory controllers 22c and 22d having communication function (transmission/reception function) are provided on the first and second surfaces 21a and 21b of base board 20, respectively, it is possible to use memory chips CH as shared memories.

Figure 12:
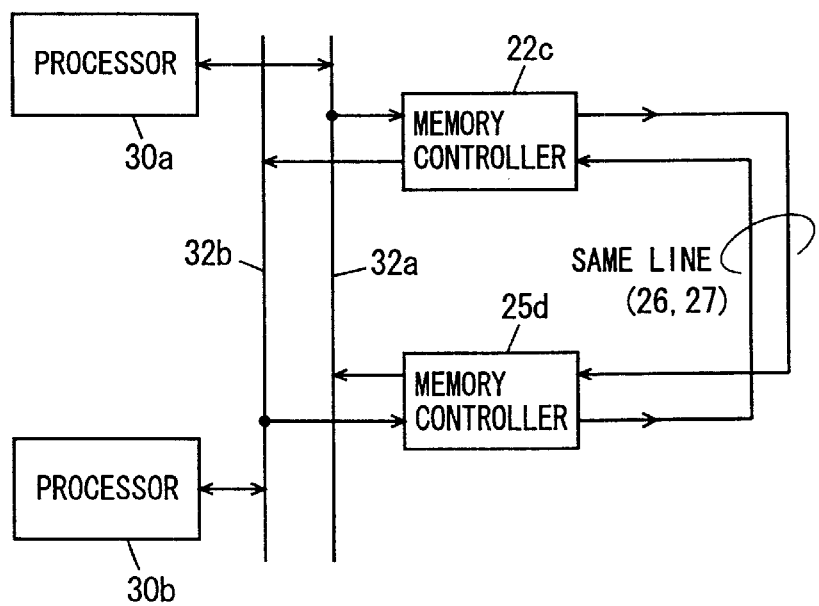
FIG. 12 is a schematic diagram representing a configuration of a processing system using the memory system shown in FIG. 11.

FIG. 12 is a schematic diagram representing a configuration of a processing system utilizing the memory system shown in FIG. 11. FIG. 12 depicts memory controllers 22c and 25c as representing the memory system, and directions of signal flow in the memory system. Memory chips are not shown. Though memory controllers 22c and 25d communicate through the same line, in FIG. 12, the line is shown as separate lines for the purpose of clarifying signal transmission/reception.

Referring to FIG. 12, the processing system includes a processor 30a coupled to a bus 32a, and a processor 30b coupled to a bus 32b. Buses 32a and 32b each transmit data, control signals and instructions. Memory controller 22c receives a signal (instruction and data) of bus 32a, generates a necessary signal (command, address, clock signal and write data) and transmits the signal in a direction toward memory controller 25c. Memory controller 25d transmits the read and transmitted data to bus 32a. Memory controller 25d receives a signal on bus 32b, generates a necessary signal and transmits the signal to memory controller 22c. Memory controller 22c transmits the applied signal to bus 32b.

In the configuration shown in FIG. 12, memory controllers 22c and 25d communicate signals with processors 30a and 30b, respectively. When 25 reception of necessary data from the memory unit is completed, memory controllers 22c and 25d are capable of immediately transmitting the signal to the memory unit (memory chip) (as the controllers themselves can monitor completion of data reception).

Therefore, even if processor 30a is a general processor for data processing and processor 30b is an image data processor for image processing application, it is possible that the processors 30a and 30b access to the memory system with high efficiency.

In the configuration shown in FIG. 12, a common bus may be used in place of buses 32a and 32b. Signal transmission/reception can be performed accurately also in the common bus system, when an identifier or an address for specifying the processor is applied to memory controllers 22c and 25d.

As described above, according to the second embodiment of the present invention, signal lines are disposed on opposing surfaces of the base board to transmit a signal in one direction continuously and memory chips are arranged parallel to the lines at least on one of the surfaces of the base board, so that it becomes possible that the signal flight time for the memory chips can be made constant regardless of the position of the memory chips, and hence high speed accessing is realized. Further, by a so-called folded structure of the lines, it becomes possible to arrange a portion providing an interface with an external unit or device at one side of the base board, and therefore connection to the external device is facilitated. Further, as memory chips are arranged on both surfaces, the area of the base board can be reduced.

Third Embodiment

Figure 13:
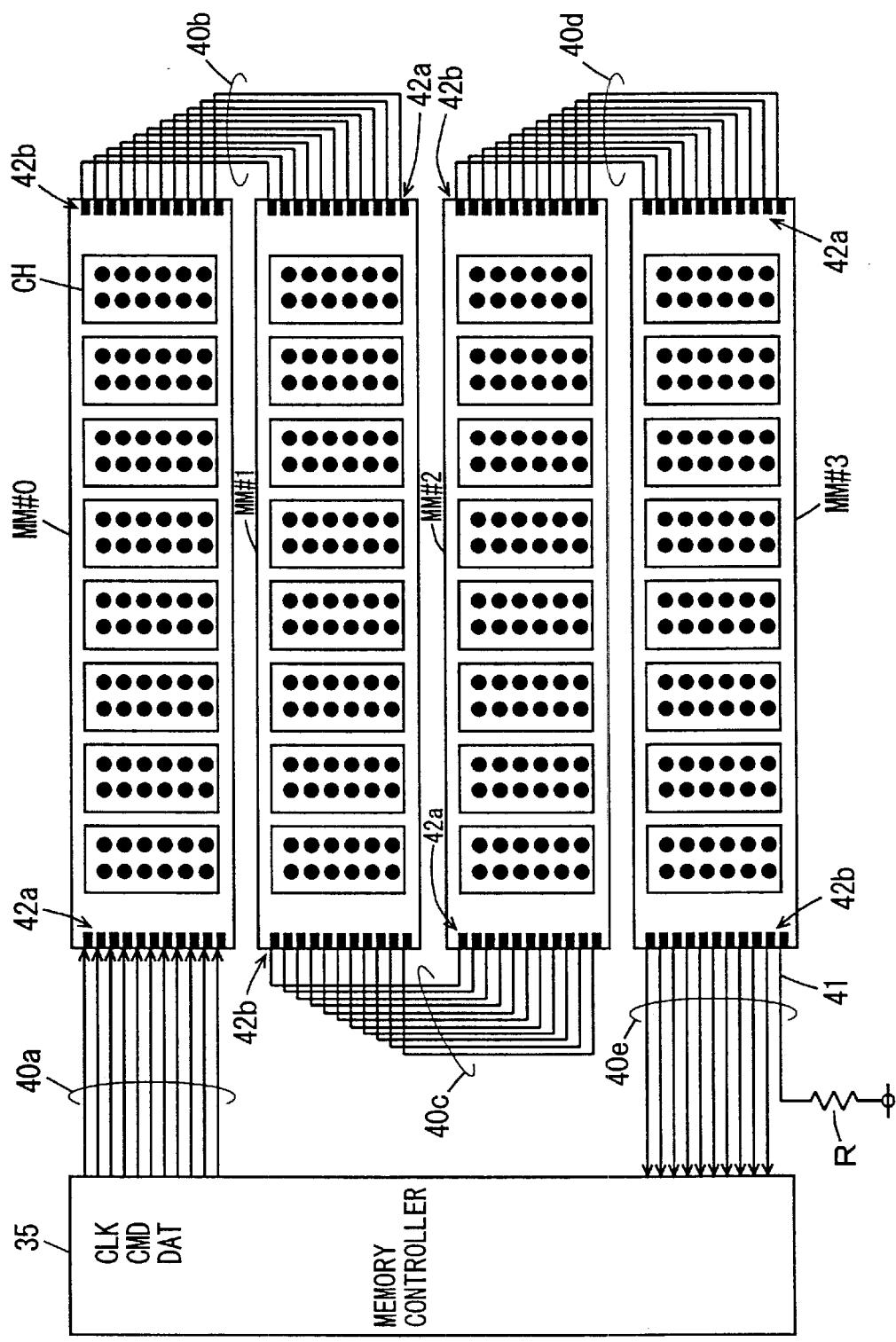
FIG. 13 is a schematic illustration representing a configuration of a memory system in accordance with a third embodiment of the present invention.

FIG. 13 is a schematic illustration showing the configuration of the memory system in accordance with the third embodiment of the present invention. In FIG. 13, memory modules MM#0 to MM#3 are arranged in series. Memory modules MM#0 to MM#3 each include memory chips CH. Arrangement of memory chips CH in memory modules MM#0 to MM#3 is the same as in the first embodiment. Each of the memory modules MM#0 to MM#3 includes an input port 42a corresponding to the first port for signal input, and an output port 42b corresponding to the second port for signal output. In memory modules MM#0 to MM#3, the memory controller is not provided, and only the memory chips CH are connected parallel to the bus. A memory controller 35 for controlling an operation is provided commonly to the memory modules MM#0 to MM#3.

A signal from memory controller 35 is applied to input port 42a of memory module MM#0 through a line 40a. A signal from output port 42b of memory module MM#0 is applied through a line 40b to input port 42a of memory module MM#1. A signal from output port 42b of memory module MM#1 is applied through a line 40c to input port 42a of memory module MM#2. A signal from output port 42b of memory module MM#2 is applied through a line 40d to input port 42a of memory module MM#3. A signal from output port 42b of memory module MM#3 is returned to memory controller 35 through a line 40e. In each of memory modules MM#0 to MM#3, the signal flight time from input port 42a to output port 42b is one and same for every memory chip CH.

As the signal is transmitted in one direction through lines 40b, 40c and 40d, the signal flight time for respective memory chips CH in memory modules MM#0 to MM#3 can be made constant, and therefore high speed access is realized. Input port 42a and output port 42b include a pin terminal and an internal interconnection line.

A signals output from memory controller 35, clock signal CLK, command CMD and data DAT are shown as representatives. A signal line 41 transmitting a signal which need not be returned to memory controller 35, for example, an address signal, is terminated by a terminating resistance R. Terminating resistance R is made equal in resistance value to an input impedance of memory controller 35 or an input impedance of memory module. Accordingly, load conditions of all input/output ports of memory modules MM#0 to MM#3 are set equally, and thus signal reflection is prevented. Lines 40a to 40e are arranged continuously extending through memory modules MM#0 to MM#3, and return of the reflection signal to transmitting section of memory controller 35 is prevented (see FIG. 3).

It is sometimes the case in board mount that the number of memory modules is predetermined, and sockets are arranged in advance corresponding to the memory modules. When the number of memory modules is to be reduced with the sockets provided in advance, a line is disposed in a module-free space, as a dummy module (sockets are connected by the line). This enables change in storing capacitor of the memory system, without impairing the feature of signal transmission along one direction. Here, there is a possibility of impedance mismatch derived from the sockets, for example, in the dummy module. Therefore, for impedance matching, an appropriate resistance for impedance matching is connected to each line in the dummy module.

As described above, according to the third embodiment of the present invention, memory modules including a plurality of memory chips connected parallel to the bus are cascaded (connected in series) so that the buses of the modules are connected in series. Therefore, even in this system using the memory modules, the signal can be transmitted in one direction, and signal flight time for every memory chip can be made constant, whereby high speed access is realized.

Fourth Embodiment

Figure 14:
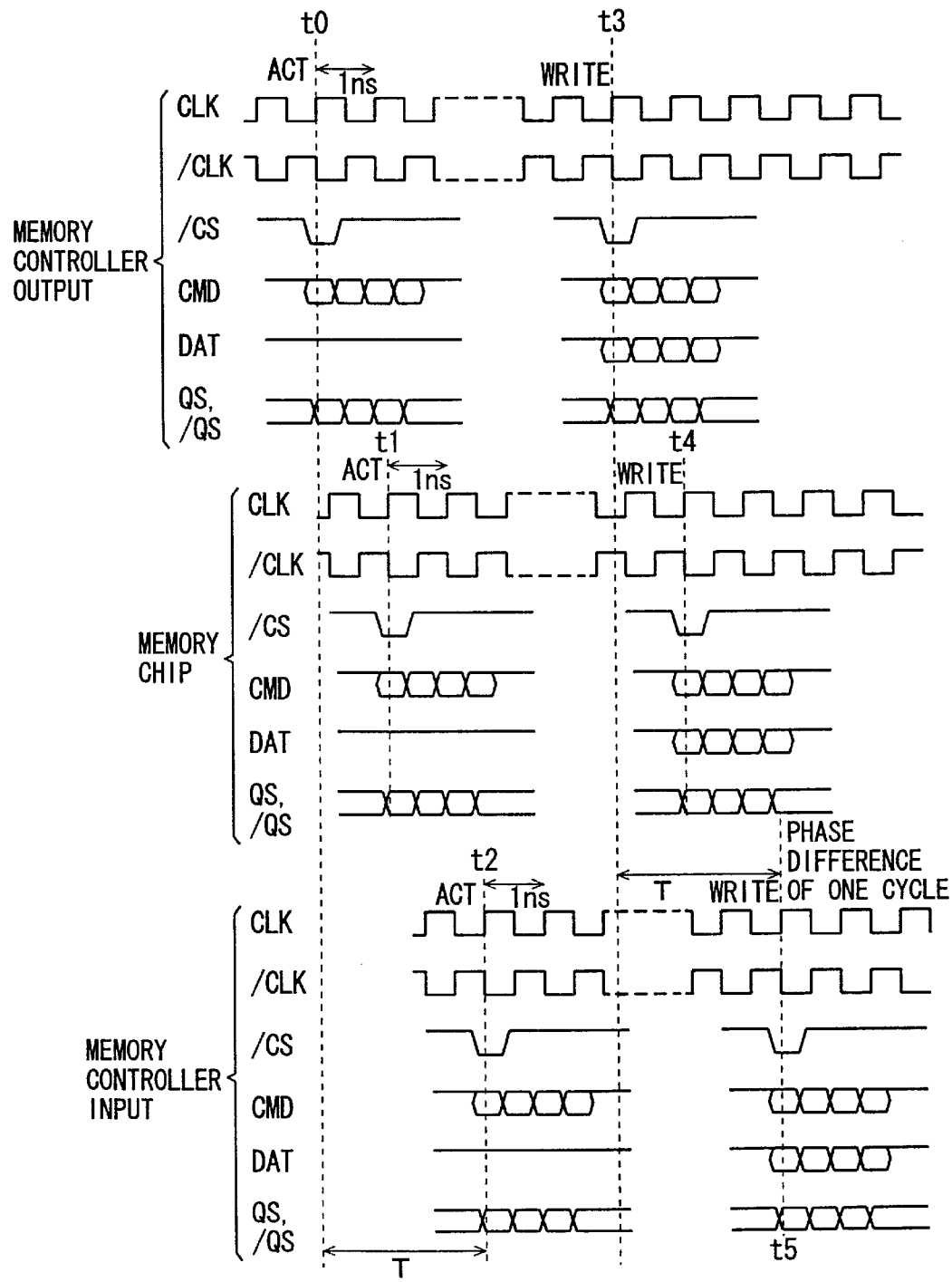
FIG. 14 is a timing chart representing states of signal propagation in the memory system in accordance with a fourth embodiment of the present invention.

FIG. 14 is a diagram of waveforms showing the states of signal transmission at a data write in the memory system shown in FIG. 13. In order to improve signal reception accuracy in the memory chip, complementary clock signals CLK and /CLK are transmitted from the memory controller. Memory controller 35 transmits a chip select signal CS indicating application of a command, a command CMD which is a group of control signals, data DAT and complementary strobe clock signals QS and /QS. Though an address signal ADD is also transmitted, it is not shown. The memory chip outputs strobe clock signals QS and /QS in synchronization with read data at the time of a data read. Signal transmission at the time of a data write will be described with reference to FIG. 14.

In memory controller 35, at time t0, an active command ACT for driving a memory chip to which data is written to a selected state is output. When active command ACT is applied, chip select signal CS is set to the active state of L level at a rising edge of clock signal CLK, and command CMD is output in synchronization with rising and falling edges of the clock signal CLK. As to the command CMD, four group of command bits output continuously over 2 cycles of the clock signal CLK generate one active command ACT. Though not shown, an address signal is applied simultaneously with the command CMD. Strobe clock signals QS and /QS which make transition in synchronization with the rise and fall of the clock signal CLK are output to provide timings of sampling each group of bits of the command CMD.

The active command ACT output from memory controller 35 at time t0 is transmitted through the memory modules over the line 40 (40a to 40d). At time t1, to an addressed memory chip in the memory system, active command ACT arrives. In the selected memory chip, in response to a falling edge of chip select signal CS, application of a valid command is determined and, in accordance with a chip specifying signal included in the address signal, the applied command CMD is taken, in accordance with the strobe clock signals QS and /QS. In the selected memory chip, array is activated (a row of memory cells is driven to the selected state).

The signals output from memory controller 35 are returned again to memory controller 35 through lines 40a to 40e. In FIG. 14, a state where active command ACT is again returned at time t2 is shown. The clock signals CLK and /CLK, chip select signal CS, command CMD and strobe clock signals QS and /QS are transmitted over the same propagation path in the same direction (error in line length is neglected). Therefore, the signals returned to memory controller 35 are all in phase.

At time t3, a write command WRITE designating a data write is output. For the write command WRITE also, at a rising edge of clock signal CLK, chip select signal /CS is set to the L level, and the group of bits constituting the command CMD are output successively in synchronization with the rising and falling edges of the clock signal CLK. Simultaneously with the command CMD, write data DAT and the address signal are output. Strobe clock signals QS and /QS are output to provide the strobe timing of the command CMD, write data DAT and the address signal.

At time t4, write data DAT reaches the selected memory chip. In the memory chip, in accordance with the fall of the chip select signal /CS, it is determined that a valid command is applied, and a command CMD is taken. For taking the command, complementary strobe clock signals QS and /QS are applied. Therefore, in the memory chip, the signals applied can be taken in accurately. In order to take the applied signals in, it is unnecessary to provide a clock reproducing circuit for adjusting the phase of the clock signal CLK in the memory chip, and therefore internal structure of memory chip is simplified. If the strobe clock signal has considerable skew in the memory chip, however, a clock reproducing circuit is necessary to recover a margin for taking in the command.

If the impedance is equal in each of the signal lines 40a to 40d, it is possible to take the signals in the memory chip accurately, as the signals are in phase with each other. Therefore, a margin with respect to a specification value required for the signal propagation path can be enlarged.

The write command WRITE is returned again to memory controller 35 at time t5. The time period T from t3 to t5 represents the time necessary for the signals to be transmitted over lines 40a to 40e. The time period T is equal for every memory chip (as the signal propagation path is the same for every memory chip).

Figure 15:
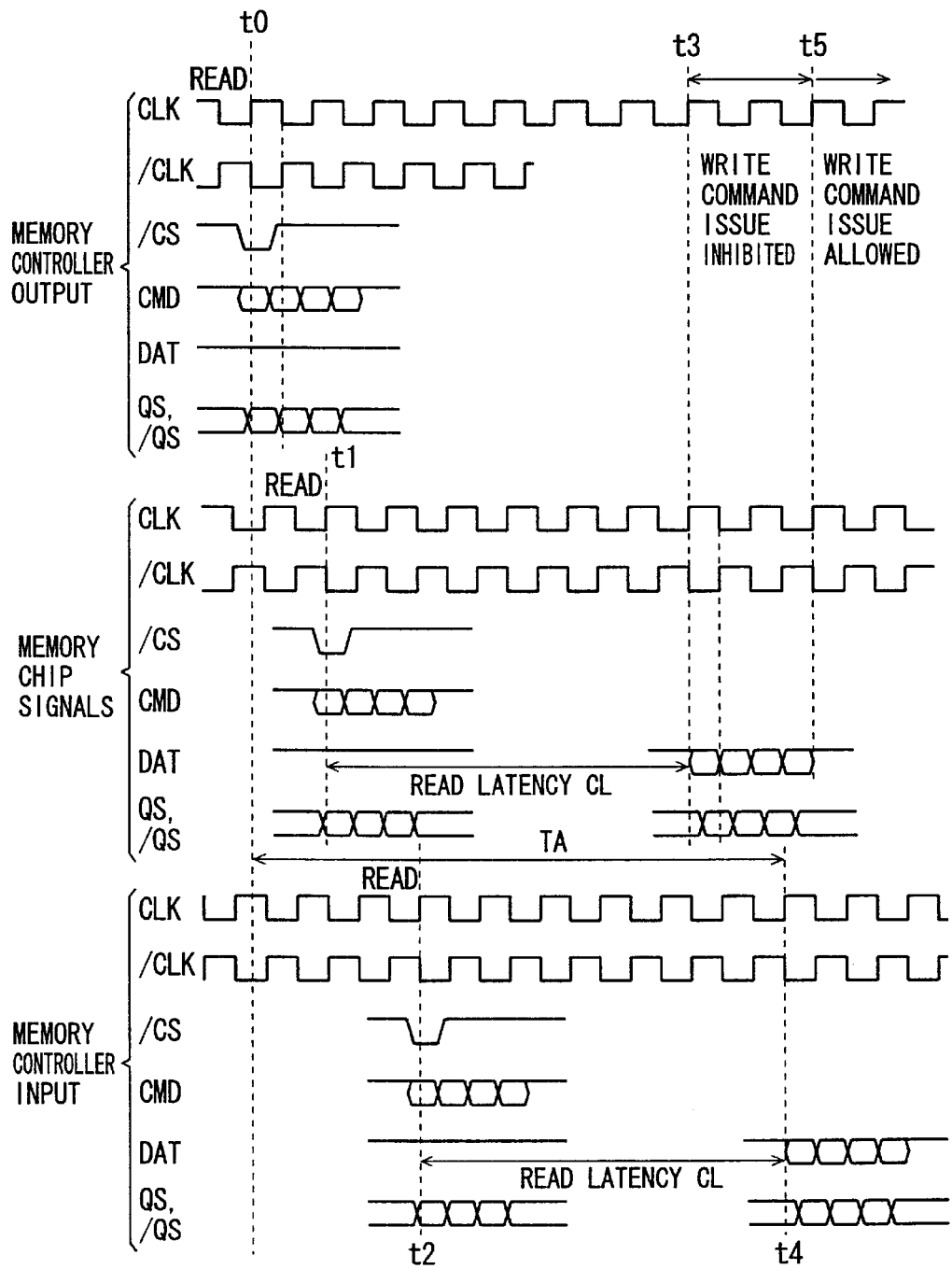
FIG. 15 is a timing chart showing states of signal propagation in a data read in the memory system in accordance with the fourth embodiment of the present invention.

FIG. 15 shows a state of signal propagation at the time of a data read. In a data read, at time t0, at a rising edge of clock signal CLK, a read command READ designating a data read is output. When applying the read command READ, the memory controller activates, simultaneously with the command CMD, the chip select signal /CS as a command activation designating signal, and outputs strobe clock signals QS and /QS in synchronization with the clock signal CLK.

At time t1, an output signal from the memory controller is transmitted to the addressed memory chip. In the selected memory chip, in response to activation of the chip select signal /CS, application of the command is identified, and using a cross point of strobe clock signals QS and /QS, the command CMD and the address signal are taken.

The read command READ output from the memory controller is returned to the memory controller through the lines at time t2, similar to operation of the data write mode. In the memory chip, a column selecting operation takes place internally (decoding of a column address signal applied simultaneously with the command CMD) and the memory cell data is read.

After the lapse of a period necessary for internal data reading, that is, read latency CL, the selected memory chip provides data in synchronization with the rising and falling edges of the clock signal CLK. Further, at this time, the selected memory chip outputs strobe clock signals QS and /QS for providing the strobe timing of the read data.

The data read from the memory chip and the strobe clock signals QS and /QS arrive at the memory controller at time t4. The memory controller takes the read data DAT using a cross point of strobe clock signals QS and /QS as a trigger signal, and performs internal processing.

At the time of a data read, a time period TA is necessary from application of the read command READ from the memory controller until arrival of the read data DAT to the memory controller. Assuming that all the memory chips have the same read latency CL, the time for the signal to be transmitted over the lines is represented as t1−t0+t4−t3. This time period is the same in every memory chip, and therefore efficient data access is possible also at the time of a data read.

As the memory controller and the memory chip take the applied signal using a cross point of strobe clock signals QS and /QS as a trigger, signals can be taken-in highly accurately.

In the configuration of the memory system, the issuance of a write command is inhibited until data of a burst length is read (burst length 4 in FIG. 15) from the time point t3 at which the data from the selected memory chip is read. After the data of the burst length is read from the memory chip, issuance of the write command is allowed. This is to prevent collision of the read data and the write data on the line (data bus) (assuming a worst case in which data is read from the memory chip which is the closest to the memory controller).

Figure 16:
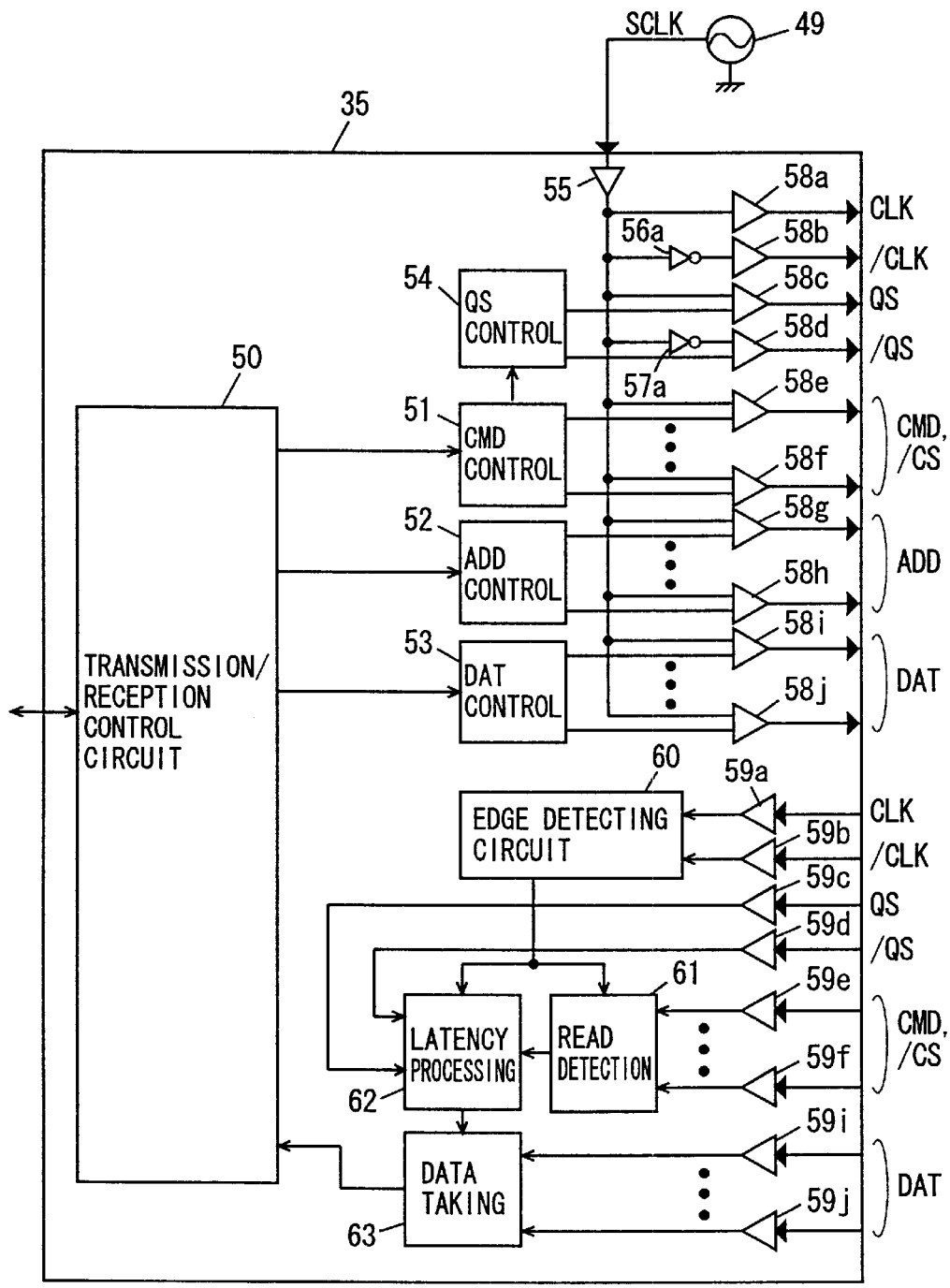
FIG. 16 is a schematic diagram representing a configuration of the memory controller shown in FIG. 13.

FIG. 16 is a schematic diagram representing a configuration of memory controller 35. Referring to FIG. 16, memory controller 35 includes: a transmission/reception control circuit 50 for transmitting/receiving a signal to and from a processor, not shown; a CMD control circuit 51 for generating and successively outputting commands CMD under the control of transmission/reception control circuit 50; an ADD control circuit 52 for generating and successively outputting address signals ADD under the control of transmission/reception control circuit 50; a DAT control circuit 53 receiving and successively outputting write data from transmission/reception control circuit 50; a QS control circuit 54 for generating a strobe clock timing signal under the control of CMD control circuit 51; a clock buffer/driver 55 receiving a clock signal SCLK from an externally provided oscillator 49 for generating an internal clock signal; a clock buffer 58a receiving the internal clock signal from clock buffer/driver 55 for generating a clock signal CLK; a clock buffer 58b receiving the internal clock signal from clock buffer/driver 55 through an inverter 56a for generating a complementary clock signal /CLK; a buffer 58c for generating a strobe clock signal QS in accordance with the internal clock signal from clock buffer/driver 55 and an output signal from QS control circuit 54; a buffer 58b for generating a complementary strobe clock signal /QS in accordance with the internal clock signal applied through an inverter 57a and an output signal from QS control circuit 54; buffers 58e to 58f for outputting a command CMD in accordance with the internal clock signal from clock buffer/driver 55 and a command from CMD control circuit 51; buffers 58g to 58h for outputting an address signal ADD in accordance with the internal clock signal from clock buffer/driver 55 and an address signal from ADD control circuit 52; and buffers 58i to 58j for outputting write data DAT in accordance with a data bit from DAT control circuit 53 and the internal clock signal from clock buffer/diver 55.

Buffers 58a to 58d change the output signals in synchronization with internal clock signal from clock buffer/diver 55. At the edges of clock signals CLK and /CLK, states of the command CMD, address signal ADD and write data DAT are established.

CMD control circuit 51, ADD control circuit 52, DAT control circuit 53 and QS control circuit 54 correspond to the command generating circuit 5b and transfer circuit 5e shown in FIG. 6, and successively output the command CMD, address signal ADD and data DAT under the control of transmission/reception control circuit 50. Buffers 58c to 58j may be set to an output high impedance state when inactive.

Memory controller 35 further includes a buffer 59a receiving clock signal CLK; a buffer 59b receiving the complementary clock signal /CLK; buffers 59c and 59d receiving strobe clock signals QS and /QS, respectively; buffers 59e to 59f receiving command CMD, and buffers 59i to 59j receiving data DAT. The buffers 59a to 59j may be circuits simply for buffer processing, and a differential amplifying type input circuit for comparing an input signal with a reference voltage for determining logic level of the input signal may be used as buffers 59a to 59j.

Memory controller 35 further includes: an edge detecting circuit 60 for detecting an edge of internal clock signal applied through buffers 59a and 59b; a READ detecting circuit 61 responsive to edge information from edge detecting circuit 60 for determining whether the command CMD applied through buffers 59e to 59f is a read command; a latency processing circuit 62 activated in response to a read command detection designation from READ detecting circuit 61 for counting a latency period in response to an edge detection signal from edge detecting circuit 60, and after the lapse of the latency period −1 clock cycles, transmitting the strobe clock signals QS and /QS applied from buffers 59c and 59d; and a data taking circuit 63 activated in response to activation of an output signal from latency processing circuit 62 for taking the data from buffers 59i to 59j in response to the strobe clock signals QS and /QS applied through latency processing circuit 62. The data taken by data taking circuit 63 is applied to transmission/reception control circuit 50.

In the configuration shown in FIG. 16, when the read command READ is detected, memory controller 35 activates the data taking circuit 63 after the lapse of latency period, and takes in the data DAT. When the read command is returned, the read data is applied after the lapse of latency period (see FIG. 15). This facilitates taking of the read data by memory controller 35.

READ detecting circuit 61 may be constituted by a decode circuit for decoding the command CMD consisting of 4 groups of bits. Latency processing circuit 62 includes: a counter activated in response to the read command detection designation from read detecting circuit 61 for counting (latency −1) clock cycle period in response to the edge detection signal from edge detecting circuit 60; and a gate circuit activated in response to a count up designating signal from the counter for passing strobe clock signals QS and /QS during the burst length period, for example. Data DAT is transmitted in synchronization with both the rising and falling edges of the clock signal CLK, and therefore, a latch circuit for taking data alternately in synchronization with the rising edge of the strobe clock signals QS and /QS may be provided in the data taking circuit 63. If the data taking circuit 63 is capable of high speed operation, alternatively, a circuit for generating a one-shot pulse using a cross point of strobe clock signals QS and /QS as a trigger, and a latch circuit for taking the applied data in accordance with the pulse signal may be used as data taking circuit 63.

The edge detecting circuit 60 may be formed of a common waveform shaping circuit, it may be formed of a comparing circuit for comparing a reference voltage with the clock signals CLK and /CLK. Alternatively, it may be formed by a differential amplifier for differentially amplifying clock signals CLK and /CLK. Either configuration may be used.

As can be seen from FIG. 16, memory controller 35 receives a transmitting command CMD and a transferred command CMD. These commands CMD are transmitted over the same signal propagation path as the clock signals CLK and /CLK, QS and /QS, with the phases matching. Therefore, if the command CMD is the read command READ, the read data is transmitted from the memory chip, after the lapse of the read latency. Therefore, it becomes possible to take the data read from the selected memory chip and to transfer the taken data to a processor, not shown, easily by a simple circuit structure.

Figure 17:
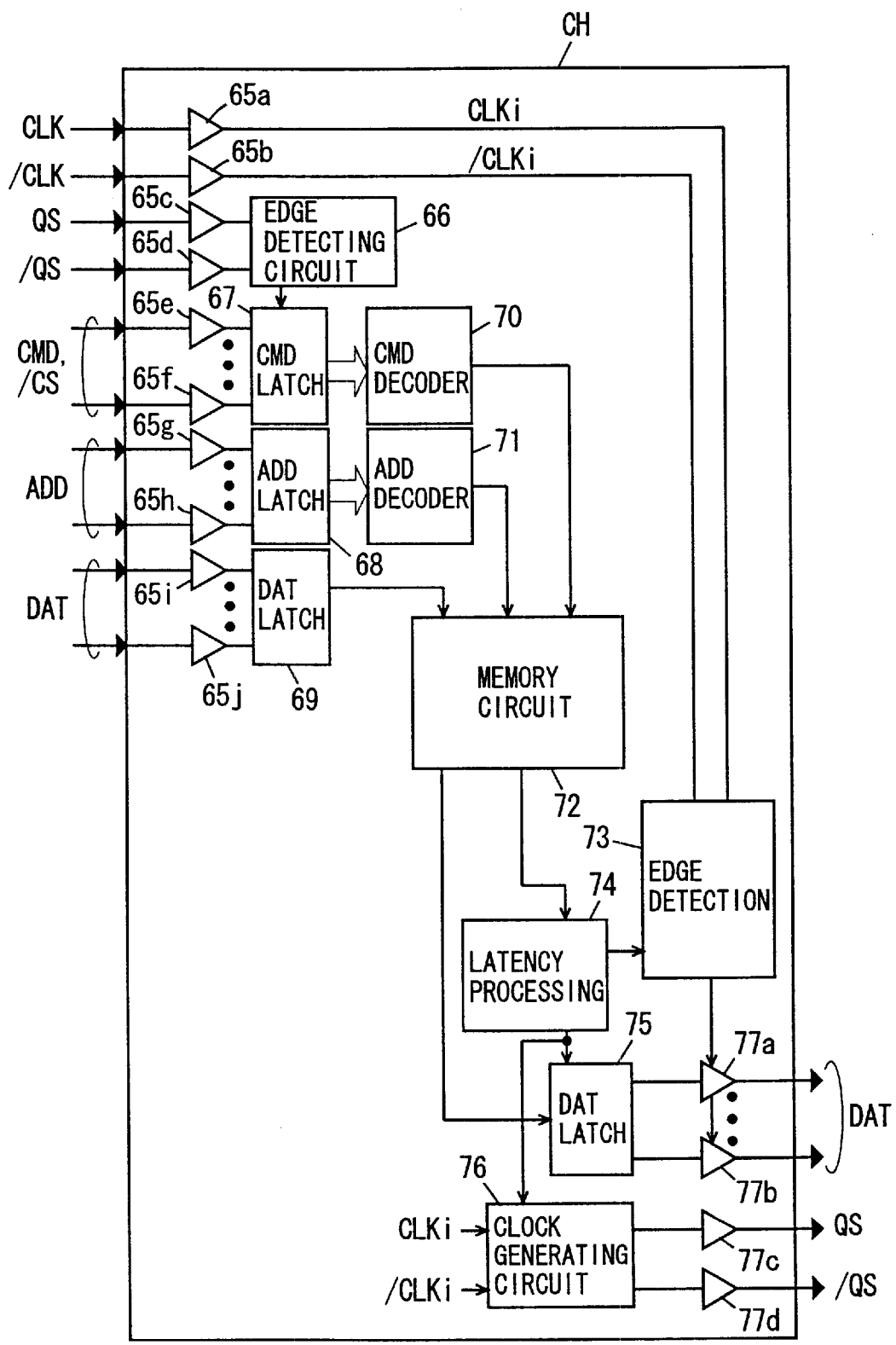
FIG. 17 is a schematic diagram representing a configuration of the memory chip shown in FIG. 13.

FIG. 17 is a schematic diagram representing a configuration of the signal input section of memory chips CH. Referring to FIG. 17, the memory chip CH includes: buffers 65a and 65b for buffering clock signals CLK and /CLK to generate internal clock signals CLKi and /CLKi; buffers 65c and 65d receiving strobe clock signals QS and /QS; buffers 65e to 65f receiving the command CMD; buffers 65g to 65h receiving the address signal ADD; and buffers 65i to 65j receiving the data DAT. These may have the structure of a differential amplifying type input circuit in which an applied signal is compared with a reference voltage.

The memory chip CH further includes an edge detecting circuit 66 for detecting an edge portion (crossing point) between signals QS and /QS applied from buffers 65c and 65d; a CMD latch 67 responsive to an edge detection signal from edge detecting circuit 66, for latching the command CMD applied through buffers 65a to 65f; an ADD latch 68 responsive to the edge detection signal from edge detecting circuit 66, for latching the address signal ADD applied from buffers 65e to 66h; a DAT latch 69 responsive to the edge detecting signal from edge detecting circuit 66 for latching data from buffers 65i to 65j; a CMD decoder 70 for decoding a command CMD latched in CMD latch 67; an ADD decoder 1 for decoding an address signal ADD latched in ADD latch 68; and a memory circuit 72 receiving an operation mode designating signal from CMD decoder 70, a decoded address signal from ADD decoder 71 and data latched in DAT latch 69 for performing a designated operation mode. Memory circuit 72 includes a plurality of memory cells arranged in rows and columns, a row selected circuit, a column selecting circuit and a data write/read circuit.

ADD decoder 71 may be adapted to be activated to perform decoding operation when address signal ADD designates the memory chip CH. CMD decoder 70 executes decoding operation only when the chip select signal CS latched in CMD latch 67 is activated.

The memory chip CH further includes: a latency processing circuit 74 activated in response to activation of a read operation designating signal from a control circuit included in memory circuit 72; an edge detecting circuit 73 activated in response to latency designation information (lapse of a period corresponding to latency cycles −1) of latency processing circuit 74 for detecting an edge (cross point) of internal clock signals CLKi and /CLKi; a DAT latch 75 activated in response to an output signal from latency processing circuit 74 for latching data read from memory circuit 72; a clock generating circuit 76 activated in response to a latency lapse designation (lapse of read latency −1 clock cycles) from latency processing circuit 74 for adjusting phases of internal clock signals CLKi and /CLKi to generate a timing clock signal; buffer circuits 77a to 77b for buffering and outputting data latched by DAT latch 75, in response to the edge detection signal from edge detecting circuit 73; and buffers 77c and 77d for buffering the timing clock signal from clock generating circuit 76 to generate and output strobe clock signals QS and /QS. By adjusting the phases of internal clock signals CLKi and /CLKi using clock generating circuit 76, it becomes possible to generate strobe clock signals QS and /QS providing the sampling time for the data DAT output in synchronization with the clock signal CLK.

DAT latch 75 outputs data in synchronization with the rise and fall of internal clock signal CLKi. Edge detecting circuit 73 may be a buffer circuit as the edge detecting circuit of memory controller 35, or it may be a comparing circuit for comparing with the reference voltage or the complementary clock signal, for generating a clock signal of which frequency is twice that of clock signal CLKi.

As to the structure of memory circuit 72, any structure may be used provided that addressed memory cell data can be accessed.

The clock generating circuit 76 may be provided with a vernier of the conventional SLDRAM.

Figure 18:
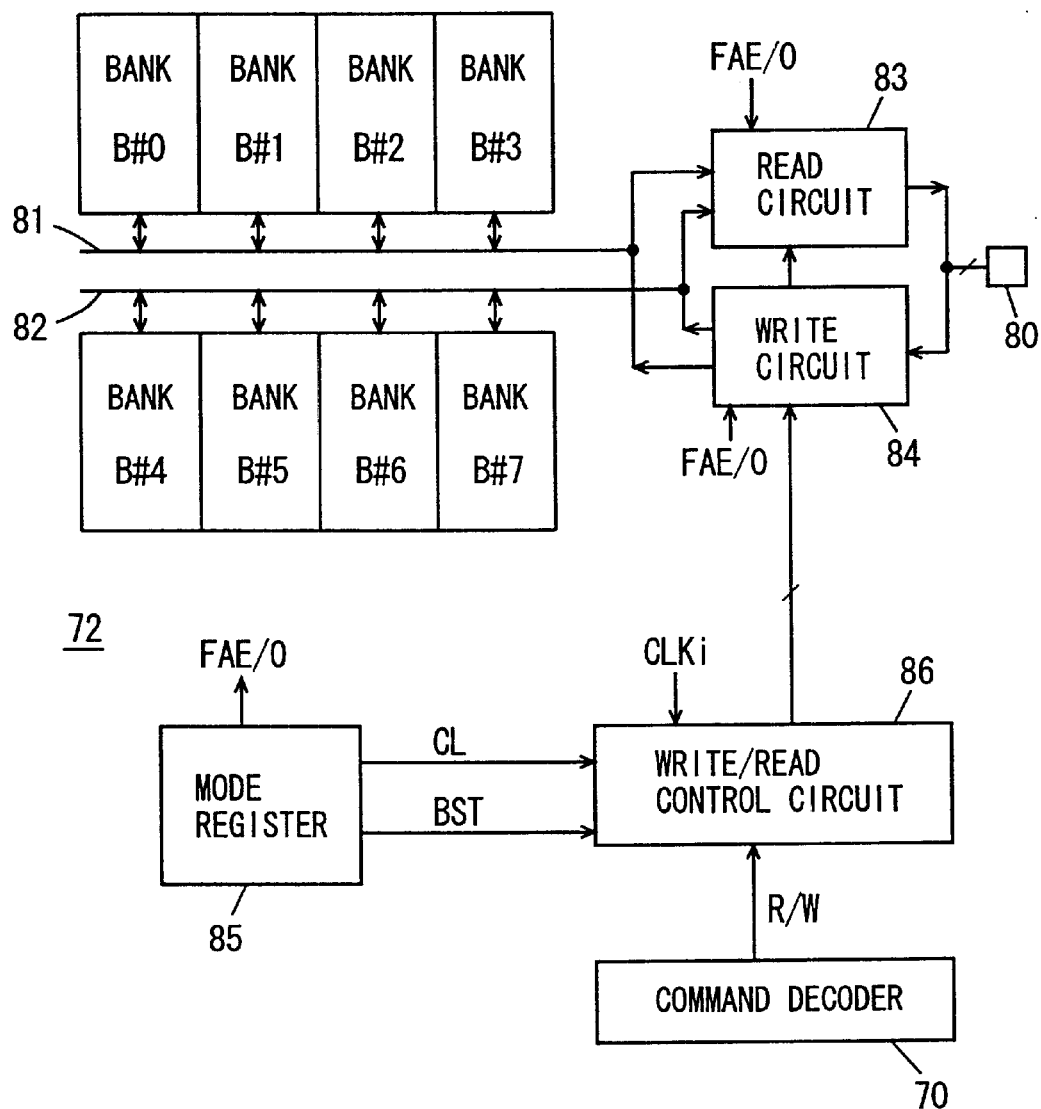
FIG. 18 is a schematic diagram representing a configuration of the memory circuit shown in FIG. 17.

FIG. 18 is a schematic diagram representing an example of the configuration of the memory circuit shown in FIG. 17. Referring to FIG. 18, memory circuit 72 includes 8 banks B#0–B#7. Banks B#0 to B#3 are connected to an internal data bus 81, and banks B#4 to B#7 are coupled to an internal data bus 82. These banks B#0 to B#7 each have a plurality of memory cells arranged in a matrix of rows and columns, and capable of driving a row of memory cells to a selected state independently from each other. Internal data buses 81 and 82 are both coupled to a read circuit 83 and a write circuit 84. In accordance with a bank address signal, one of internal data buses 81 and 82 is coupled to one of read circuit 83 and write circuit 84 in accordance with an operation mode (transmits/receives data). Read circuit 83 and write circuit 84 read and write data in synchronization with the internal clock signal, respectively. The memory circuit input/output data from and to an external device (external line) at a double data rate (DDR) while it reads/writes data in synchronization with the internal clock signal CLKi internally. Therefore, read circuit 83 has a function of parallel/serial conversion function, and write circuit 84 has a serial/parallel conversion function.

In order to control operations of read circuit 83 and write circuit 84, a mode register 85 storing column latency (read latency) CL and burst length data BST as well as a signal FAE/O designating whether a lead address is an even-numbered address or an odd-numbered address, and a read/write control circuit 86 for controlling an operation of read circuit 83 or write circuit 84 in synchronization with internal clock signal CLKi in accordance with a read/write operation activating signal R/W from command decoder 70 as well as the column latency information CL and burst length information BST from mode register 85 are provided. Read circuit 83 and write circuit 84 are commonly coupled to a pad group 80 including a plurality of pads, and operate under the control of write/read control circuit 86. At the time of a data read, read circuit 83 successively outputs read data to the pad group 80, and at the time of a data write, write circuit 84 successively takes data applied to the pad group 80 and generates internal write data.

To read circuit 83 and write circuit 84, leading address designating signal FAE/O is applied and when the burst length BST is to be set, information designating whether the leading address is an even address or an odd address is set in the mode register and, in accordance with the set information, which address is to be read or to be written first is determined (as will be described later).

Here, the leading address information is necessary as 2 bits of memory cells having an even-numbered column address and an odd-numbered column address are simultaneously read from banks B#0 to B#7 (per 1 pad).

Figure 19:
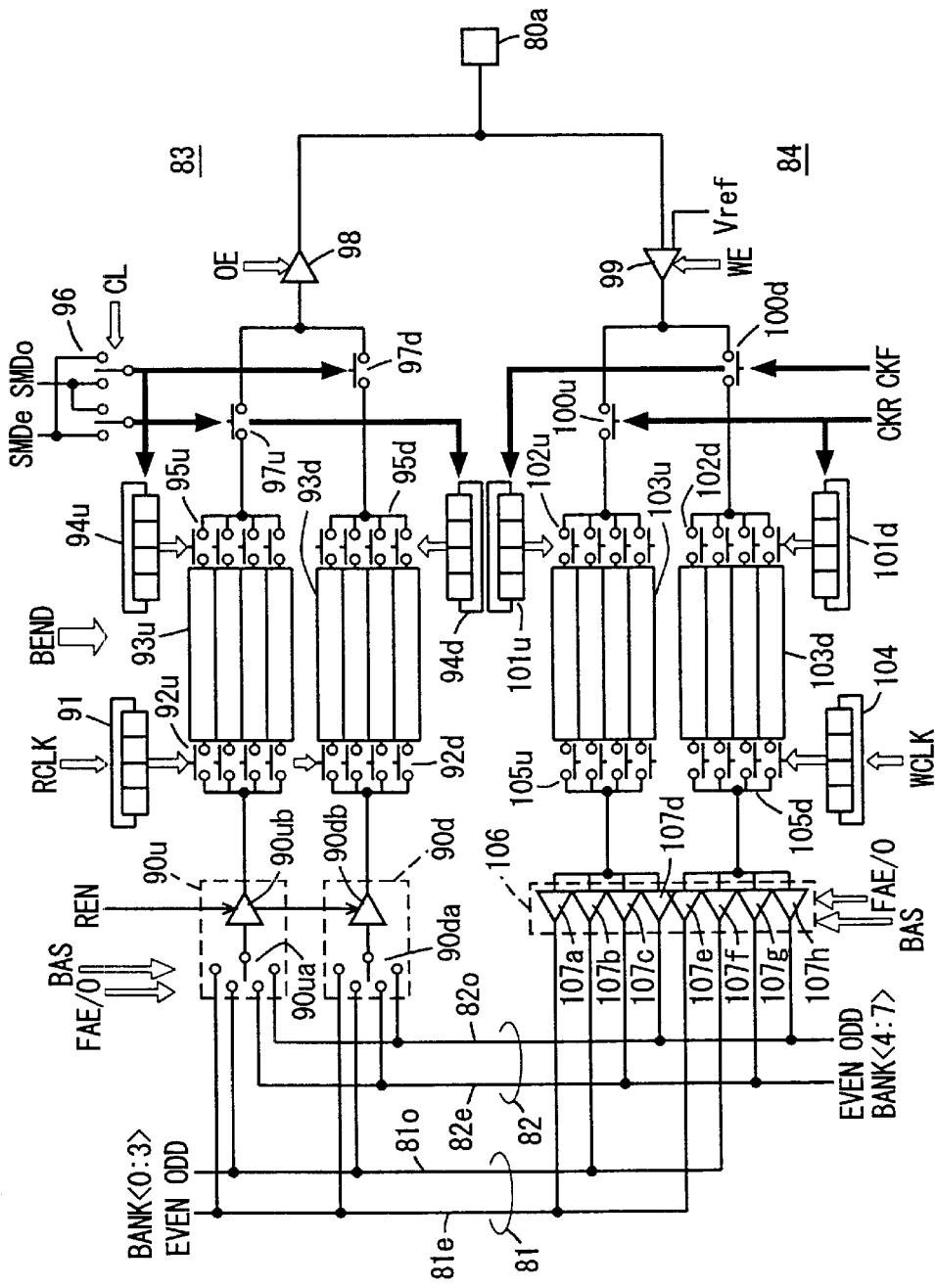
FIG. 19 is a diagram showing in greater detail configurations of the read circuit and write circuit shown in FIG. 18.

FIG. 19 is a schematic diagram representing the configuration of a 1 bit input/output section of read circuit 83 and write circuit 84 shown in FIG. 18.

Referring to FIG. 19, internal data bus 81 includes: an internal even-numbered address data bus 81*e* for transmitting data of an even-numbered address EVEN; and an internal odd-numbered address data bus 81*o* for transmitting data of a memory cell of an odd-numbered address ODD. Internal data bus 82 includes: an even-numbered address data bus 82*e* for transmitting data of even-numbered address EVEN; and an internal odd-numbered address data bus 82*o* for transmitting data of odd-numbered address ODD.

Read circuit 83 includes: a selecting circuit 90*u* for selecting one of data buses 81*e*, 81*o*, 82*e* and 82*o* in accordance with the leading address designating signal FAE/O, a bank address specifying signal BAS and a receiver enable signal REN; a selecting circuit 90*d* for selecting an internal data bus in a manner complementary to selecting circuit 90*u*; a shift register 91 for performing a shifting operation in accordance with a read clock signal RCLK activated at the time of reading; a selecting circuit 92*u* for selecting an output signal from selecting circuit 90*u* in accordance with an output signal from shift register 91; a register circuit 93*u* storing data applied from selecting circuit 92*u*; a selecting circuit 92*d* selecting an output signal from selecting circuit 90*d* in accordance with an output signal from shift register 91; a register circuit 93*d* for successively storing output signals from selecting circuit 92*d*; a shift register 94*u* for performing a shifting operation in response to a clock signal from a switching circuit 96; a selecting circuit 95*u* for selecting data stored in register circuit 93*u* in accordance with an output signal from shift register 94*u*; a shift register 94*d* for performing a shifting operation in accordance with an output signal from switching circuit 96; a selecting circuit 95*d* for selecting data stored in register circuit 93*d* in accordance with an output signal from shift register 94*d*; a transfer circuit 97*u* for passing a signal transmitted from selecting circuit 95*u* in accordance with a clock signal from switching circuit 96; a transfer circuit 97*d* for passing data selected by selecting circuit 95*d*, in accordance with the clock signal from switching 96; and an output buffer 98 for outputting data provided from transfer circuits 97*u* and 97*d* to a pad 80*a*.

Selecting circuit 90*u* includes: a switch circuit 90*u* a for switching connection of the internal data buses in accordance with the leading address designating signal FAE/O and the bank designating signal BAS; and an amplifying circuit 90*ub* for amplifying, when the receiver enable signal REN is activated, a signal selected by switching circuit 90*ua*. Selecting circuit 90*d* includes: a switch circuit 90*da* for switching connection of the internal data buses in accordance with the leading address designating signal FAE/O and the bank designating signal BAS; and an amplifying circuit 90*db* for amplifying, in response to activation of the receiver enable signal REN, an output signal from switch circuit 90*da*.

Shift register 91 is formed of ring-shaped four stages of shift registers, and performs a shifting operation in accordance with the read clock signal RCLK to set an output signal of one register stage to an active state. Register circuit 93*u* includes four registers. Selecting circuit 92*u* includes switches provided corresponding to the four registers, respectively, and one of the four switches of selecting circuit 92*u* is driven to a conductive state in accordance with an output signal from shift register 91. Register circuit 93*d* similarly includes four registers, and selecting circuit 92*d* includes four switches provided corresponding to these four registers, respectively. One of the four switches is driven to the selected state (conductive state) in accordance with an output signal from shift register 91.

Shift registers 94*u* and 94*d* are both formed of ring-shaped four stages of shift registers, and one output signal of each is set to the active state. Selecting circuit 95*u* selects one of the four registers of register circuit 93*u* in accordance with an output signal from shift register 94*u*. Selecting circuit 95*d* selects one of the four registers of register circuit 93*d* in accordance with an output signal from shift register 94*d*. Shift registers 94*u* and 94*d* performs shifting operations complementary to each other in accordance with the clock signal from switch circuit 96.

Transfer circuit 97*u* is rendered conductive complementary to the shifting operation of shift register 94*u*, and transfer circuit 97*d* is rendered conductive complementarily to the shifting operation of shift register 94*d*.

Switch circuit 96 has its connection path switched in accordance with the column latency (read latency) information CL set in the mode register. Clock signal SMDe is a clock signal rising to the H level in response to a rise of internal clock signal CLKi, and clock signal SMDo is a clock signal rising to the H level in response to a fall of the internal clock signal CLKi. As column latency (read latency) CL, 2 and 1.5 are prepared. Valid data is output after the lapse of 2 clock cycles or after the lapse of 1.5 clock cycles after the application of the read command. The clock cycle is the clock cycle of the internal clock signal CLKi, and data is output in synchronization with the rising and falling edges of internal clock signal CLKi.

Output buffer 98 is activated, when output enable signal OE is activated, to amply and transmit to pad 80*a* the data from transfer circuits 97*u* and 97*d*. The output enable signal OE is driven to the active state after the lapse of column latency−1 clock cycle, and the active state is maintained for the period of the burst length. Register circuits 93*u* and 93*d* as well as shift registers 91, 94*u* and 94*d* have storage contents therein reset in accordance with a reset designating signal BEND after the completion of reading of the burst length data.

The bank designating signal BAS designates either the banks B#0 to B#3 (BANK<0:3>) or banks B#4 to B#7 (BANK <4:7>).

Write circuit 84 includes: a write buffer 99 activated in response to activation of the write enable signal WE for comparing a signal applied through pad 80*a* with a reference voltage Vref and outputting a signal in accordance with the result of comparison; a transfer circuit 100*u* rendered conductive in response to the rise of the clock signal CKR for transmitting a signal from write buffer 99; a transfer circuit 100*d* rendered conductive in response to the rise of the clock signal CKF for passing data from write buffer 99; a shift register 101d for performing a shifting operation in response to the clock signal CKR; a shift register 101u for performing a shifting operation in accordance with the clock signal CKF; register circuits 103u and 103d storing applied data; a selecting circuit 102u for selecting a register of register circuit 103u in accordance with an output signal from shift register 101u for storing data from transfer circuit 100u in the selected register; a selecting circuit 100u for writing data in the selected register of register circuit 102u; a selecting circuit 102d for selecting a register of register circuit 103d in accordance with an output signal from shift register 101d for writing data from transfer circuit 101d to the selected register; a shift register 104 for performing a shifting operation in response to the write clock signal WCLK; a selecting circuit 105u for selecting a register of register circuit 103u in accordance with an output signal from shift register 104; a selecting circuit 105d for selecting a register of register circuit 103d in accordance with an output signal from shift register 104; and a write driver 106 for transmitting data to one of internal data buses 81 and 82 in accordance with the leading address designating signal FAE/O and the bank designating signal BAS.

Clock signal CKR rises to the H level in response to the rise of the strobe clock signals QS, and clock signal CKF rises to the H level in response to the fall (rise) of the strobe clock signal QS (/QS). Shift registers 101u, 101d and 104 each are connected in the shape of a ring, and have an output signal from one of the registers set to the active state.

Write driver 106 includes: drive circuits 107a and 107e provided for data bus 81e; drive circuits 107b and 107f provided for data bus 81o; drive circuits 107c and 107g provided for data bus 82e; and drive circuits 107d and 107h provided for data bus 82o. Drive circuits 107a to 107d receive an output signal from selecting circuit 105u, and drive circuits 107e to 107h receive an output signal from selecting circuit 105d. By the bank address designating signal BAS and the leading address designating signal FAE/O, one of the drive circuits 107a to 107d is driven to the active state, and one of the write drive circuits 107e to 107h is driven to the active state. Accordingly, it becomes possible for write drive circuit 106 to transmit data of even-numbered address and odd-numbered address to the selected bank.

Figure 20:
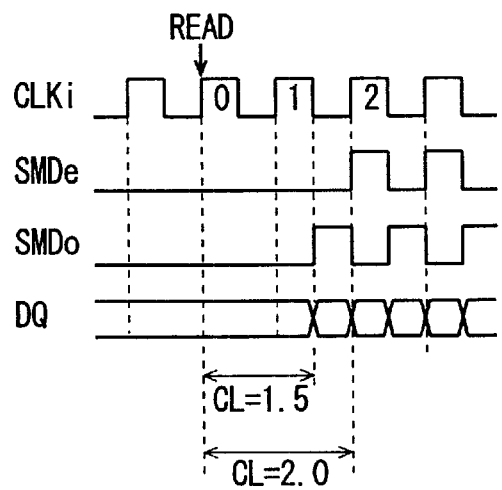
FIG. 20 is a timing chart depicting how the read clock signal shown in FIG. 19 is generated.

FIG. 20 represents relation among phases of read clock signals SMDe and SMDo and internal clock signal CLKi. As can be seen from FIG. 20, clock signal SMDe rises to the H level in synchronization with the rise of internal clock signal CLKi. Clock signal SMDo rises to the H level in synchronization with the fall of internal clock signal CLKi. When the column latency CL is 1.5, clock signal SMDo rises first to the H level, and thereafter, clock signal SMDe rises to the H level. When the column latency CL is 1.5, the leading data is read in synchronization with the clock signal SMDo. When column latency CL is 2.0, in clock cycle 1 of the internal clock signal CLKi, clock signal SMDo is not generated. The clock signal SMDe rises first to the H level, and in synchronization with the clock signal SMDe, the leading data is read. The data read first is always stored in register circuit 93u.

Figure 21:
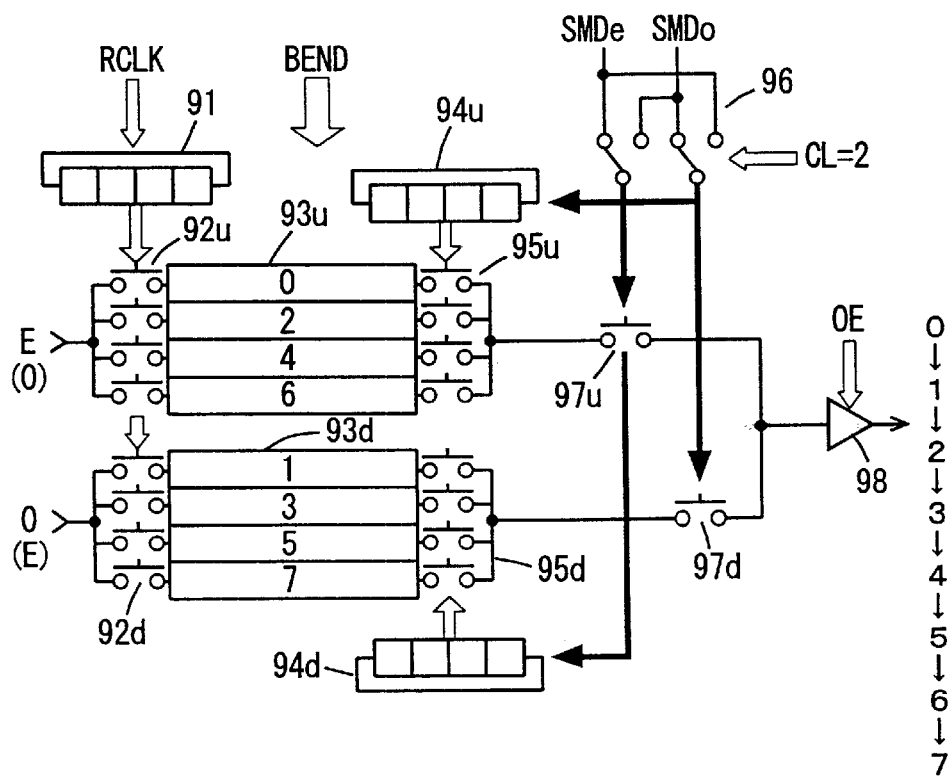
FIG. 21 is an illustration related to an operation of the read circuit shown in FIG. 19.

FIG. 21 represents connection of switch circuit 96 when column latency CL is 2. Referring to FIG. 21, when column latency CL is 2, switch circuit 96 applies the clock signal SMDe to transfer circuit 97u as well as to shift register 94d. Further, switch circuit 96 applies the clock signal SMDo to shift register 94u and transfer circuit 97d.

When the leading address is an even-numbered address, data of the even-numbered address E is applied to selecting circuit 92u, and data of the odd-numbered address O is applied to selecting circuit 92d. Selecting circuits 92u and 92d operate simultaneously in accordance with the output signal from shift register 91, and 2 bits of data read simultaneously are stored in parallel in registers 93u and 93d.

Then, in accordance with the clock signal SMDe, transfer circuit 97u is rendered conductive, reads data 0 stored in register 93u and applies the read data to output buffer circuit 98. When the clock signal SMDe falls to L level, then clock signal SMDo rises to the H level, transfer circuit 97d is rendered conductive, and shift register 94u performs a shifting operation. Transfer circuit 97d selects data 1 of register circuit 93d and applies it to output buffer 98. By the repetition of this operation, 2 bits of data read in parallel are read bit by bit serially.

When the leading address is the odd-numbered address O, the data of the odd-numbered address is applied to register circuit 93u and data of the even-numbered address is applied to register circuit 93b, as represented in the parentheses in FIG. 21.

Figure 22:
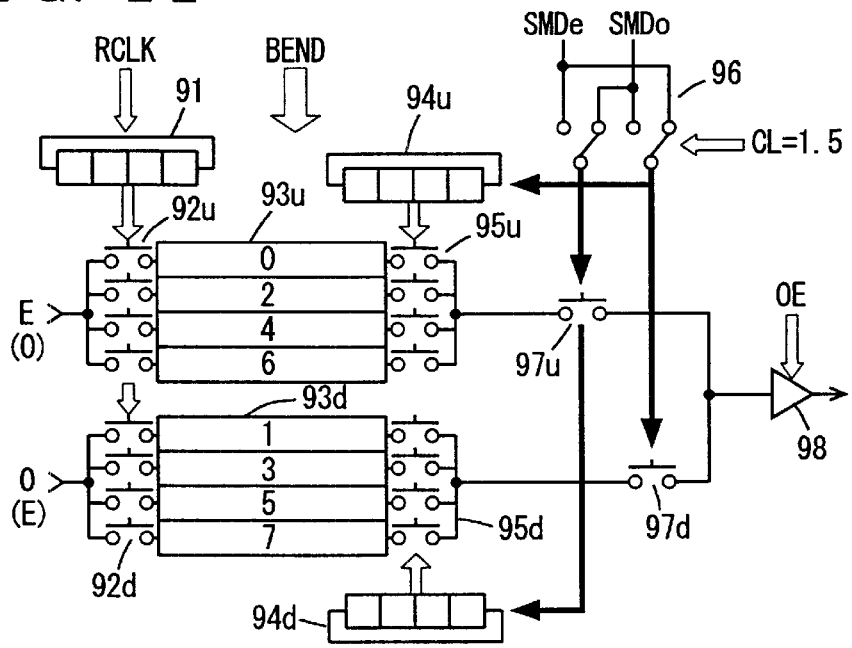
FIG. 22 is an illustration related to an operation of the read circuit shown in FIG. 19.

FIG. 22 represents connection of switch circuit 96 when column latency CL is 1.5. As can be seen from FIG. 22, when column latency CL is 1.5, switch circuit 96 applies the clock signal SMDe to shift register 94u and transfer circuit 97d, and applies clock signal SMDo to transfer circuit 97u and shift register 94d. When the leading address is the even-numbered address E, the data of the even-numbered address E is applied to register circuit 93u, and data of the odd-numbered address O is applied to register circuit 93d. When column latency CL is 1.5, first, the clock signal SMDo rises to the H level, and selecting circuit 97u selects data 0 of register 93u. Thereafter, clock signal SMDe attains to the H level, and transfer circuit 97d selects and applies to output buffer circuit 98 the data 1 of register circuit 93d. Thereafter, in accordance with the shifting operation of shift registers 94u and 94d, selecting circuits 95u and 95d select data successively. When column latency CL is 1.5 and leading address is the odd-numbered address 0, the data of the odd-numbered address 0 is stored in register circuit 93u, and data of the even-numbered address E is stored in register circuit 93d.

Therefore, it is always the case that the data read first is stored in the upper register circuit 93u.

In the configuration shown in FIG. 19, the shifting operation of shift registers 94u and 94d are not always performed in response to the clock signal, but the shifting operation is activated when the read clock signal RCLK is activated. In this case, it is possible to generate clock signals SMDe and SMDo in synchronization with the internal clock signal CLKi (when the read clock signal RCLK is applied in accordance with the read command).

When reading of the burst length data is completed, a reset signal BEND is activated, and the read circuit is reset to the initial state.

Figure 23A:
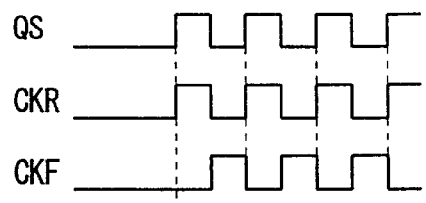
FIG. 23A is a diagram depicting how the write clock signal is generated.

FIG. 23A represents phases of write clock signals CKR and CKF. As can be seen from FIG. 23A, clock signal CKR rises to the H level in synchronization with the rise of the strobe clock signal QS, and clock signal CKF rises to the H level in synchronization with the fall of the strobe clock signal QS. Therefore, it is always the case in data writing that the clock signal CKR rises to the H level first.

Figure 23B:
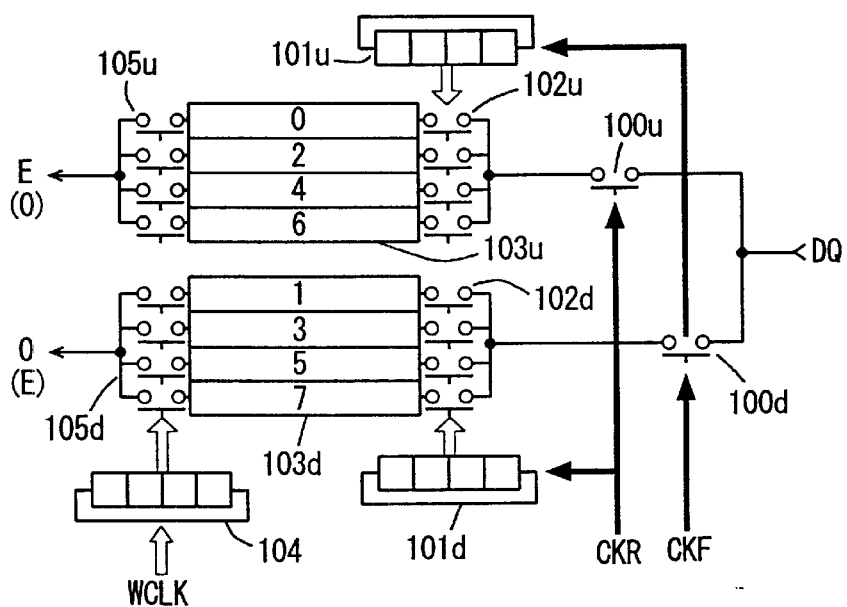
FIG. 23B is an illustration related to an operation of the data write circuit.

As can be seen from FIG. 23B, transfer circuit 100u is rendered conductive first, and the first data 0 is stored in register circuit 101u. Thereafter, transfer circuit 100d is rendered conductive and the next data 1 is stored in register circuit 103d. Thereafter, data are stored alternately to register circuits 103*u* and 103*d* successively. When 2 bits of data are stored in the register circuit, 2 bits of data are read simultaneously by selecting circuits 105*u* and 105*d*. Output data from selecting circuits 105*u* and 105*d* are transmitted to the memory cells by the write drivers enabled by the leading address designating signal, respectively. When the leading address is the even-numbered address E, the data from selecting circuit 105*u* is transmitted to the even-numbered address data bus, and data from selecting circuit 105*d* is transmitted to the odd-numbered address data bus. Therefore, at this time of writing, in write driver 106 (see FIG. 19), the write drive circuit for the even-numbered address data bus and a write drive circuit for the odd-numbered address data bus are activated, one driver for each bus, in accordance with the leading address signal and the bank address signal.

As can be seen from FIG. 23B, at the time of a data write, 2 bits of data are taken and, thereafter, data transfer to the selected memory cells takes place in the first clock cycle. Therefore, the column latency is always 0, and the data to be written first is stored in the upper register circuit 103*u*, and the data applied next is stored in the lower register circuit 103*d*.

By utilizing the data input/output circuit shown in FIG. 19, it becomes possible to transmit data in synchronization with the clock signal.

Further, as the respective signals are transmitted in one direction through the buses, it is possible to take read data which is required accurately, as the data is taken after the lapse of a latency from the return of the command in the memory controller, and therefore the configuration for taking data in the memory controller can be simplified.

Fifth Embodiment

Figure 24:
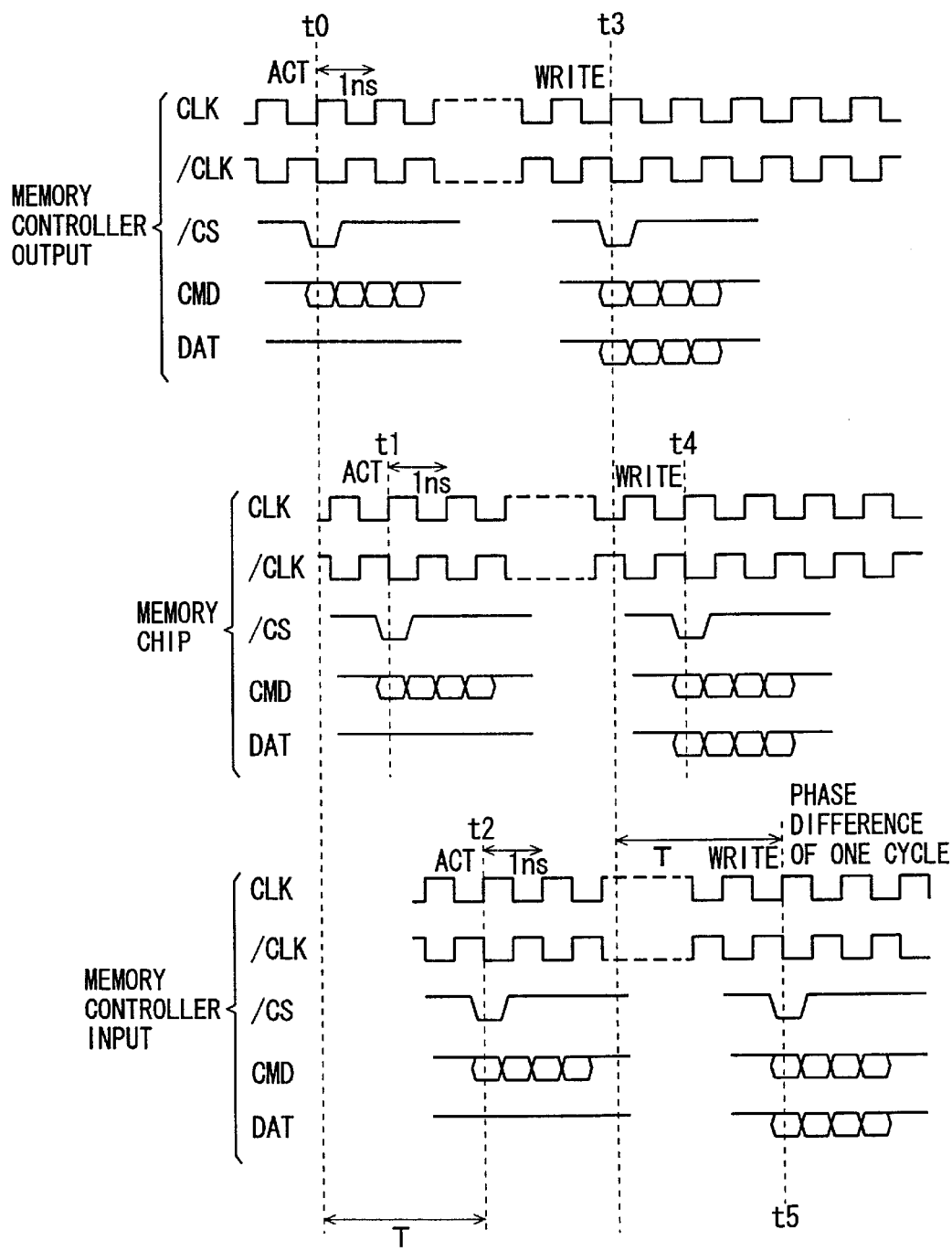
FIG. 24 is a timing chart showing states of signal propagation at a data write in the memory system in accordance with a fifth embodiment of the present invention.

FIG. 24 show the states of signal propagation in the memory system in accordance with the fifth embodiment of the present invention. FIG. 24 shows signal waveforms at the time of a data write. As can be seen from FIG. 24, in the fifth embodiment of the present invention, the strobe clock signals QS and /QS for providing timings of taking signals are not used. The memory controller outputs a chip select signal /CS to indicate that the command CMD is valid. By the activation of the chip select signal /CS, the memory chip takes an applied command. More specifically, when an active command ACT is applied, the memory chip determines that the applied command is a significant command, as the chip select signal /CS is at the active state of L level at the rising edge of the clock signal CLK, and therefore the memory chip takes and decodes the applied command. When a write command WRITE indicating a writing operation is applied, the memory chip takes the applied command CMD, the data DAT and the address signal, in response to the L level of the chip select signal /CS at the rising edge of the clock signal CLK. The clock signal, the chip select signal /CS, the command CMD and write data DAT are returned to the memory controller. The memory controller knows the return of the valid command CMD in accordance with the active state of the chip select signal /CS at the rising edge of the clock signal CLK. In this case, however, as the write command WRITE is applied, the memory controller does not take the applied data.

Figure 25:
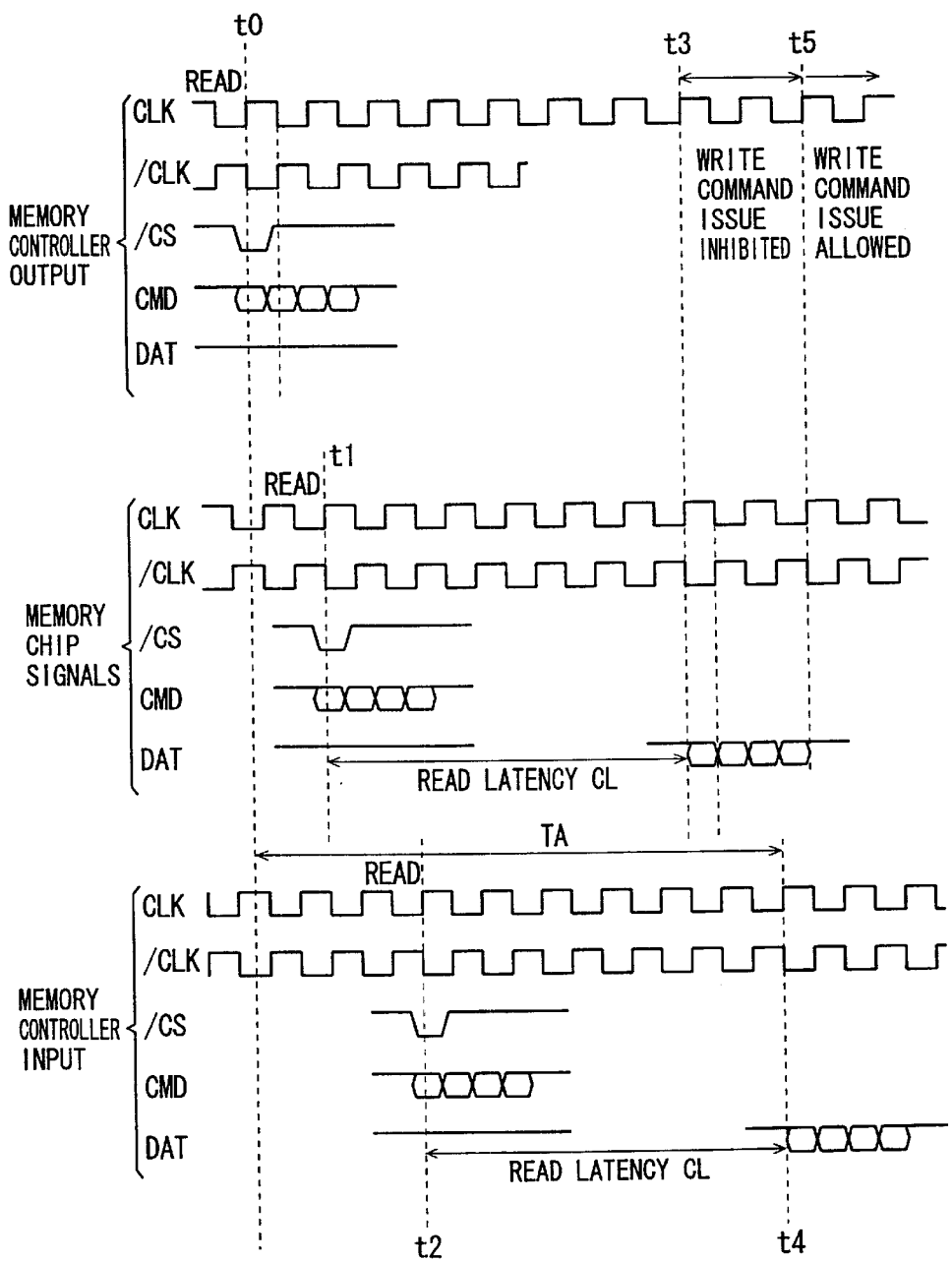
FIG. 25 is a timing chart showing states of signal propagation in a data read in the memory system in accordance with a fifth embodiment of the present invention.

FIG. 25 represents signal propagation at the time of a data read. Referring to FIG. 25, a read command READ designating data reading is output from the memory controller. Simultaneously with the read command READ, the chip select signal /CS is driven to the active state of L level. In the memory chip, when the chip select signal /CS is in the active state, the applied command CMD is taken and decoded internally, and data reading operation is performed. After the lapse of the read latency CL from the application of the read command READ, the data is output in synchronization with the clock signal CLK from the memory chip.

In the memory controller, when the returned chip select signal /CS is in the active state, the returned command is decoded, and when the returned command is the read command, the applied data is taken in synchronization with the clock signal CLK after the lapse of the read latency CL. No matter whether the read command READ or the write command WRITE is applied, the chip select signal /CS is set to the active state.

As can be seen from FIGS. 24 and 25, use of the chip select signal /CS eliminates the need of strobe clock signals QS and /QS, and therefore the number of lines can be reduced.

Figure 26:
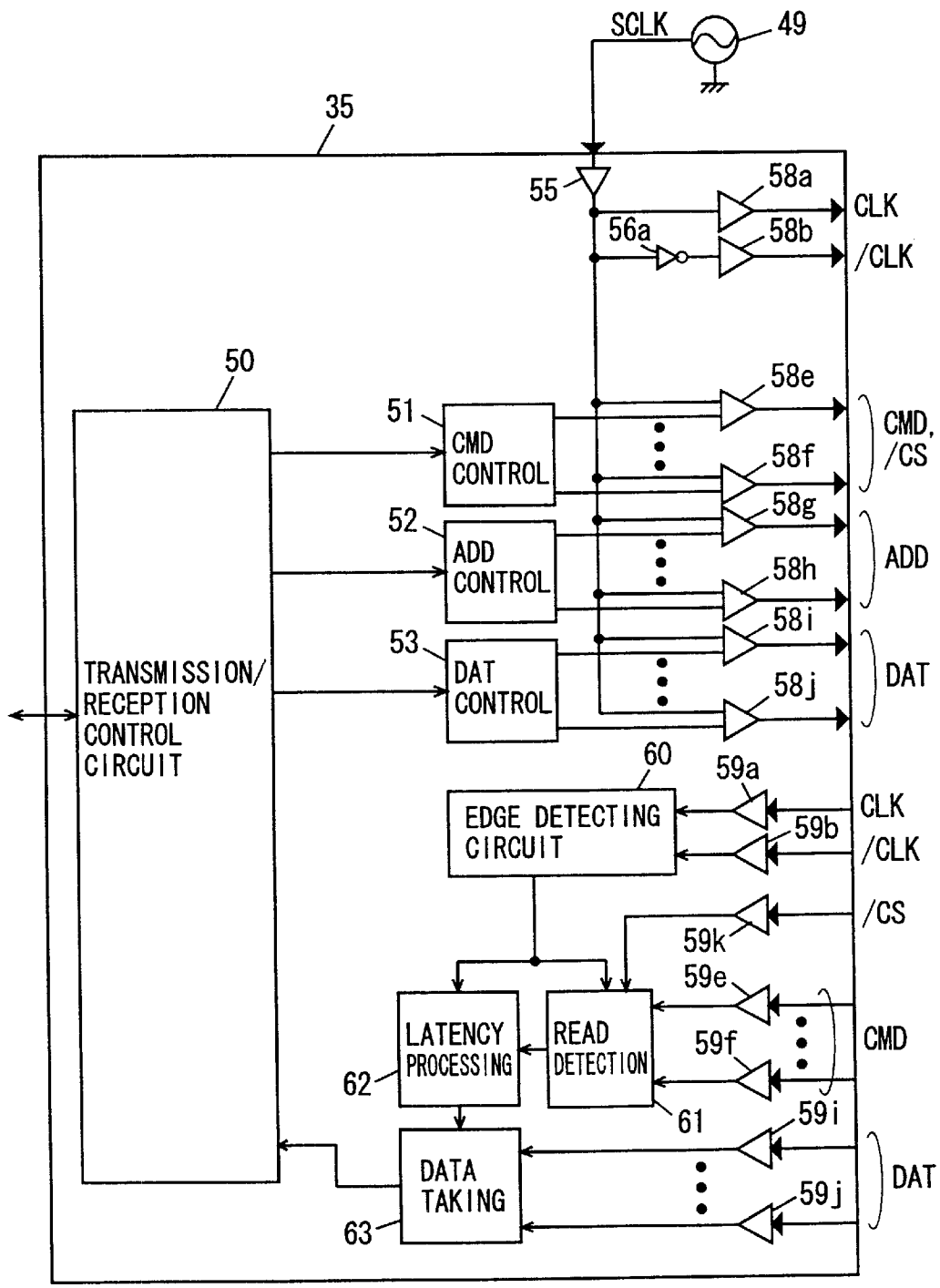
FIG. 26 is a schematic diagram representing a configuration of the memory controller in accordance with the fifth embodiment of the present invention.

FIG. 26 is a schematic diagram representing the configuration of the memory controller constituting the memory system in accordance with the fifth embodiment. In the memory controller 35 shown in FIG. 26, CMD control circuit 51 generates the command CMD and the chip select signal /CS, and buffers 58*e* to 58*f* output the command CMD and chip select signal /CS in accordance with the clock signal from clock buffer/driver 55. The strobe clock signal is not generated.

At an input section, chip select signal /CS is transmitted through a buffer 59*k* to a READ detecting circuit 61. When the chip select signal /CS applied through buffer 59*k* is at the L level, READ detecting circuit 61 determines whether the command CMD applied through buffers 59*e* to 59*f* is the read command READ. If it is determined that the read command is applied, READ detecting circuit 61 activates latency processing circuit 62. Latency processing circuit 62 is activated in response to the read command detection designation from READ detecting circuit 61, counts the clock signals from edge detecting circuit 60, and after the lapse of the latency period, generates a clock signal for taking data.

Therefore, as compared with the configuration shown in FIG. 16, the configuration of the memory controller can be simplified, as the strobe clock signals QS and /QS are not used.

Figure 27:
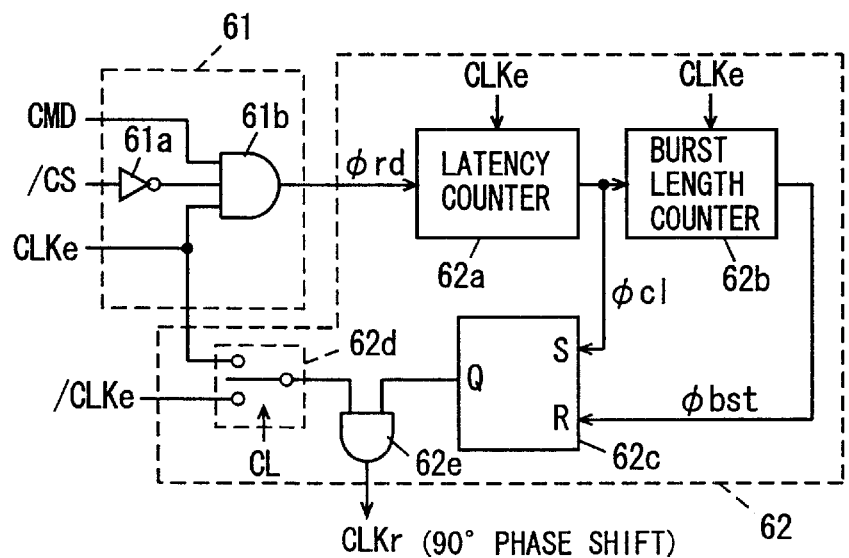
FIG. 27 is a schematic diagram representing an example of configurations of the READ detecting circuit and the latency processing circuit shown in FIG. 26.

FIG. 27 is a schematic diagram representing configurations of read detecting circuit 61 and latency processing circuit 62 of FIG. 26. Referring to FIG. 27, READ detecting circuit 61 includes an inverter 61*a* receiving the chip select signal /CS, and an AND circuit 61*b* receiving an output signal from inverter 61*a*, the clock signal CLK from edge detecting circuit 60 and the command CMD. When the chip select signal /CS is at the L level at the rising edge of the clock signal CLKe from edge detecting circuit 60 and the command CMD is the read command READ, READ detecting circuit 61 drives a read command detection signal φrd to the H level. The read command READ consists of 4 groups of bits, and chip select signal /CS is delayed by 2 clock cycles.

Latency processing circuit 62 includes: a latency counter 62*a* activated in response to activation of the read command detection signal φrd for counting the clock signal CLKe from edge detecting circuit 60; a burst length counter 62*b* activated in response to a count up designation signal φcl of latency counter 62*a* for counting the burst length period; a set/reset flip flop 62*c* set in response to activation of the count up designation signal φcl from latency counter 62*a* and reset in response to activation of a count up designation signal φbst from burst length counter 62b; a switch circuit 62b for selecting one of clock signals CLKe and /CLKe in accordance with the column latency (read latency) CL; and an AND circuit 62e for generating a read clock signal CLKr in accordance with the clock signal from switch circuit 62b and the output signal from set/reset flip flop 62c. Data is taken in accordance with a timing signal obtained by shifting phase of the clock signal CLKr by 90°.

Latency counter 62e may be formed, for example, of a shift register circuit for performing a shifting operation in accordance with the clock signal CLKe, and it shifts the read command detection signal φrd in accordance with the clock signal CLKe and drives an output signal φcl thereof to the H level after the lapse of the read latency period. Burst length counter 62 may also be formed by a shift register performing a shifting operation in response to the clock signal CLKe, shifts the output signal φcl from latency counter 62a for the burst length period in response to the clock signal CLKe, and outputs the output signal φbst in accordance with the result of shifting. Here, the burst length represents the number of data read successively when the read command is applied.

Switch circuit 62d selects clock signal CLKe when read latency CL indicates 2, and selects the clock signal /CLKe when the read latency CL is 1.5. The operation of the circuit shown in FIG. 27 will be described with reference to the timing charts of FIGS. 28A and 28B.

Figure 28A:
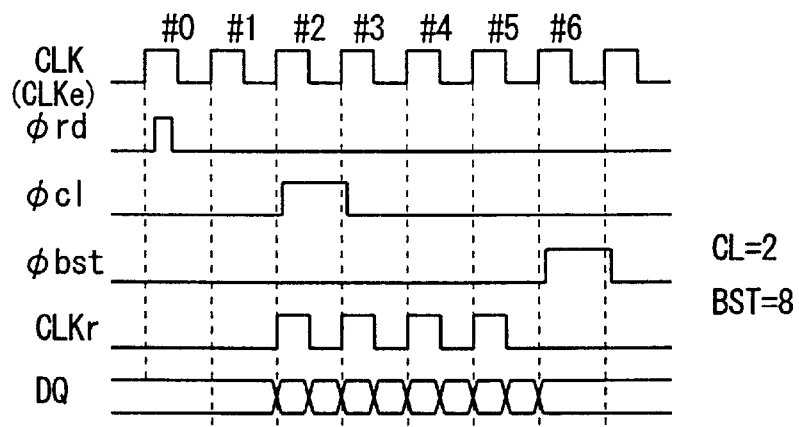
FIGS. 28A and 28B are timing charts representing operations of the circuit shown in FIG. 27.

First, referring to FIG. 28A, an operation when the read latency CL is 2 and the burst length BST is 8 will be described. In cycle #0 of the clock signal CLK, the read command is returned, and the read command detection signal φrd rises to the H level. Accordingly, latency counter 62a is activated to start counting of the latency period. As the read latency CL is 2, the output signal φcl of latency counter 62a rises to the H level in clock cycle #2 after the lapse of 2 clock cycles from the application of the read command, and set/reset flip flop 62c is set. Switch circuit 62d has selected clock signal CLKe. Therefore, clock signal CLKr makes a transition in synchronization with the clock signal CLKe from clock cycle #2. After the lapse of the read latency, data is transferred in synchronization with the clock signal CLK. Therefore, by taking signals in synchronization with the rising edge or the falling edge of the clock signal CLKi (at the timing shifted in phase by 90°), it is possible to take the read data. As the burst length BST is 8, the last read data arrives in clock cycle #5. Therefore, in clock cycle #6 after the lapse of the burst length period, the output signal φbst of burst length counter 62b attains to the H level, the set/reset flip flop is reset, and the clock signal CLKr for taking is fixed to the L level.

Figure 28B:
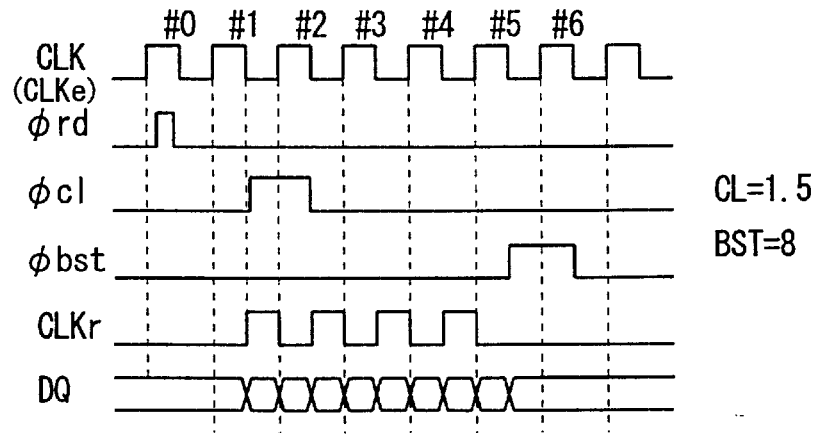

Next, referring to FIG. 28B, an operation when the read latency CL is 1.5 and the burst length BST is 8 will be described. When the column latency CL is 1.5, switch circuit 62b selects the complementary clock signal CLKe. In clock cycle #0, when read command detection signal φrd is activated, the signal φcl from latency counter 62a rises to the H level in synchronization with the fall of the clock signal CLK in clock cycle #1. The set/reset flip flop 62c is set, and AND circuit 62e generates the clock signal CLKr for taking, in accordance with the complementary clock signal /CLKe. As the burst length BST is 8, the output signal φbst from burst length counter 62b rises to the H level in synchronization with the fall of clock signal CLK in clock cycle #5, and set/reset flip flop 62c is reset. In response, the clock signal CLKr from AND circuit 62e is fixed at the L level, and taking of data thereafter is inhibited.

Therefore, in this case also, even in the configuration in which the read command is detected simply by using the chip select signal /CS, accurate data taking is possible as the clock signals CLKe and /CLKe are selected in accordance with the read latency CL.

Latency counter 62a may be configured to count not the latency period CL but latency period −0.5, that is, CL −0.5 clock cycles. In that case, though burst length designating signal φbst is also activated faster by 0.5 clock cycle than the timing shown in the timing charts of FIGS. 28A and 28B, the clock signal CLKr is at the L level at that time, and therefore there is no problem. It is possible to generate the clock signal CLKr for taking in accordance with the clock signal CLKe or /CLKe more accurately (as there is no gate delay). The data is taken, however, at a timing delayed in phase by 90° in accordance with the clock signal CLKr.

Figure 29:
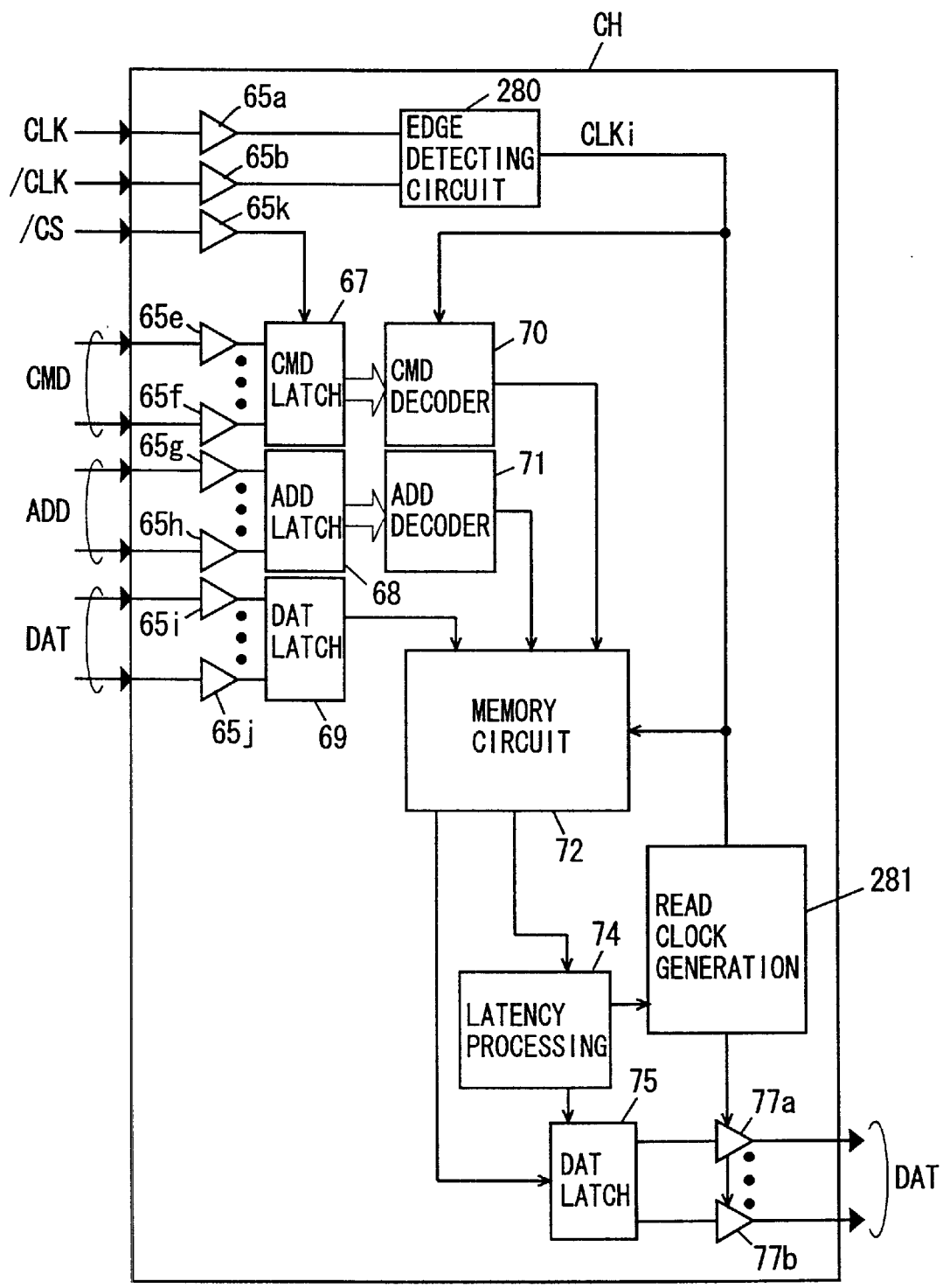
FIG. 29 is a schematic diagram representing configuration of a memory chip used in the memory system in accordance with the fifth embodiment of the present invention.

FIG. 29 is a schematic diagram of the configuration of memory chip CH used in the memory system in accordance with the fifth embodiment of the present invention. The memory chip CH shown in FIG. 29 differs from the memory chip CH shown in FIG. 17 in the following points. More specifically, in accordance with an output signal from buffer 65k receiving the chip select signal /CS, CMD latch 67, ADD latch 68 and DAT latch 69 execute latching operation (in synchronization with the internal clock output from edge detecting circuit 280). Further, edge detecting circuit 280 generates the internal clock signal CLKi, receiving the complementary clock signals output from clock input buffers 65a and 65b. Edge detecting circuit 280 detects a crossing portion of complementary clock signals, generates the internal clock signal CLKi using the detected crossing portion as a trigger, and applies the generated signal to CMD decoder 70. ADD decoder 71 decodes the address signal latched by the ADD latch 68 when the output signal of CMD decoder 70 designates a row access or a column access.

At the time of a data read, read clock generating circuit 281 generates and applies to output buffer circuits 74a to 74d a clock signal for reading in accordance with the internal clock signal CLKi from edge detecting circuit 280 under the control of latency processing circuit 74. Output buffer circuits 77a–77e include a transfer circuit and the output buffer shown in FIG. 19, and outputs data DAT at the rising and falling edges of internal clock signal CLKi. When output buffer circuits 77a to 77e correspond to output buffer 98 shown in FIG. 19, the read clock signal from read clock generating circuit 281 is applied to DAT latch 75, and output enable signal OE is applied to output buffer circuits 77a to 77b. Any configuration may be used.

In the configuration shown in FIG. 29, the strobe clock signals QS and /QS are not input to memory chip CH, and output of strobe clock signals QS and /QS in synchronization with data DAT is not performed, either. The number of terminals of the memory chip CH can be reduced, and the configuration of the data output section is also simplified.

Figure 30A:
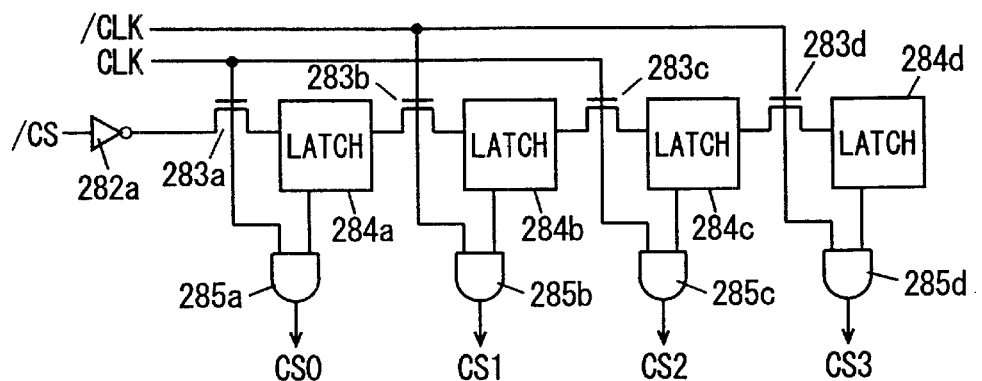
FIG. 30A is a schematic diagram representing configuration of the latch instructing signal generating section shown in FIG. 29.

FIG. 30A schematically shows the configuration of the control section of CMD latch 67 shown in FIG. 29. Referring to FIG. 30A, the control section includes: an inverter 282a receiving the chip select signal /CS; a transfer gate 283a rendered conductive in response to the H level of the clock signal CLK for passing an output signal of inverter 282a; a latch circuit 284a for latching an output signal of transfer gate 283a; a transfer gate 283b for transmitting the latch signal of latch circuit 284a in response to the H level of the clock signal /CLK; a latch 284b latching an output signal of transfer gate 283b; a transfer gate 283c for passing an output signal of latch 284b in response to the H level of the clock signal CLK; a latch circuit 28c latching an output signal of transfer gate 283c; a transfer gate 283d passing an output signal of latch circuit 284c in response to the H level of the clock signal CLK; and a latch circuit 284d latching the output signal of transfer gate 283d. The chip select signal /CS is applied from buffer circuit 65k shown in FIG. 29. Clock signals CLK and /CLK are applied from edge detecting circuit 280.

By transfer gates 283a to 283d and latches 284a to 284d, a shift register circuit transmitting chip select signal /CS applied through inverter 282a in response to clock signals CLK and /CLK is provided.

The latch control section further includes: an AND circuit 285a receiving the clock signal CLK and the output signal from latch 284a for generating a strobe timing signal CS0; an AND circuit 285b receiving the clock signal /CLK and an output signal from latch circuit 284b for generating a strobe timing signal CS1; an AND circuit 285c receiving the clock signal CLK and an output signal from latch circuit 284c for generating a strobe timing signal CS2; and an AND circuit 285d receiving the clock signal /CLK and an output signal from latch circuit 284d for generating a strobe timing signal CS3. By these AND circuit 285a to 285d, strobe timing signals CS0 to CS3 are driven to the active state of H level only for the half cycle period of the clock signal CLK.

Figure 30B:
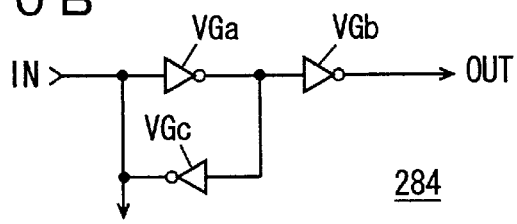
FIG. 30B represents a configuration of the latch shown in FIG. 30A.

FIG. 30B shows an example of the configuration of latch circuits 284a to 284d shown in FIG. 30A. Referring to FIG. 30B, latch circuit 284 (284a–284d) includes two stages of cascaded inverter circuits VGa and VGb receiving an input signal IN applied through a transfer gate, and an inverter circuit VGc inverting an output signal of inverter circuit VGa and transferring the inverted signal to an input of inverter circuit VGa. The latch circuit shown in FIG. 30B is a so called inverter latch circuit. Inverter circuit VGc may be formed of a tristate inverter buffer activated in response to the clock signal CLK or /CLK.

Figure 30C:
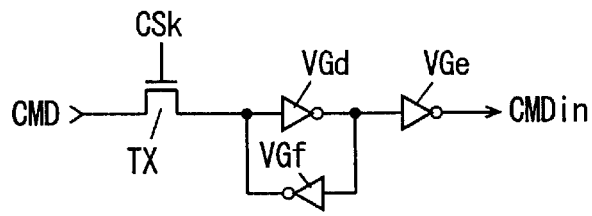
FIG. 30C is a schematic diagram representing a configuration of the latch circuit shown in FIG. 29.

FIG. 30C shows an example of the configuration of the latch circuit latching the command. Referring to FIG. 30C, the CMD latch circuit includes: a transfer gate TX rendered conductive when the strobe timing signal CSk (k=0–3) is activated, for passing command CMD; two stages of cascaded inverter circuits VGd and VGe receiving the command CMD applied through transfer gate TX; and an inverter circuit VGf constituting an inverter latch together with inverter circuit VGd. Inverter circuit VGf may be constituted by a tristate inverter buffer which is activated when the strobe timing signal /CSk is activated. An internal command signal CMDin is generated from inverter circuit VGa.

Figure 31:
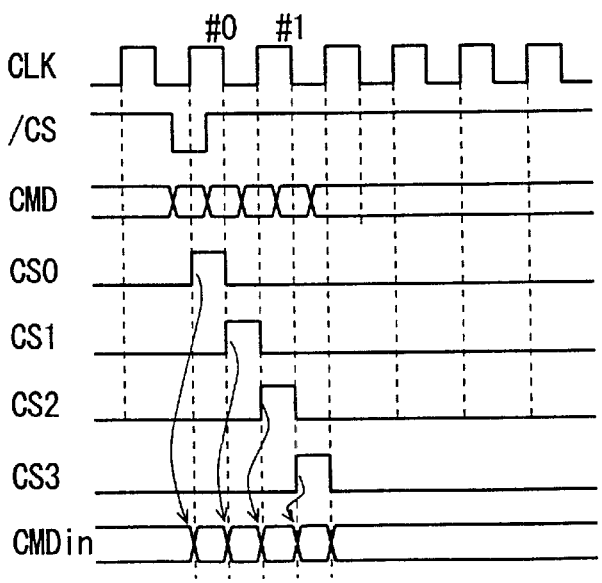
FIG. 31 is a timing chart representing an operation of the circuit shown in FIGS. 30A to 30C.

When the chip select signal /CS is applied as shown in FIGS. 30A to 30C, 4 groups of command bits are continuously applied in accordance with the rising and falling edges of the clock signal. In order to latch these four groups of command bits, 4 latch circuits corresponding to the latch circuit shown in FIG. 30C are provided parallel to each other. The operation of the CMD latch shown in FIGS. 30A to 30C will be described with reference to the timing chart of FIG. 31.

In the clock cycle #0 of the clock signal CLK, chip select signal /CS is held at the L level at the rising edge of the clock signal CLK. When the chip select signal /CS is applied, the command CMD is applied successively in synchronization with the rising and falling edges of the clock CLK, starting from clock cycle #0. One significant command is formed by these four groups of command bits. When the clock signal CLK attains to the H level, transfer gate 283a shown in FIG. 30A is rendered conductive, so that chip select signal /CS from inverter 282a is passed, and latch circuit 284a latches the chip select signal. Therefore, in clock cycle #0, in response to the rise of clock signal CLK, strobe timing signal CS0 attains to the H level, the first command CMD is taken and latched.

When the clock signal CLK falls to the L level, the complementary clock signal /CLK attains to the H level, the transfer gate 283b shown in FIG. 30A is rendered conductive, the signal latched by latch 284a is transmitted to latch 284b, and the output signal of latch circuit 284b attains to the H level. In latch circuit 284a, transfer gate 283a is non-conductive, and latch signal is at the H level. A clock signal CLK is, however, at the L level, and the strobe timing signal CS0 attains to the L level.

Latch circuit 284b latches the H level signal from latch circuit 284a, and the complementary clock signal/CLK attains to the H level. Therefore, strobe timing signal CS1 attains to the H level. Consequently, the next group of command bits applied in response to the fall of the clock signal CLK in the clock cycle #0 is latched by the second command latch circuit. Thereafter, in response to the rise of clock signals CLK and /CLK, latch circuits 284c and 284d latch the transferred signals respectively and, in response, in clock cycle #1, strobe timing signal CS2 attains to the H level in response to the rise of the clock signal CLK, and strobe timing signal CS3 attains to the H level in response to the fall of the clock signal CLK. Thus remaining groups of command bits are latched by other command latch circuits.

In latch circuit 284a, chip select signal /CS is at the L level only at the rise of the clock signal CLK in clock cycle #0, and after clock cycle #1, the latch signal in latch circuit 284a is at the L level, and in latch circuits 284b, 284c and 284d, the latch signals attain to the L level successively.

As 4 command latch circuits (FIG. 30C) are provided in parallel, it is possible to latch 4 continuous groups of command bits in accordance with the chip select signal /CS applied once. The internal commands CMDin are applied in parallel to command decoder (CMD decoder).

If it is the case that the state of command CMD is determined only at the rising edge of clock cycle #0 similar to the chip select signal /CS, the latch control section shown in FIG. 30A is unnecessary. What is necessary is to apply the chip select signal CS to the transfer gate in the command latch circuit shown in FIG. 30C. It is possible to generate the internal command signal in response to the rise of the clock signal CLK internally.

Modification

A configuration in which the CMD decoder is activated when the chip select signal /CS is activated may be employed.

As described above, in accordance with the fifth embodiment of the present invention, the memory chip takes the applied command and the address signal and takes the write data in accordance with the chip select signal /CS, and the memory controller determines return of the command in accordance with the returned chip select signal /CS, and if the command is the read command, the applied data is taken after the lapse of the read latency. Therefore, it is unnecessary to transfer the strobe clock signals QS and /QS, timing control is facilitated, and number of lines can be reduced.

Sixth Embodiment

Figure 32:
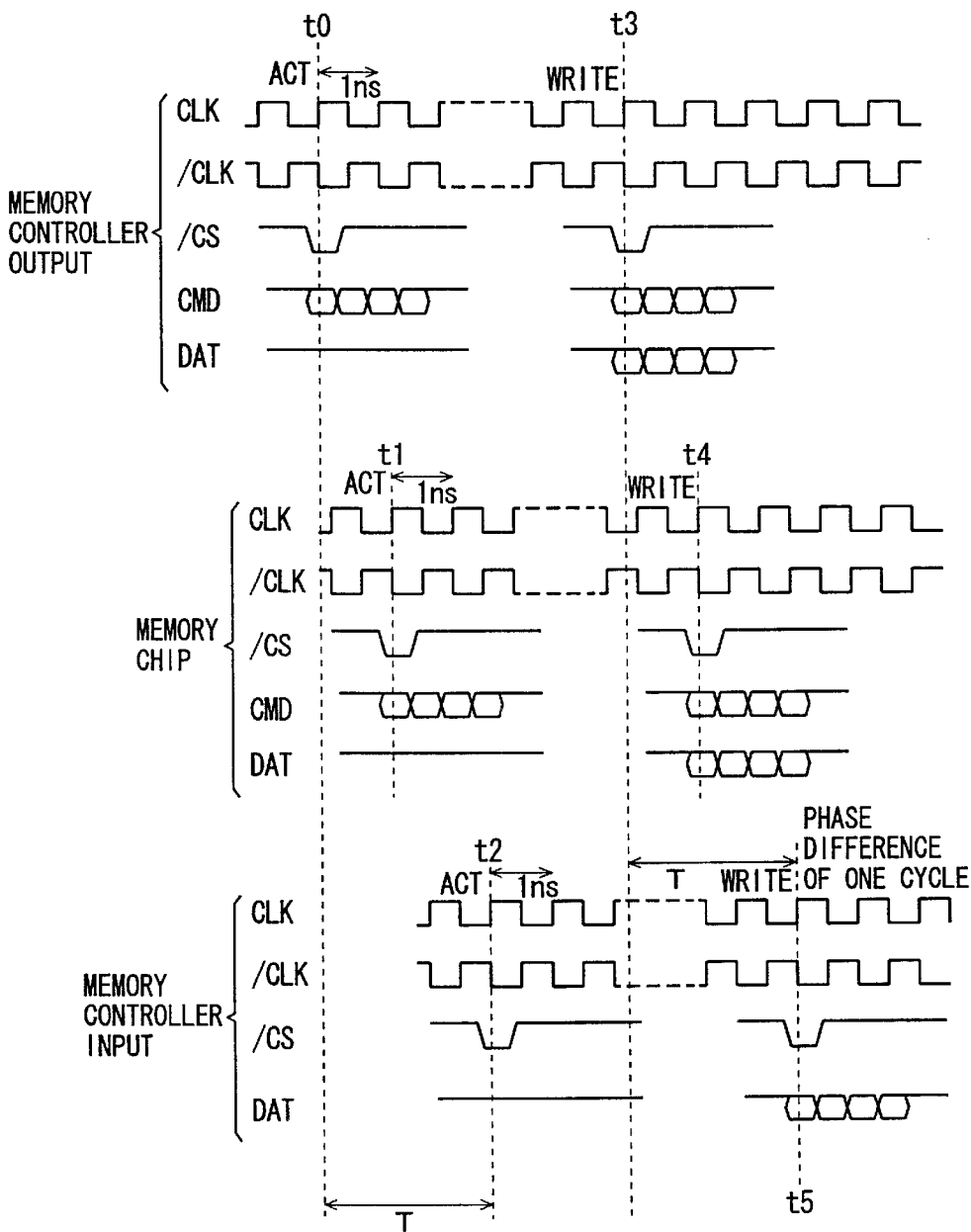
FIG. 32 is a timing chart showing states of signal propagation in a data write in the memory system in accordance with a sixth embodiment of the present invention.

FIG. 32 represents states of signal propagation at the time of a data write in the memory system in accordance with the sixth embodiment of the present invention. As can be seen from FIG. 32, in the sixth embodiment, clock signals CLK and /CLK, chip select signal /CS, command CMD, address signal, and data DAT are transmitted from the memory controller. Similar to the fifth embodiment, in the memory chip, taking of the command and the address CMD is performed and taking of write data DAT is performed, in response to activation of the chip select signal /CS. To the memory controller, clock signals CLK and /CLK, chip select signal /CS and write data DAT are returned. The command CMD and address ADD are not returned. At the time of a data write, taking of data is not necessary for the memory controller, and therefore there is no problem.

Figure 33:
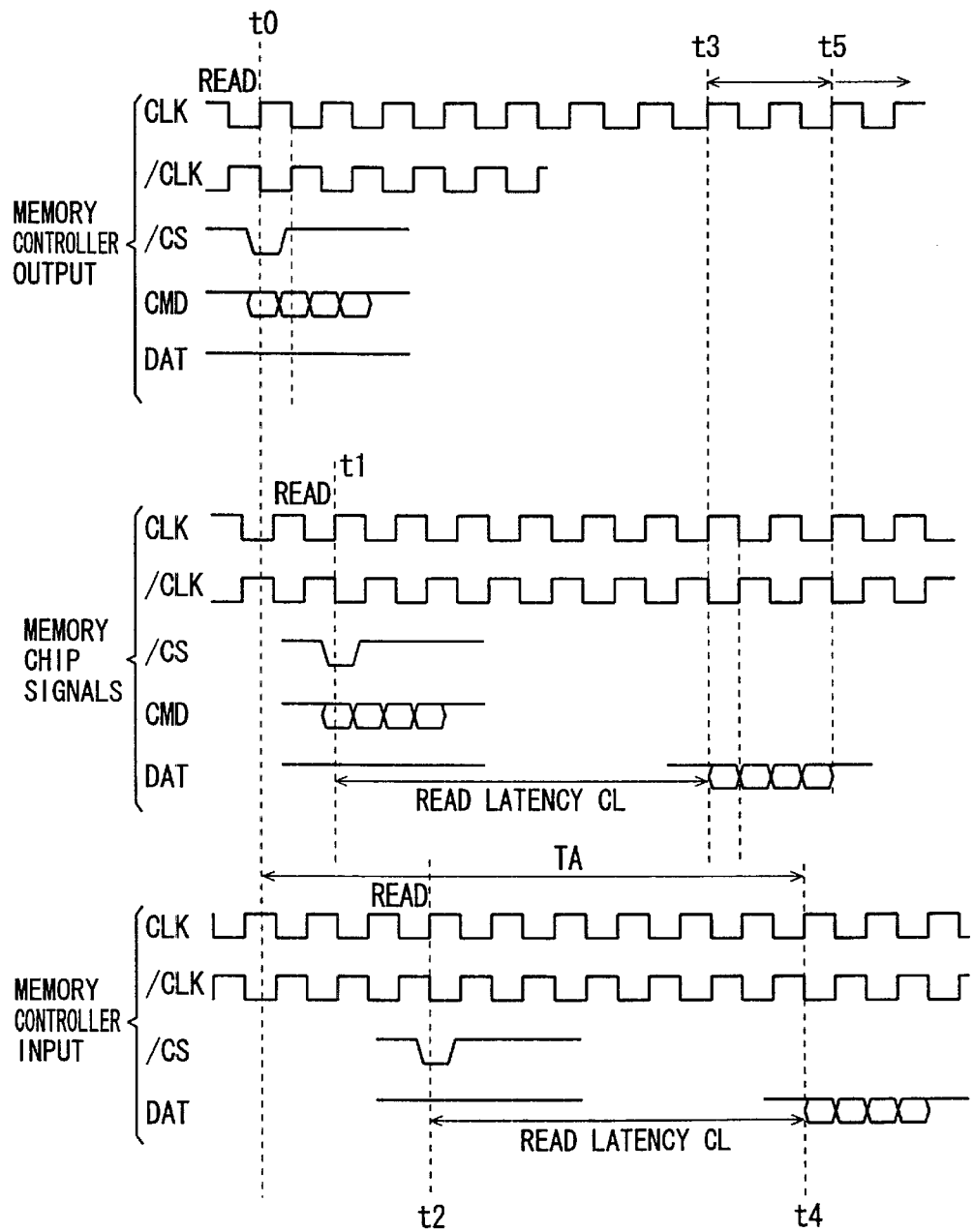
FIG. 33 is a timing chart showing states of signal propagation in a data read in the memory system in accordance with the sixth embodiment of the present invention.

FIG. 33 represents states of signal propagation at the time of a data read in the memory system in accordance with the sixth embodiment of the present invention. At the time of a data read, the memory chip takes the command and the address in accordance with the chip select signal /CS, performs internal reading of the memory cell data, and after the lapse of read latency CL, transfers the read data in synchronization with the clock signal CLK. The read command READ is not returned to the memory controller. The memory controller takes the data DAT after the lapse of the read latency cycles, in response to activation of the chip select signal /CS. The chip select signal /CS is applied simultaneously with the command (leading group of command bits). Therefore, the timing relation between the chip select signal /CS and the leading read data in the memory chip can also be identified at the memory controller input section. Therefore, when the data is taken after the lapse of read latency CL from the detection of chip select signal /CS, it is possible to accurately take the read data (the memory controller can determine issuance of the read command by itself).

The write data is not taken and only the read data is taken. Taking of data in the memory controller is performed not only when the read command is transmitted, but also when a specific information (data stored in the mode register) is generally read from the memory chip.

Figure 34:
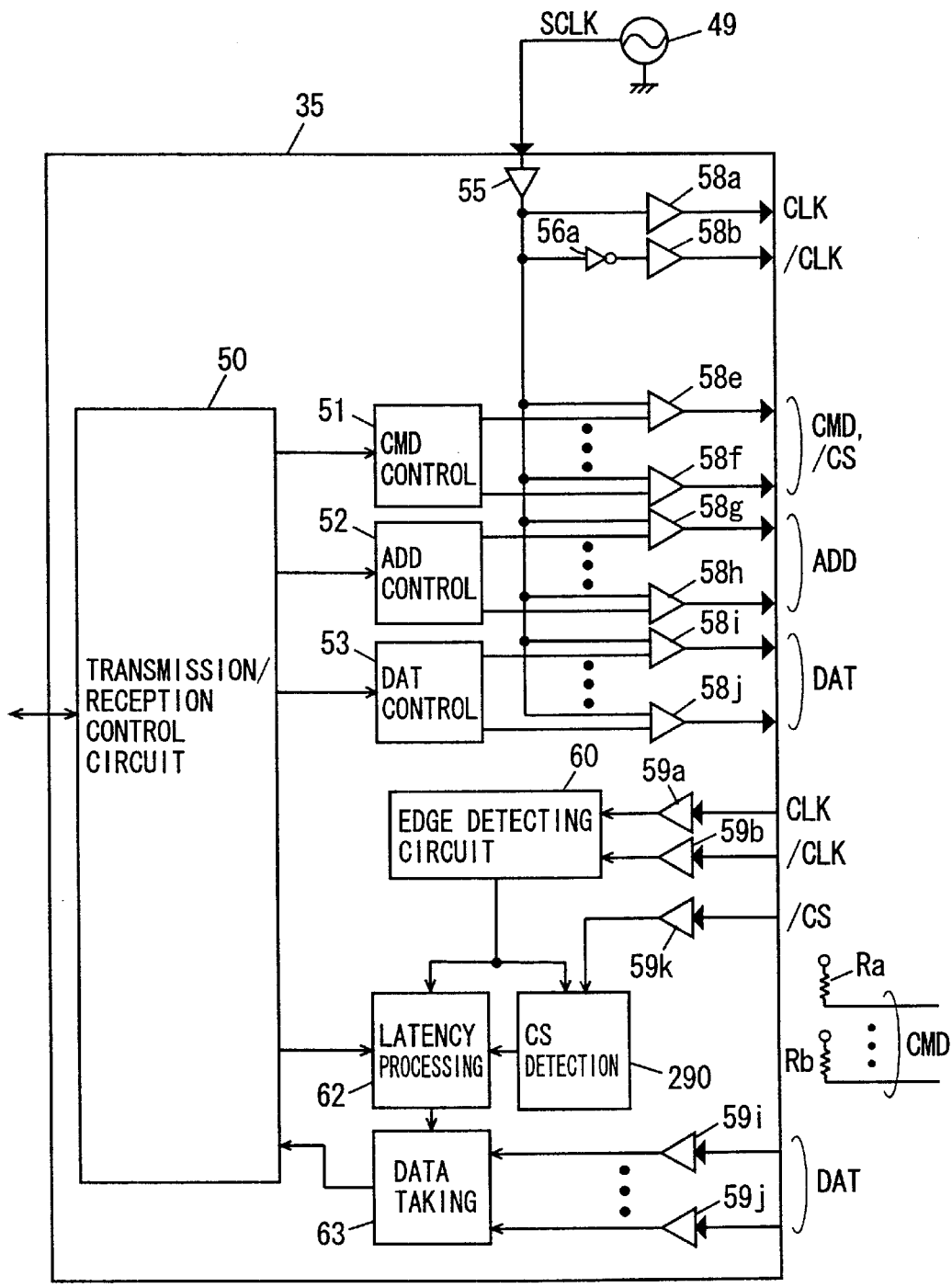
FIG. 34 is a schematic diagram representing configuration of the memory controller used in the memory system in accordance with the sixth embodiment of the present invention.

FIG. 34 is a schematic diagram of the configuration of the memory controller provided in the memory system in accordance with the sixth embodiment. Referring to FIG. 34, memory controller 35 includes a CS detecting circuit 290 for detecting activation of the chip select signal in accordance with an output signal of a buffer 59k receiving the returned chip select signal /CS. A signal line transmitting the command CMD is terminated by terminating resistances Ra and Rb and so on. As the signal line transmitting the command CMD is terminated by the terminating resistance, impedance matching is attained, preventing reflection of the signal. This also applies to the signal line transmitting the address signal ADD.

The latency processing circuit 62 is enabled in accordance with a control signal from transmission/reception control circuit 50, activated in response to the chip select signal activation designating signal from CS detecting circuit 290, counts the read latency in accordance with the internal clock signal from edge detecting circuit 60, and applies, after the count up, a clock signal for taking data to data taking circuit 63. Any circuit configuration may be used for data taking circuit 63 provided that applied data is taken in synchronization with the rising and falling edges of clock signal CLK.

Enabling and disabling of latency processing circuit 62 are performed, in accordance with generation of a data return request command from the command generating circuit when read command or return data request command is generated during generation of the commands of transmission/reception control circuit 50. Further, latency processing circuit 62 is enabled when a command requiring return data (read command or a mode register internal data read command) is generated in the command generating circuit 5b of FIG. 6, for example. It should be noted that in reading the content of the mode register, cycle number of the latency differs. In that case, the latency period may be varied in latency processing circuit 62 in accordance with respective instructions. CS detecting circuit 290 may be enabled when the read command is issued.

The configuration of memory chip CH is the same as that of the fourth embodiment described above (see FIG. 29).

As described above, according to the sixth embodiment of the present invention, when an instruction having a data return request is issued, return of the chip select signal /CS is detected, and based on the detection, the data applied through the data bus is taken. Therefore, the number of terminals of the memory controller can be reduced and, accordingly, chip area for the memory controller can be reduced.

Seventh Embodiment

Figure 35:
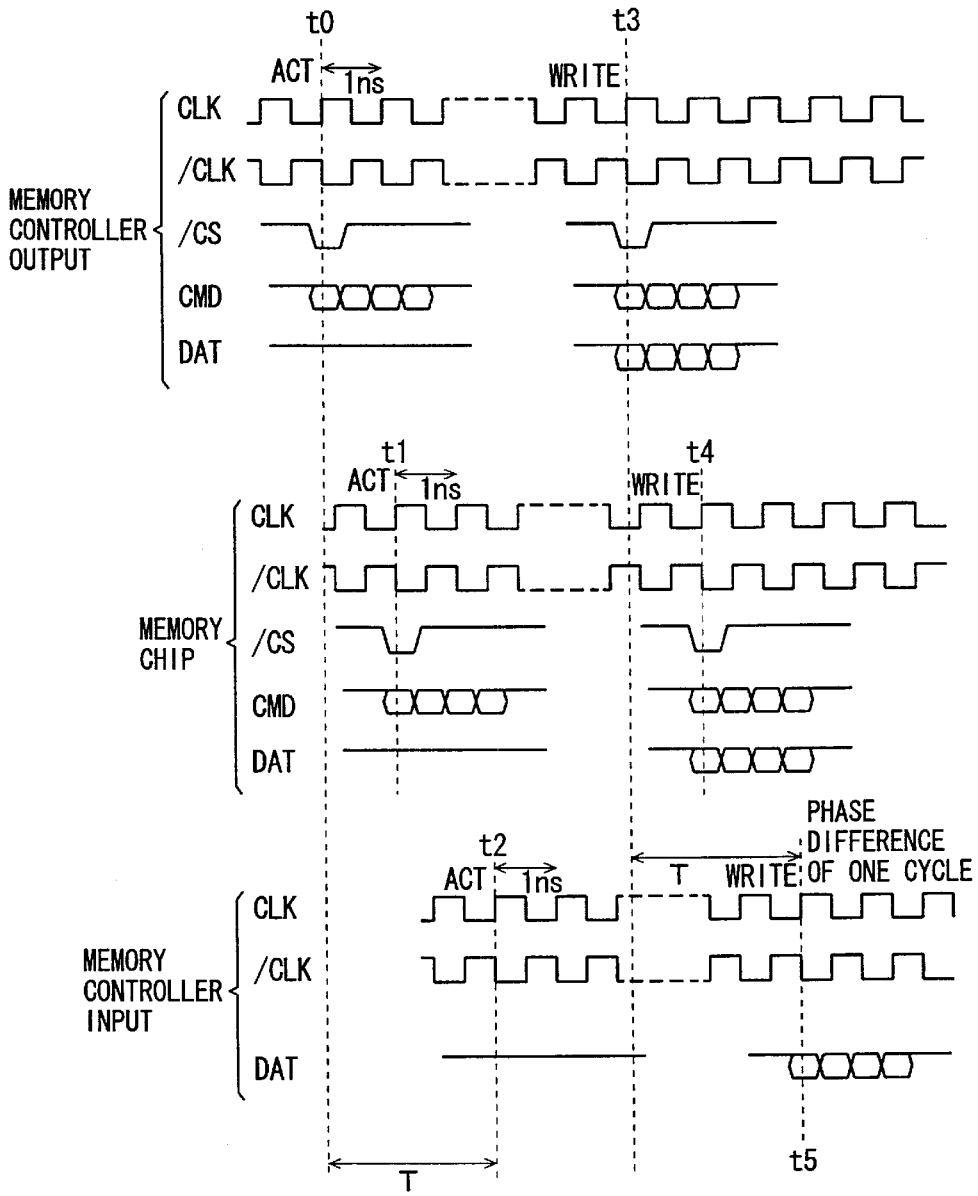
FIG. 35 is a timing chart showing states of signal propagation at the time of data write in the memory system in accordance with a seventh embodiment of the present invention.

FIG. 35 represents states of signal propagation at the time of a data write in accordance with the seventh embodiment of the present invention. Referring to FIG. 35, similar to the sixth embodiment described above, clock signals CLK and /CLK, control signal /CS, command CMD and data DAT are output from the memory controller. In the memory chip, applied command CMD and the write data DAT are taken, in response to the activation of the chip select signal /CS at the time of a data write. To the memory controller, clock signals CLK and /CLK are returned and write data DAT is returned. As the signals which are returned to the memory controller are the clock signals CLK and /CLK and data DAT, the number of terminals of the memory controller can further be reduced.

Figure 36:
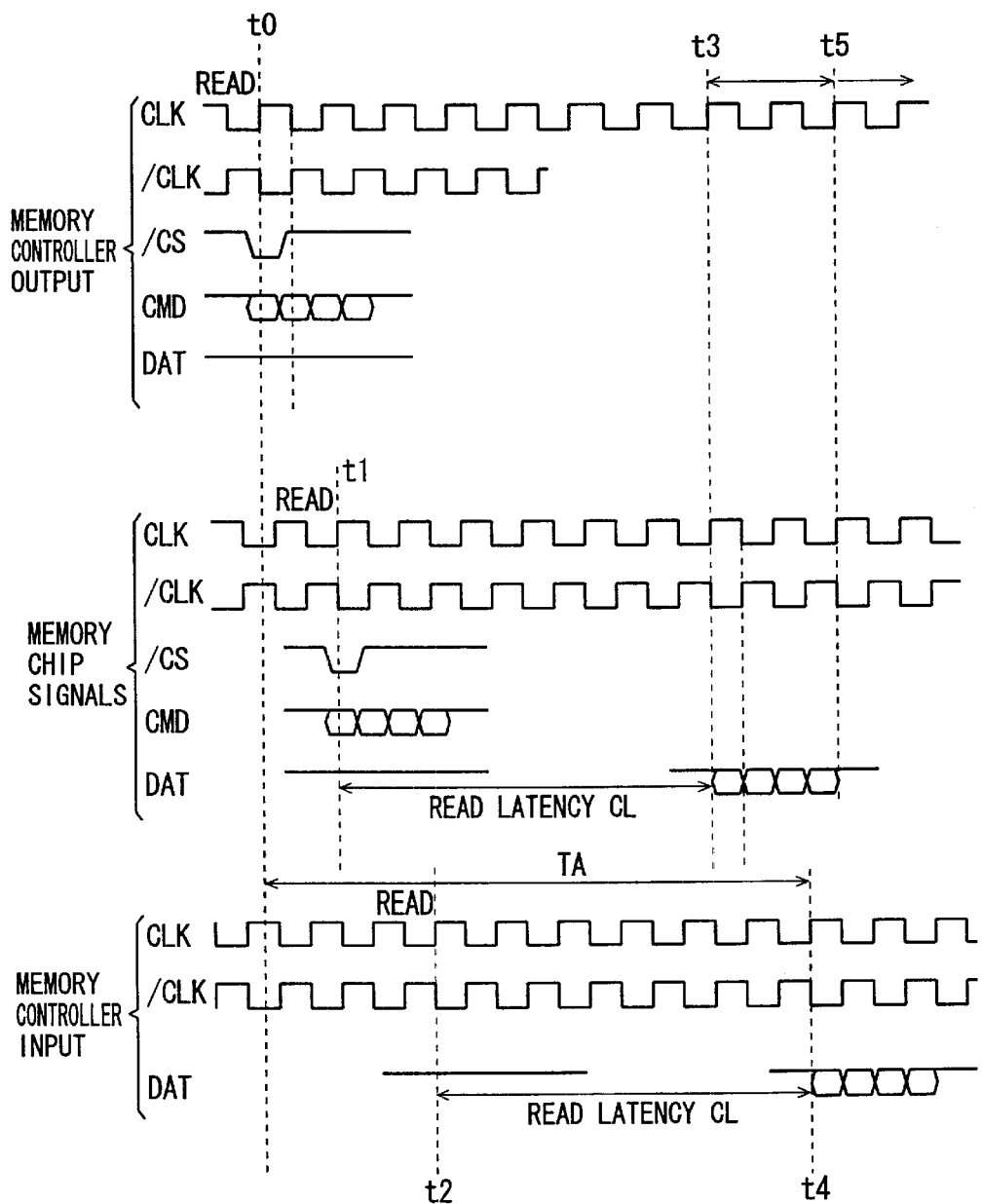
FIG. 36 is a timing chart showing states of signal propagation at the time of data read in the memory system in accordance with the seventh embodiment of the present invention.

FIG. 36 represents the states of signal propagation at the time of a data read in the memory system in accordance with the seventh embodiment of the present invention. Referring to FIG. 36, the memory chip takes and decodes the command CMD in response to activation of the. chip select signal /CS applied from the memory controller, and when the read command READ is applied, performs data reading. After the lapse of read latency CL after the application of read command READ, valid data is output in synchronization with the clock signal CLK. In the memory controller, the time period from transmission of read command READ until return of the valid data, that is, from the time point t4 to time point t0 is set in advance in the initial state, and after the issuance of read command READ, the returned data is taken after the lapse of the initially set prescribed clock cycle period TA.

Figure 37:
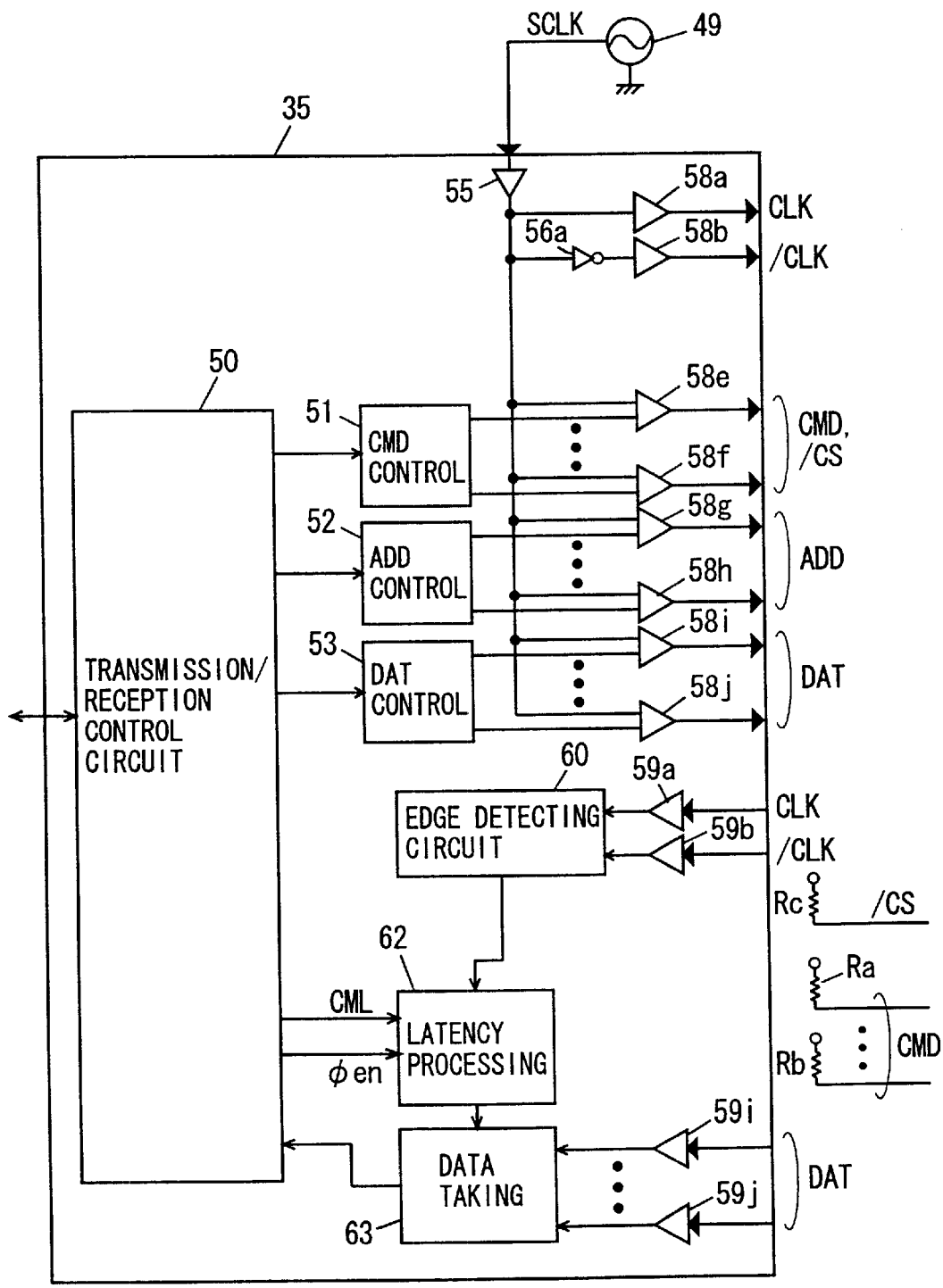
FIG. 37 schematically shows configuration of the memory controller used in the memory system in accordance with the seventh embodiment of the present invention.

FIG. 37 is a schematic diagram representing a configuration of memory controller 35 in accordance with a seventh embodiment of the present invention. Referring to FIG. 37, memory controller 35 differs from the memory controller shown in FIG. 34 in that latency processing circuit 62 generates a data taking signal for setting a timing of taking data in accordance with an enabling signal φen and a command latency designation signal CML from transmission/reception control circuit 50. Except for this point, the configuration is the same as that of the memory controller shown in FIG. 34, and corresponding portions are denoted by the same reference characters. In memory controller 35, chip select signal /CS is not returned, and therefore, the signal line transmitting chip select signal /CS is terminated by a terminating resistance Rc. This prevents reflection of chip select signal /CS at the end of the signal line.

Latency processing circuit 62 is activated in response to activation of enabling signal φen from transmission/reception control circuit 50, performs counting operation in accordance with a clock signal CLKe from edge detecting circuit 60, and when the count value becomes equal to the sum of values of read latency CL and command latency designating signal CML applied from transmission/reception control circuit 50, the latency processing circuit generates a clock signal for taking data.

Figure 38:
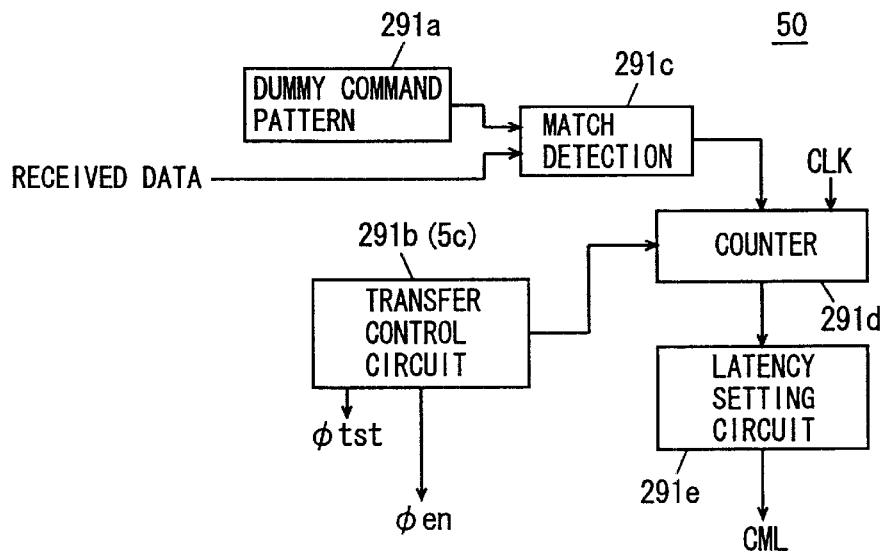
FIG. 38 is a schematic diagram representing a configuration of a latency processing circuit control section of the transmission/reception control circuit shown in FIG. 37.

FIG. 38 is a schematic diagram representing a configuration of a section related to setting of the command latency in the transmission/reception control circuit 50 shown in FIG. 37. Referring to FIG. 38, transmission/reception control circuit 50 includes: a dummy command pattern holding circuit 291a storing a predetermined dummy command bit pattern; a match detecting circuit 291c comparing binary data applied through data taking circuit 63 shown in FIG. 37 with the dummy command pattern stored in dummy command pattern holding circuit 291a, for outputting a signal indicative of the result of comparison; a counter 291d activated in response to an output signal from transfer control circuit 291b for counting the clock signal CLK and stopping counting operation in response to a match detection designation from match detecting circuit 291c : and a latency setting circuit 291e for storing the command latency based on the count value of counter 291d.

Transfer control circuit 291b corresponds to transfer control circuit 5c shown in FIG. 6, and when a command requesting data return is transmitted, the circuit 219b activates enabling signal φen to activate latency processing circuit 62. Dummy command pattern holding circuit 291a stores a predetermined bit pattern. At the time of initialization, under the control of transfer control circuit 291b, the dummy command pattern is transmitted as the dummy command pattern through a data bus. At this time, counter 291d is activated parallel to data transmission, and counter 291d counts both the rising and falling edges of the clock signal CLK. Latency processing circuit 62 generates a taking clock signal constantly in response to activation of initialization designating signal φtst from transfer control circuit 291b, so that data taking circuit 63 performs data taking operation. The data returned from data taking circuit 63 (received data) is applied to match detecting circuit 291c at the falling and rising edges of each clock signal CLK, and the received data pattern is compared with the dummy command pattern. When a match is detected by match detecting circuit 291c, counter 291d stops counting operation. Taking into account the necessary clock cycle period (for example, 1 clock cycle period) from taking of the received data through the data taking circuit until match detection by the match detecting circuit 291c, latency setting circuit 291e calculates the time necessary for the return of the command through the data signal line based on the count value of counter 291d, and sets the command latency. The command latency CML set by latency setting circuit 291e is applied to latency processing circuit 62 shown in FIG. 37. An initial operation in which dummy cycle for each memory chip takes place may be performed at the time of initialization. In the dummy cycle, data is not read, and therefore there is not at all a problem when the dummy command pattern is transferred over the data bus.

Figure 39:
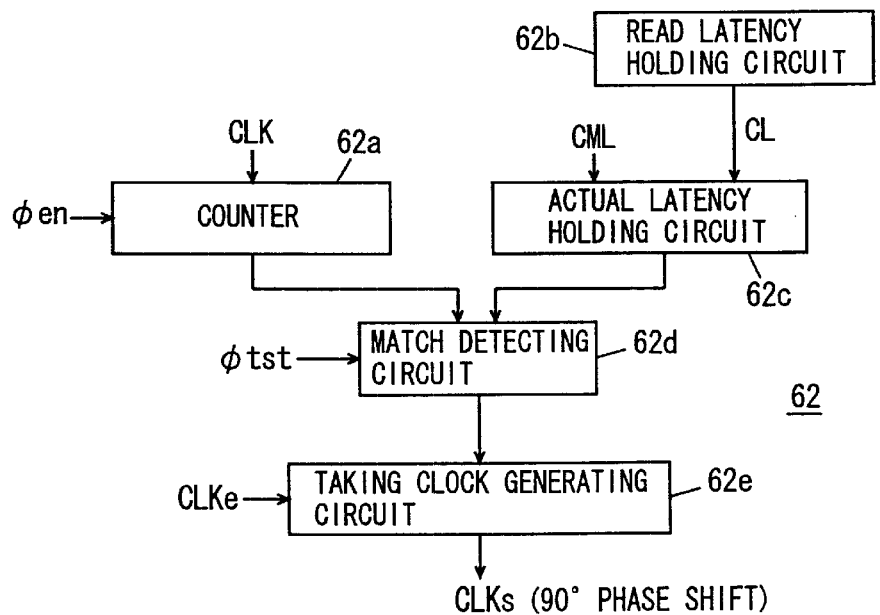
FIG. 39 is a schematic diagram representing a configuration of the latency processing circuit shown in FIG. 37.

FIG. 39 is a schematic diagram representing a configuration of latency processing circuit 62 shown in FIG. 37.

Referring to FIG. 39, latency processing circuit 62 includes: a counter 62a activated in response to an enabling signal φen from transfer control circuit 291b for counting the clock signal CLKe from edge detecting circuit 60; a read latency holding circuit 62b for holding read latency CL; an actual latency holding circuit 62c for holding data indicative of actual latency representing the clock cycle period actually required until the data is transferred back, in accordance with the command latency CML from latency setting circuit 292b and the read latency CL from read latency processing circuit 62b; a match detecting circuit 62d for detecting a match between the count value of counter 62a and the actual latency held in actual latency holding circuit 62c; and a taking clock generating circuit 62e responsive to match detection designation of match detecting circuit 63d for generating the taking clock CLKs in accordance with the clock signal CLKe. Further, match detecting circuit 62a forcefully sets, when the initialization designating signal φtst from transfer control circuit 291b (see FIG. 38) is activated, an output signal therefrom to the match detected state.

In the configuration of latency processing circuit 62 shown in FIG. 39, at the time of initialization, match detecting circuit 62a is always in the match detection designating state. Therefore, taking clock generating circuit 63b generates the taking clock CLKs constantly, so as to cause data taking circuit 62 to perform data taking operation.

In the normal operation mode, when taking of data on the data bus is necessary, transfer control circuit 291b activates the enabling signal φen and in response, counter 62a is activated and executes counting operation. When the count value of counter 62a matches the actual latency data held in actual latency holding circuit 62c, an output signal from match detecting circuit 62a is rendered active, and taking clock generating circuit 62e generates the taking clock signal CLKs. Accordingly, when the period represented by command latency CML has passed, it corresponds to the period in which the command is returned, and hence this is equivalent to the return timing of the chip select signal /CS in the fifth or sixth embodiment described above. Accordingly, by counting the read latency CL from this time point, the read data can surely be taken.

As the clock signal CLK is in synchronization with the data read from the memory chip, taking clock generating circuit 62e generates the taking clock signal CLKs shifted in phase by 90°. Therefore, accurate sampling of read data is possible with the data being in the established state.

Generally, the read latency is initially set in the memory chip at the time of initialization of the memory system, and therefore, read latency CL to be held in read latency holding circuit 62b may be set together at that time.

As described above, according to the seventh embodiment of the present invention, when a command requiring data transfer in the memory controller such as a read command is transmitted, the clock cycle period necessary for data return is detected initially. Therefore, the number of terminals of the memory controller can further be reduced, and the circuit configuration is simplified.

Eighth Embodiment

Figure 40:
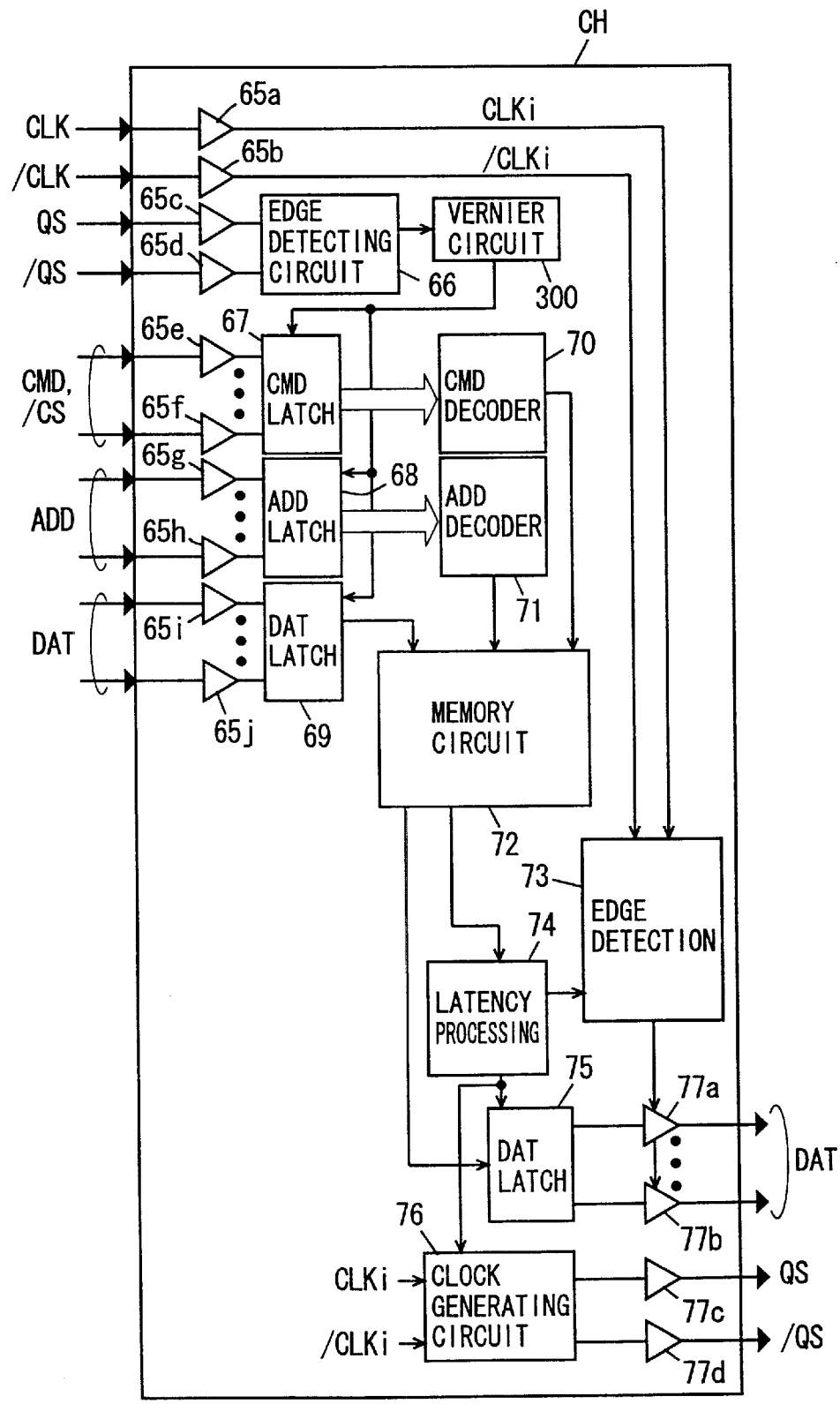
FIG. 40 is a schematic diagram representing a configuration of a memory chip in the memory system in accordance with an eighth embodiment of the present invention.

FIG. 40 is a schematic diagram representing the configuration of a memory chip in accordance with the eighth embodiment of the present invention. Referring to FIG. 40, memory chip CH includes a vernier circuit 300 for delaying a clock signal from edge detecting circuit 66 generating an internal clock signal by detecting edges of the strobe clock signals QS and /QS. A delayed strobe clock signal from vernier circuit 300 is applied to CMD latch 67, ADD latch 68 and DAT latch 69. The structure of memory chip CH shown in FIG. 40 except this point is the same as that of FIG. 17, and corresponding portions are denoted by the same reference characters.

As can be seen from FIG. 40, by setting an amount of delay every memory chip CH using vernier circuit 300, offset among delay times derived from line parasitic capacitance and line resistance of strobe clock signal line, command bus, address bus and data bus is eliminated, and the command CMD, address ADD and data DAT are taken at optimal timings at respective memory chips CH. Therefore, even when there arises a signal propagation delay among memory chips CH dependent on the environment of system assembly including on-board lines, the data and the like can be taken accurately in each memory chip CH.

Figure 41:
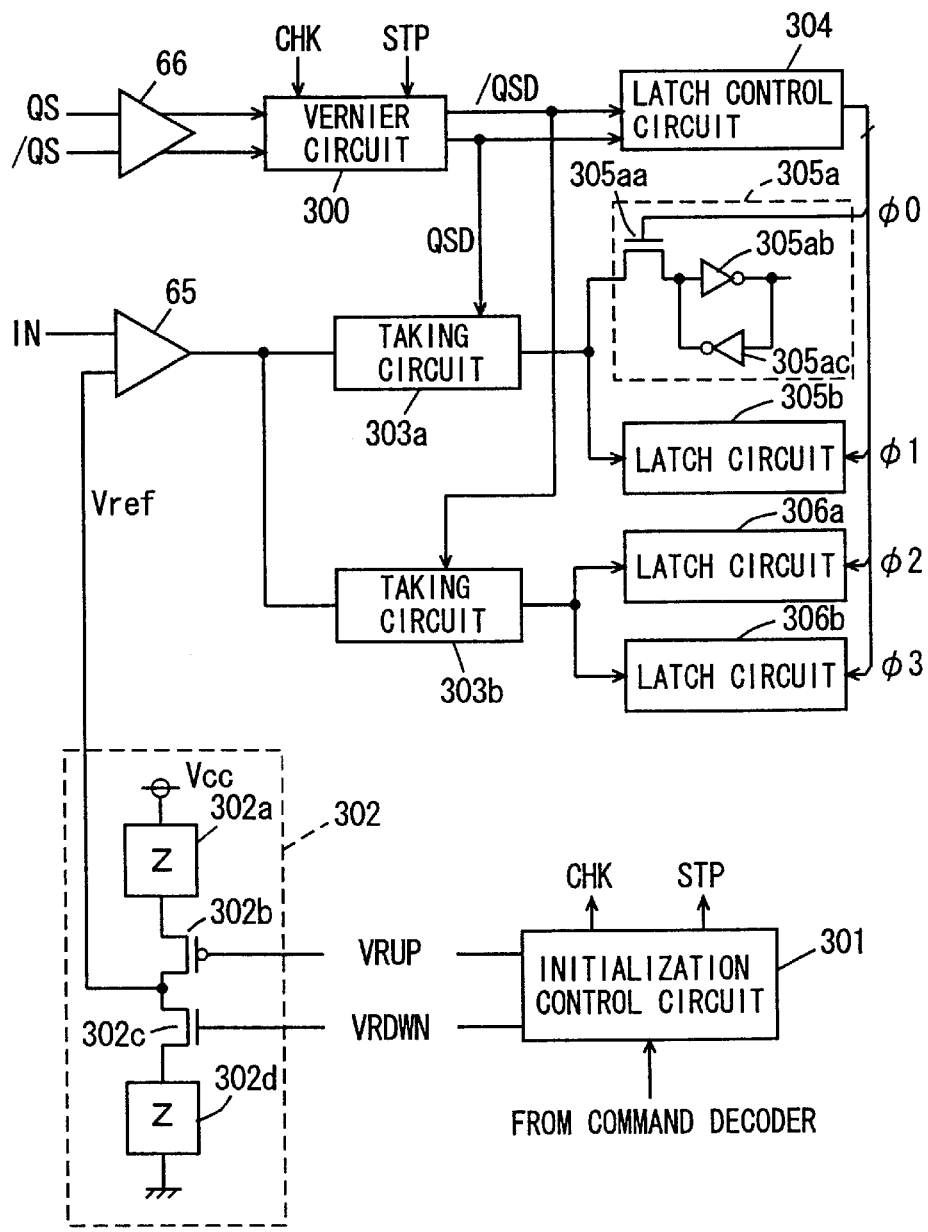
FIG. 41 is a schematic diagram representing configuration of a signal input section of the memory chip shown in FIG. 40.

FIG. 41 more specifically shows the configuration of the signal input section of the memory chip shown in FIG. 40. Referring to FIG. 40, edge detecting circuit 66 is formed by a differential amplifying circuit, which in turn differentially amplifies the strobe clock signals QS and /QS to generate complementary clock signals, which in turn are applied to vernier circuit 300. Vernier circuit 300 enters a vernier check mode in response to a check mode designating signal CHK from an initialization control circuit 301, and in accordance with a vernier amount adjusting signal STP from initialization control circuit 301, adjusts the amount of delay.

FIG. 41 shows a portion of the signal input section which is related to 1 bit of input signal IN. The signal input section includes: a buffer circuit 65 formed by a comparing circuit (differential amplifying circuit) for comparing the input signal IN with a reference voltage Vref from a reference voltage generating circuit 302; taking circuits 303a and 303b for alternately taking output signals from buffer circuit 65 in response to strobe clock signals QSD and /QSD from vernier circuit 300; latch circuits 305a and 305b for alternately latching output signals from taking circuit 303a in response to latch designating signals φ0 and φ2 from latch control circuit 304; and latch circuits 306a and 306b for alternately latching output signals from taking circuit 303b in response to latch designating signals φ1 and φ3 from latch control circuit 304. Latch control circuit 304 generates these latch designating signals φ0 to φ3 in accordance with the strobe clock signals QSD and /QSD from vernier circuit 300. Latch circuits 305a, 305b, 306a and 306b have the same configuration, and FIG. 41 shows the configuration of latch circuit 305a as a representative.

There are four latch circuits 305a, 305b, 306a and 306b, as the command CMD and address ADD are applied in synchronization with the rising and falling edges of the clock signal CLK over 2 clock cycles. The configuration of DAT latch 69 is the same as that shown in FIG. 19. By latch circuits 305a, 305b, 306a and 306b, using a circuit operating at 1 clock cycle period of the clock signal CLK in the memory chip CH, the signals applied at twice the period (doubled frequency) of the clock signal CLK can be taken in and latched.

More specifically, with the signals input at a higher frequency (twice) than the operation frequency of the memory chip, it is possible to take the high speed signals accurately and to perform internal operation. Reference voltage generating circuit 302 includes: a load element (Z) 302a coupled to a power supply node; a p channel MOS transistor 302b connected between load element 302a and an output node and receiving at its gate an up designating signal VRUP from initialization control circuit 301; a load electrode (Z) 302d coupled to a ground node; and an n channel MOS transistor 302c connected between load element 302d and the output node and receiving at its gate a down designating signal VRDWN from initialization control circuit 301. Reference voltage generating circuit 302 adjusts the voltage level of reference voltage Vref in accordance with the designating signals VRUP and VRDWN.

Initialization control circuit 301 activates designating signals VRUP and VRDWN in accordance with an initialization designating command and a vernier adjusting command applied from the command decoder, and activates a check mode designating signal CHP and a vernier setting signal STP.

Taking circuit 303a performs taking operation complementarily to the latching operation of latch circuits 305a and 305b, and taking circuit 303b performs taking operation complementarily to the latching operation of latch circuits 306a and 306b (see the operation of the data input circuit shown in FIG. 19).

As the voltage level of reference voltage Vref from reference voltage generating circuit 302 is changed so as to adjust the timing of taking the output signal of input buffer 65, it becomes possible to take the input signal with a large margin in the normal operation mode, and therefore the operation can be stabilized.

FIGS. 42A and 42B schematically show the margin of the input signal in the normal operation mode. In FIGS. 42A and 42B, data DQ represents the input signal. Vernier circuit 300 delays strobe clock signals QS and /QS from edge detecting circuit 66 to generate internal strobe clock signals QSD and /QSD. Taking circuits 303a and 303b take applied signals in accordance with the strobe clock signals QSD and /QSD. Data DQ is sent out from the memory controller in synchronization with the strobe clock signals QS and /QS. By delaying the strobe clock signal in vernier circuit 300, it becomes possible to take the data DQ with a margin represented by the symbol ○ with respect to the reference voltage Vref. If the margin represented by the symbol ○ is sufficiently large, the data can be taken accurately without any influence of noise. The same applies to other commands and addresses. In order to ensure as large the margin as possible, the voltage level of the reference voltage Vref is changed as shown in FIG. 42B in the initialization mode. In the example shown in FIG. 42B, the voltage level of reference voltage Vref is increased, so as to set the margin for H (high) level. Here, the voltage level of reference voltage Vref is increased, so as to reduce the margin with respect to the data DQ. At the same time, the delay amount of vernier circuit 300 is enlarged, so as to increase the amount of delay for the strobe clock signals QSD and /QSD. The delay amount of vernier circuit 300 is set such that the timings of the strobe clock signals QSD and /QSD provides a margin represented a small circle (○).

The timing adjustment (adjustment of delay amount of vernier circuit 300) is also performed for L level data, with the reference voltage Vref decreased, as represented by the dotted line.

In the normal operation mode, the reference voltage Vref is set at an intermediate level between the H and L levels of the data DQ. Therefore, in the normal operation mode, the margin for the data DQ comes to have such a size that is represented by the large circle (○), and therefore data can be input stably, not influenced by the noise. This is the same not only to the data DQ but also to other commands CMD and addresses ADD. The operation of setting the vernier amount of vernier circuit 300 will be briefly described with reference to the flow chart of FIG. 43.

First, for a specific memory chip, an initialization command is applied from the memory controller. The memory chip initializes the reference voltage Vref and the vernier in accordance with the initialization command (step S1). Thereafter, a write command is applied from the memory controller, and data having a pattern of 1010 . . . is written (step S2). Then, the written data is read, and in the memory controller, whether the read data pattern matches an expected value pattern (1010 . . . ) is determined (step S4). If the patterns do not match, it means that accurate data reading failed, that is, strobe timing is not correct (any of command, address and data), and therefore the amount of delay of the vernier circuit 300 is incremented (step S5). After the delay amount is incremented, the flow again returns to step S2, and the steps of data writing and reading are repeated.

In step S4, if the read data pattern matches the expected value pattern, and when a plurality of reference voltages are used, whether the reference voltage Vref is at the maximum voltage level or not is determined (step S6). If the reference voltage Vref is not at the maximum voltage level, the voltage level of the reference voltage Vref is updated (step S7). By the update of the reference voltage Vref, the margin is made smaller, and data writing, reading and determination of pattern matching are performed again. If it is determined in step S6 that the reference voltage Vref is the maximum, it means that accurate writing/reading of data is being performed with the minimum margin, and therefore the delay amount in this state is set in the vernier circuit 300.

Figure 43:
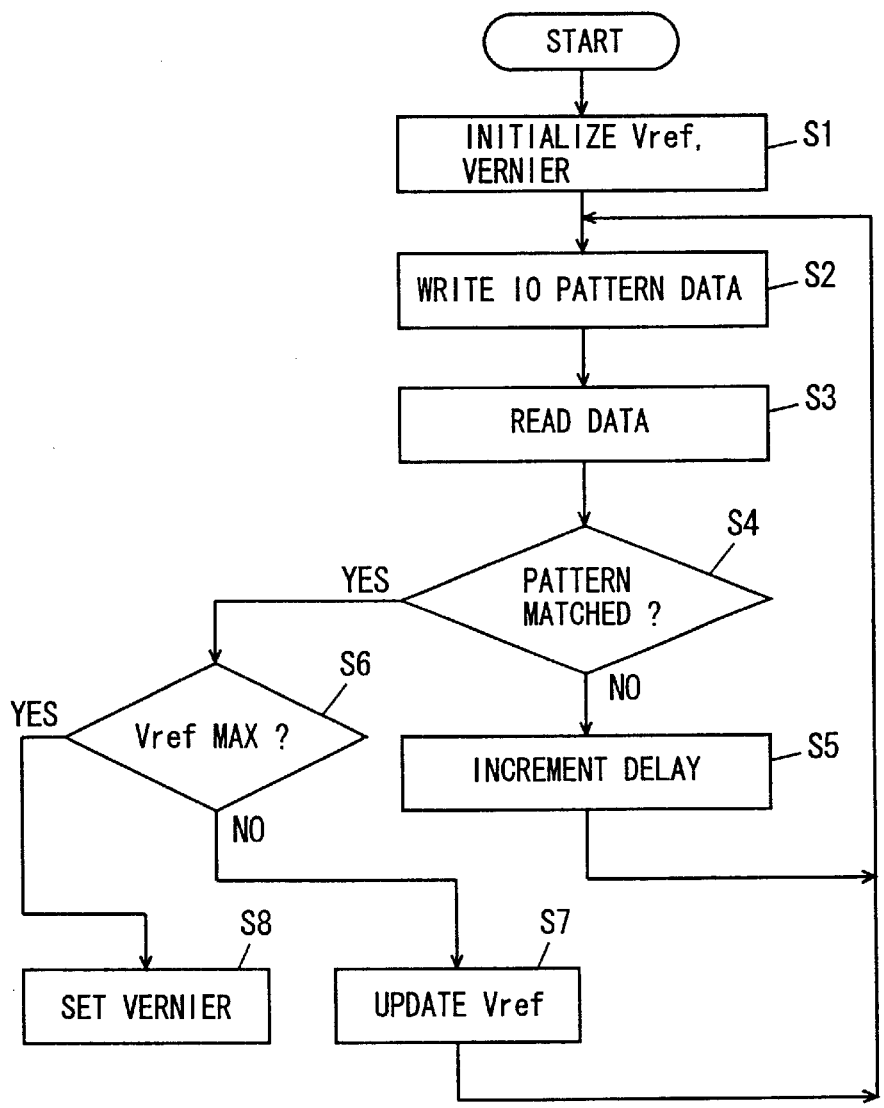
FIG. 43 is a flow chart of a vernier circuit adjusting operation by the circuit shown in FIG. 41.

The flow of operation shown in FIG. 43 is executed for the H level data and L level data. More specifically, margin test is performed with the voltage level of reference voltage Vref increased and decreased. Such operation is performed for each of the memory chip used in the memory system. Accordingly, it becomes possible for each memory chip to take the applied signal with large margin in the normal operation mode (as the reference voltage Vref is set at the intermediate voltage level in the normal operation mode).

Accordingly, when the strobe clock signals QS and /QS, command CMD, address ADD and data DAT are transmitted at accurate timings from the memory controller, it is possible for each memory chip CH to take signals at optimal timings, even when there is skew because of different propagation delay among signal lines.

In FIGS. 41, 42A and 42B, the margin is set with respect to data DQ. The margin is similarly set for the command CMD and the address ADD. If the margin for the command CMD is not good, data writing/reading is not performed in the first step, and therefore the read data pattern does not match. Therefore, the strobe timing is delayed so that the command is taken and the data writing/reading is performed. Therefore, by the flow of operation shown in FIG. 43, it is possible to simultaneously set margins for the command CMD, address ADD and data DAT.

Figure 44A:
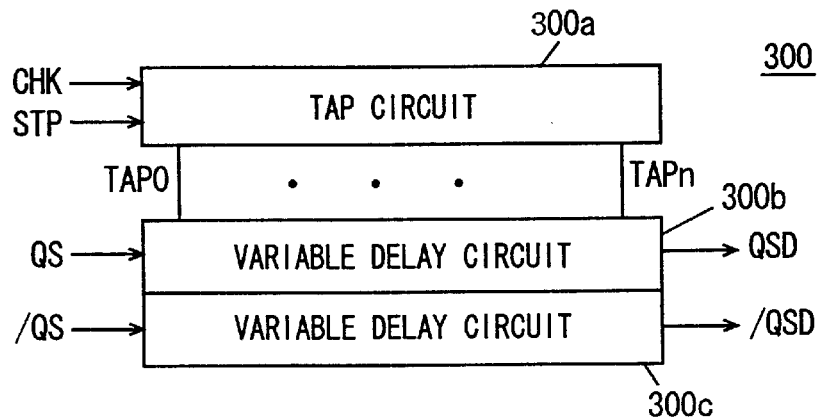
FIG. 44A is a schematic diagram representing configuration of the vernier circuit shown in FIG. 41.

FIG. 44 is a schematic diagram representing the configuration of vernier circuit 300 shown in FIG. 41. Referring to FIG. 44A, vernier circuit 300 includes a tap circuit 300a performing a shifting operation in response to check mode designating signal CHK and delay increment designating signal STP for generating tap signals TAP0 to TAPn, and variable delay circuits 300b and 300c, of which amounts of delay are set by tap signals TAP0 to TAPn from tap circuit 300a, for delaying strobe clock signals QS and /QS to generate internal strobe timing clock signals QSD and /QSD, respectively. Strobe clock signals QS and /QS are applied from edge detecting circuit 66 shown in FIG. 40.

Tap circuit 300a is enabled when check mode designating signal CHK is active, and the tap value thereof is changed by shifting operation in accordance with delay increment designating signal STP.

Figure 44B:
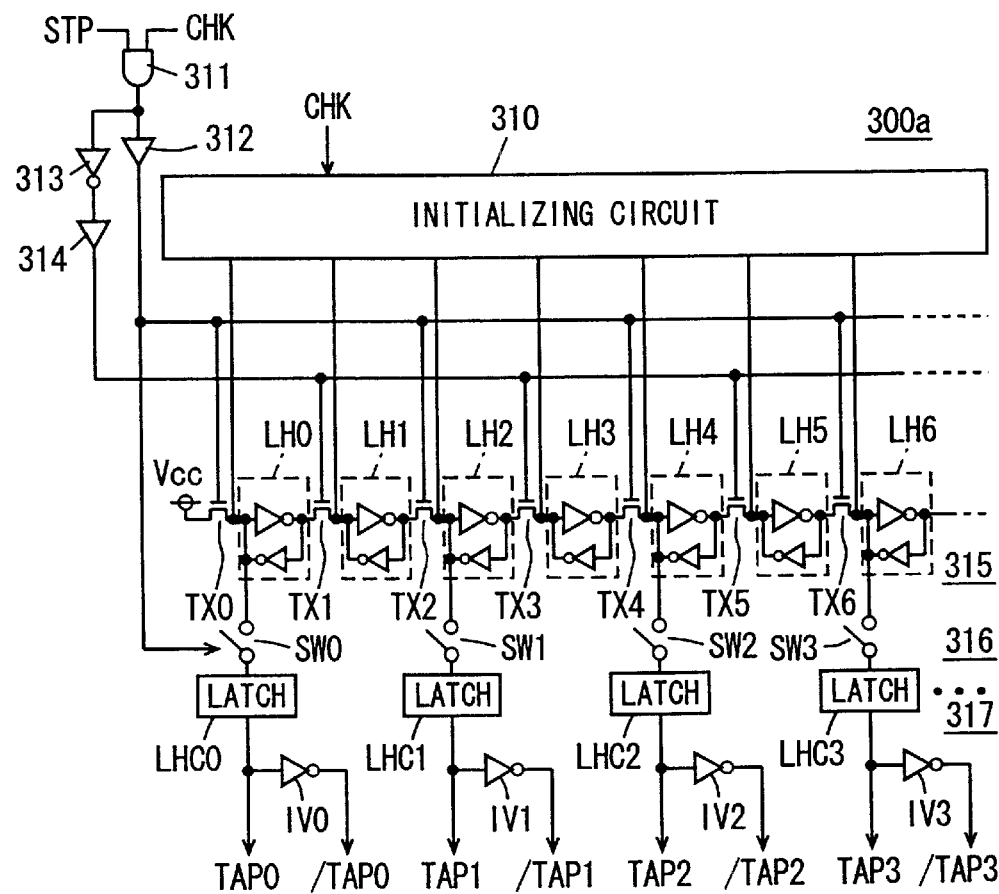
FIG. 44B shows in greater detail the configuration of a tap circuit shown in FIG. 44A.

FIG. 44B is a schematic diagram representing the configuration of tap circuit 300a of FIG. 44. Referring to FIG. 44B, tap circuit 300a includes: an AND circuit 311 receiving check mode designating signal CHK and delay increment designating signal STP; a drive circuit 312 receiving an output signal of AND circuit 311; an inverter 313 receiving an output signal from AND circuit 311; a drive circuit 314 receiving an output signal of inverter 313; a shift register circuit 315 performing a shifting operation in accordance with output signals from drive circuits 312 and 314; an initializing circuit 310 for initializing an internal node of shift register circuit 315 in response to activation of check mode designating signal CHK; a switch circuit 316 allowing passage of an output signal from shift register circuit 315 in accordance with an output signal from drive circuit 312; and a latch circuit 317 for latching a signal applied through switch circuit 316.

Shift register 315 includes a plurality of latch circuits LH0 to LH6 . . . , transfer gates TX1 to TX6 connected between respective latch circuits LH0 to LH6, and a transfer gate TX0 for transmitting a power supply voltage Vcc to latch LH0 in accordance with the output signal from drive circuits 312. Transfer gates TX1, TX3 and TX5 receive the output signal from drive circuit 314 at their gates, and transfer gates TX0, TX2, TX4, TX6, . . . receive the output signal of drive circuit 312 at their gates. Latches LH0 and LH1 constitute a register circuit, latches LH2 and LH3 constitute one stage of shift register circuit, latches LH4 and LH5 constitute one stage of shift register circuit, and latch LH6 and latch LH7, not shown, constitute one stage of shift register. When the output signal of drive circuit 314 attains to the H level, the shift registers 315 transfer data internally, and in accordance with the output signal from drive circuit 312, the latched signal is transferred to an adjacent register stage.

Switch circuit 316 includes switching elements SW0, SW1, SW2, SW3, . . . provided at inputs of latches LH0, LH2, LH4 and LH6, respectively. The switching elements SW0 to SW3 are rendered conductive when the output signal from drive circuit 312 attains to the H level, and transmits the latch signal of latch circuit 315.

Latch circuit 317 includes latches LHC0 to LHC3 provided corresponding to switching element SW0 to SW3, and inverters IV0 to IV3 inverting output signals of latches LHC0 to LHC3. Tap signals TAP0 to TAP3 are output from latches LHC0 to LHC3, and tap signals /TAP0 to/TAP3 are output from inverters IV0 to IV3.

In tap circuit 300a shown in FIG. 44B, in the check mode, initializing circuit 310 initializes input nodes of latches LH0 to LH6 to the level of the ground voltage. When delay increment designating signal STP is activated, the output signal of drive circuit 312 attains to the L level, transfer gates TX0, TX2, TX4, TX6, . . . are rendered conductive, and the latch signal is transferred to the input of the adjacent shift register stage. In the first state, the output signal of latch LH0 is at the H level and output signals of remaining latches LH1 to LH6 are at the L level. When data transfer among the registers in shift register circuit 315 is completed, the output signal of drive circuit 312 attains to the L level, and thereafter the output signal of drive circuit 314 attains to the H level, and the taken signal is transferred in the register stage.

Switch circuit 316 is rendered conductive in synchronization with the transfer operation among registers in the shift register circuit 315, latches LHC0 to LHC3 latch the data from the transfer circuit, and tap signals TAP0, /TAP0 to TAP3, /TAP3 are generated. By driving the increment designating signal STP to the H level, the shifting operation in shift register circuit 315 takes place, and the number of tap signals which attain to the H level increases. In the initial state, only the tap signal TAP0 is at the H level and, in the next state, tap signals TAP0 and TAP1 attain to the H level. In this manner, the amounts of delay in variable delay circuits 300b and 300c are increased.

Figure 45:
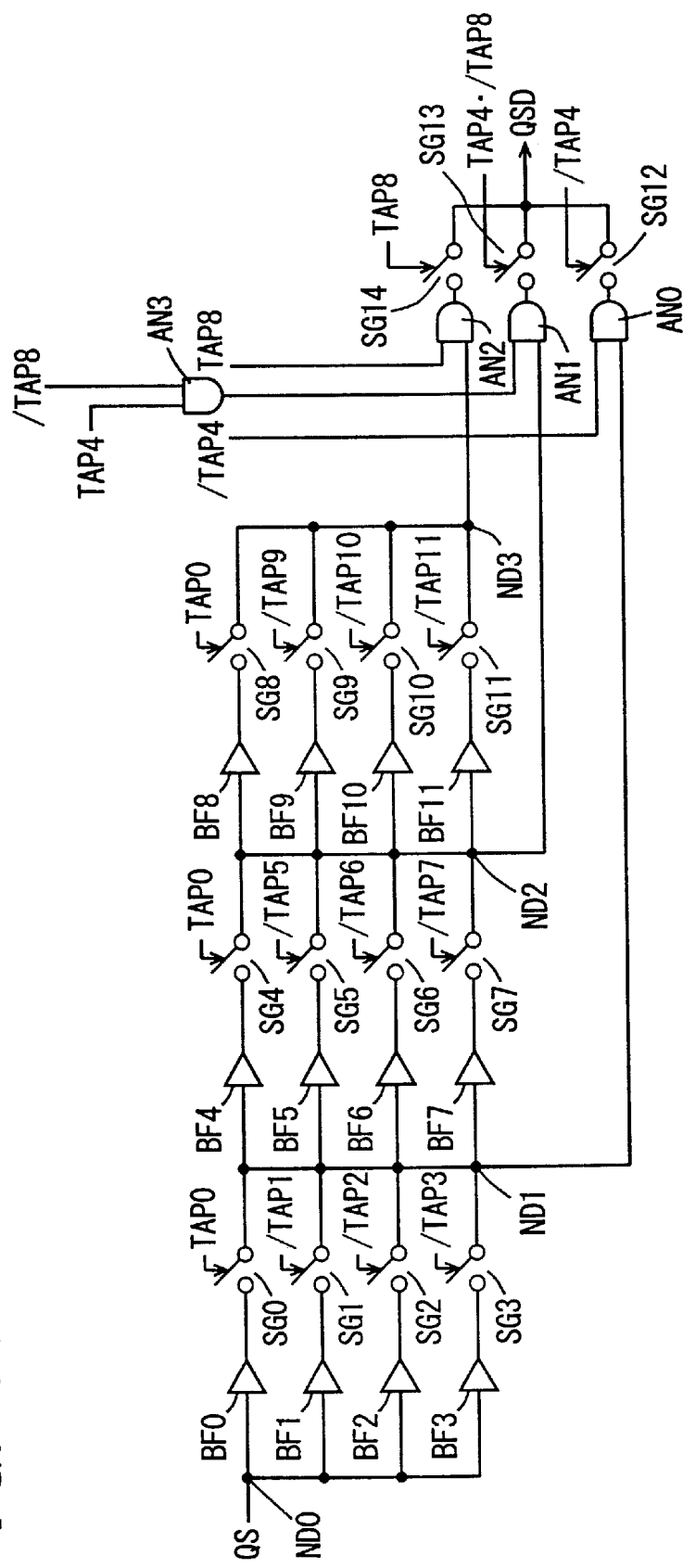
FIG. 45 is a circuit diagram representing a configuration of a variable delay circuit shown in FIG. 44A.

FIG. 45 is a schematic diagram representing configurations of variable delay circuits 300b and 300c shown in FIG. 44A. As variable delay circuits 300b and 300c have the same configuration, one variable delay circuit is shown as a representative in FIG. 45.

Referring to FIG. 45, the variable delay circuit includes buffer circuits BF0 to BF3 connected in parallel to node ND0, and switch circuits SG0 to SG3 provided corresponding to buffers BF0 to BF3, respectively. Switch circuits SG0 to SG3 receive tap signals TAP0, /TAP1, /TAP2 and /TAP3 at respective gates. The switch circuits SG0 to SG3 connect the corresponding buffer circuits BF0 to BF3 to internal node ND1 when conducted. When switch circuits SG0 to SG3 are conductive, outputs of buffer circuits BF0 to BF3 are wired OR connected to node ND1.

The variable delay circuit further includes buffer circuits BF4 to BF7 connected in parallel to node ND1, buffer circuits BF8 to BF11 connected in parallel to node ND2, switch circuits SG4 to SG7 provided corresponding to buffer circuits BF4 to BF7, respectively, and switch circuits SG8 to SG11 provided corresponding to buffer circuits BF8 to BF11, respectively. Switch circuits SG4 and SG8 receive tap signal TAP0. Switch circuits SG5 to SG7 receive tap signals /TAP5, /TAP6 and /TAP7 at respective control nodes. Switch circuits SG9 to SG11 receive tap signals /TAP9 to /TAP11 at respective control nodes. When switch circuits SG4 to SG7 are conductive, buffer circuits BF4 to BF7 are wired OR connected to node ND2, and when switch circuits SG8 to SG11 are conductive, buffer circuits BF8 to BF11 are wired OR connected to node ND3.

The variable delay circuit further includes: an AND circuit AN3 receiving tap signals TAP4 and /TAP8; an AND circuit AN0 receiving a signal at node ND1 and tap signal /TAP4; an AND circuit AN1 receiving a signal at node ND and an output signal from AND circuit AN3; an AND circuit AN2 receiving a signal at node ND3 and tap signal TAP8; a switch circuit SG12 rendered conductive when tap signal /TAP4 is at the H level for transmitting an output signal from AND circuit AN0 to the output node; an switch circuit SG13 rendered conductive when an output signal of AND circuit AN3 (TAP4·/TAP8) is at the H level for transmitting an output signal of AND circuit AN1 to the output node; and a switch circuit SG14 rendered conductive when tap signal TAP8 is at the H level for transmitting an output signal of AND circuit AN2 to the output node.

As can be seen from FIG. 44B, tap circuit 30a increments the number of tap signals which attain to the H level every time the increment designating signal STP is activated. At the time of initialization, tap signal TAP0 is at the H level. Other tap signals TAP1 to TAP1 are at the L level, and therefore tap signals /TAP1 to /TAP11 are all at the H level. Therefore, in the initial state, switch circuits SG0 to SG11 are conductive, output signals from buffer circuits BF0 to BG3 are transmitted in parallel to node ND1, the output signal of buffer circuit BF4 is transmitted in parallel to node ND2, and output signals of buffer circuits BF8 to BF11 are connected in parallel to node ND3. In this state, the output signal of AND circuit AN3 is at the L level and the tap signal TAP8 is also at the L level. Therefore, AND circuit AN0 is enabled, switch SG12 is rendered conductive, the signal at node ND1 is transmitted and the clock signal QSD is generated. In this state, node ND1 is driven by four buffer circuits BF0 to BF3, and therefore the delay time of strobe clock signals QSD is determined in accordance with the output signals from buffer circuits BF0 to BF3. Here, buffer circuits BF0 to BF3 are wired OR connected to node ND1, and therefore the delay time is the shortest.

When the increment designating signal STP is activated, a shifting operation takes place in the tap circuit shown in FIG. 44B, and tap signals TAP0 and TAP1 both attain to the H level. In response, tap signal /TAP1 attains to the L level, and switch circuit SG1 is rendered non-conductive. In this state, node ND1 is driven by buffer circuits BF0, BF2 and BF3, and therefore, the delay time is made longer.

Thereafter, when increment designating signal STP attains to the H level and tap signals TAP0 to TAP2 attain to the H level, switch circuits SG1 and SG2 are rendered non-conductive, and node ND1 is driven by buffer circuits BF0 and BF3, and therefore, the delay time is made still longer. Further, when increment designating signal STP attains to the H level, tap signals TAP0 to TAP3 attain to the H level. Therefore, in this state, switch circuits SG1 to SG3 are rendered non-conductive, and node ND1 is driven by buffer circuit BF0. Therefore, the delay period is determined by the delay time of buffer circuit BF0.

When the delaying operation proceeds and tap signals TAP0 to TAP4 attain to the H level, the complementary tap signal /TAP4 attains to the L level, the output signal of AND circuit AN0 attains to the L level, and switch circuit SG12 is rendered non-conductive. In this state, tap signals /TAP5 to /TAP7 are at the H level, and therefore node ND2 is driven by buffer circuits BF0 and BF4 to BF7, and the delay time thereof becomes longer than the delay time provided by buffer circuit BF0.

Thereafter, through similar operations, when tap signals TAP0 to /TAP7 attain to the H level, switch circuits SG5 to SG7 are rendered non-conductive, and node ND2 comes to be driven by buffer circuits BF0 and BF4. Therefore, the delay time of strobe clock signal QSD is determined by the delay times of buffer circuits BF0 and BF4 (not considering propagation delay in AND circuit AN1 and switch circuit SG2).

When the delay incrementing operation further proceeds and tap signal TAP8 attains to the H level, the complementary tap signal /TAP8 attains to the L level, the output signal of AND circuit AN3 attains to the L level, and switch circuit SG12 is rendered non-conductive. AND circuit AN2 is enabled, and in accordance with the signal at node ND3, the AND circuit AN2 generates the strobe clock signal QSD through switching circuit SG13. When the tap signal TAP8 is at the H level, strobe clock signal QS is transmitted to node ND2 through buffer circuits BF0 and BF4, and the signal at node ND2 is driven by buffer circuits BF8 to BF11 and transmitted to node ND3. Therefore, delay times of buffer circuits BF8 to BF11 are further added. In this state, the switch circuit SG14 is made conductive.

When tap signal TAP9 attains to the H level, switch circuit SG9 is rendered non-conductive, the number of buffer circuits driving node ND3 is reduced and delay time is increased. When tap signals TAP0 to TAP11 all attain to the H level finally, switch circuits SG9 to SG11 are rendered non-conductive, and node ND3 comes to be driven by buffer circuits BF0, BF4 and BF8. In this state, the delay time is the longest.

By the variable delay circuit shown in FIG. 45, it is possible to adjust the delay time in accordance with the tap signal output from the tap circuit.

The number of tap signals is not limited to that shown in FIG. 45 and the number may be appropriately determined dependent on the delay time as needed. Further, the number of buffer circuits connected in parallel between the nodes in the variable delay circuit may be arbitrarily selected.
Modification In the flow of operation shown in FIG. 43, the delay time when taking of data is stopped is set in the vernier by changing the level of reference voltage Vref. In the configuration shown in FIG. 43, a time period of one half of the sum of the delay time at the start of pattern matching and the delay time at the end of pattern matching may be set as the delay amount of the vernier.

Figure 46:
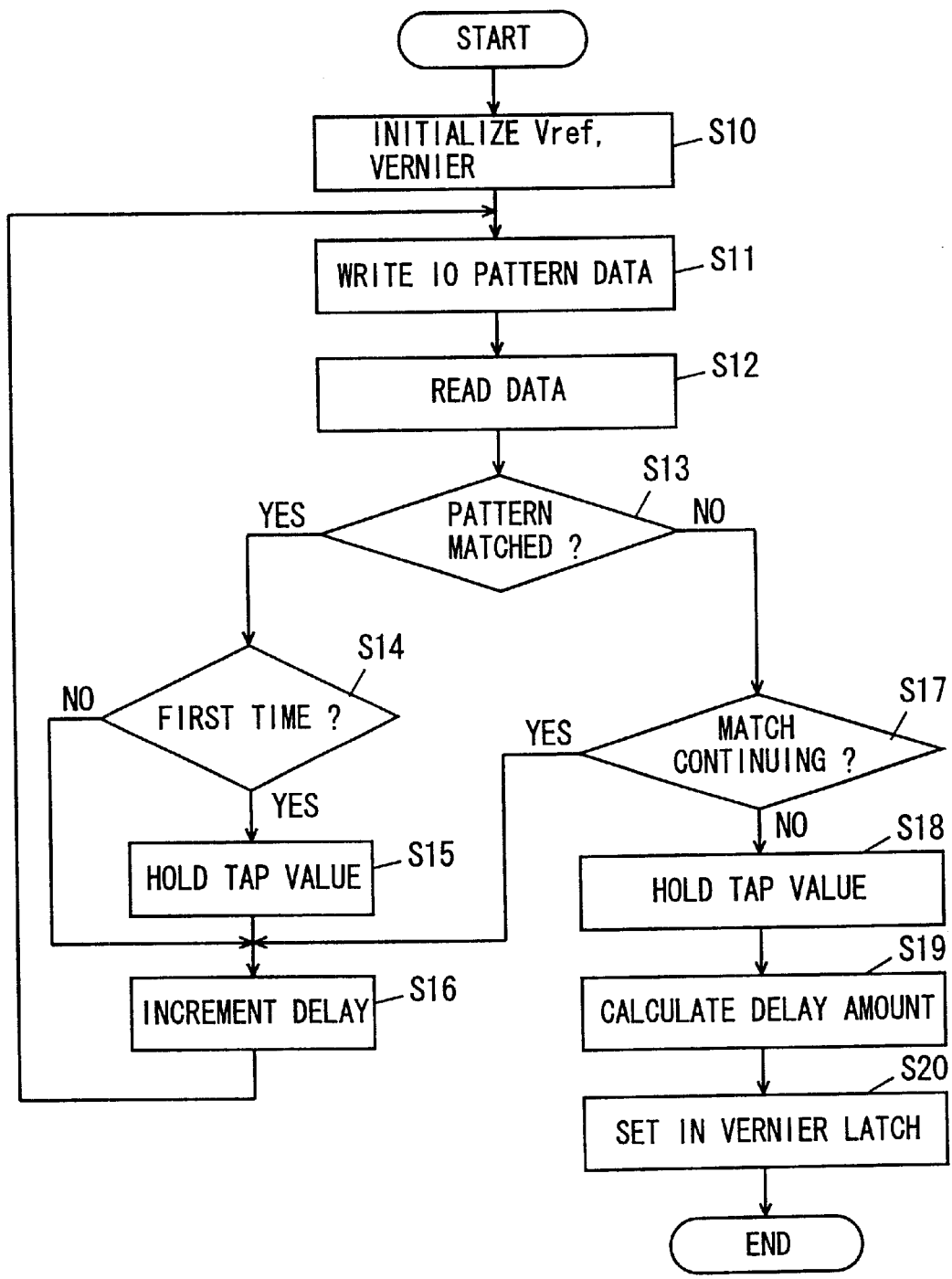
FIG. 46 is a flow chart of an operation by the circuits shown in FIGS. 44A, 44B and 45.

FIG. 46 is a modification of the flow for setting the delay amount in the memory chip in accordance with the seventh embodiment of the present invention. Referring to FIG. 46, the level of the reference voltage is only one. The minimum margin is determined previously, and the voltage level of reference voltage Vref is determined to ensure the margin.

Referring to FIG. 46, when an initialization command is applied, the reference voltage Vref and the vernier circuit are initialized (step S10). At the time of initialization, reference voltage Vref is changed to a predetermined voltage level (here, it is assumed that the reference voltage Vref has one level). At the time of initialization of the vernier circuit, the tap signal TAP0 shown in FIG. 45 is set to the H level, and other tap signals TAP1 to TAP11 are held at the L level.

Thereafter, data having the pattern of 10 . . . is written (step S11). After the writing is completed, data is read (step S12). After the data reading, in the memory controller, whether the read data pattern is the same as the written data pattern (1010 . . . ) is determined (step S13). Whether accurate data writing/reading has been done for the first time is determined in the memory controller if the patterns match (step S 14). When pattern matching is detected for the first time, an instruction is issued to the memory chip to hold the tap value at this time (through a command). In the memory chip, the tap value held in the latch is saved in accordance with the tap holding command (step S15). At this time, a command for incrementing delay is applied from the memory controller, the increment designating signal STP is activated, and the delay amount is incremented (step S16). Thereafter, the flow again returns to step S11, and the steps following the step S11 for writing data having the pattern 1010 . . . in accordance with the write command from the memory controller are repeated.

When matching of patterns is detected continuously, it means that accurate data writing/reading is done, and therefore the memory controller simply applies a command for incrementing delay to the memory chip (step S16).

If matching between patterns is not detected in step S13, it is determined whether pattern mismatch has been detected continuously (step S17). If pattern mismatch continues, it means that the accurate data writing/reading has not yet been done, and therefore the strobe timing is not good. Therefore, here, the memory controller simply applies a command for incrementing delay (step S16). Thereafter, operations following the step S11 are repeated.

If it is determined in step S17 that mismatch is not continuous, it means that the state of matching between patterns is lost and the patterns no longer match. Therefore, if the delay time is further incremented, the result is only the mismatch between patterns. Therefore, in this state, the tap value at this time is held, and a command for calculating the amount of delay is applied (steps S18 and S19). When the delay amount calculating command is applied, in the memory chip, the delay time of the vernier circuit is calculated based on an average value between the first tap value saved in step S15 and the tap value obtained in step S18, and the calculated delay time is set in the latch circuit (step S20). This operation is performed simply by setting to the H level the tap signals up to that tap number which has the arithmetic average value between the largest number of tap signals at the H level in step S15 and the largest number of the tap signals in step S18.

By the operation shown in FIG. 46, it becomes possible to set the strobe timing at such timing that has the largest margin.

In the configuration shown in FIG. 41, reference voltage generating circuit 102 is provided in the memory chip. The reference voltage generating circuit 42, however, may be provided in the controller, and the reference voltage may be supplied commonly to the memory chips from the memory controller.

In the above described manner, signals (command, address and data) can be taken at optimal timings into the memory chip.

Figure 47:
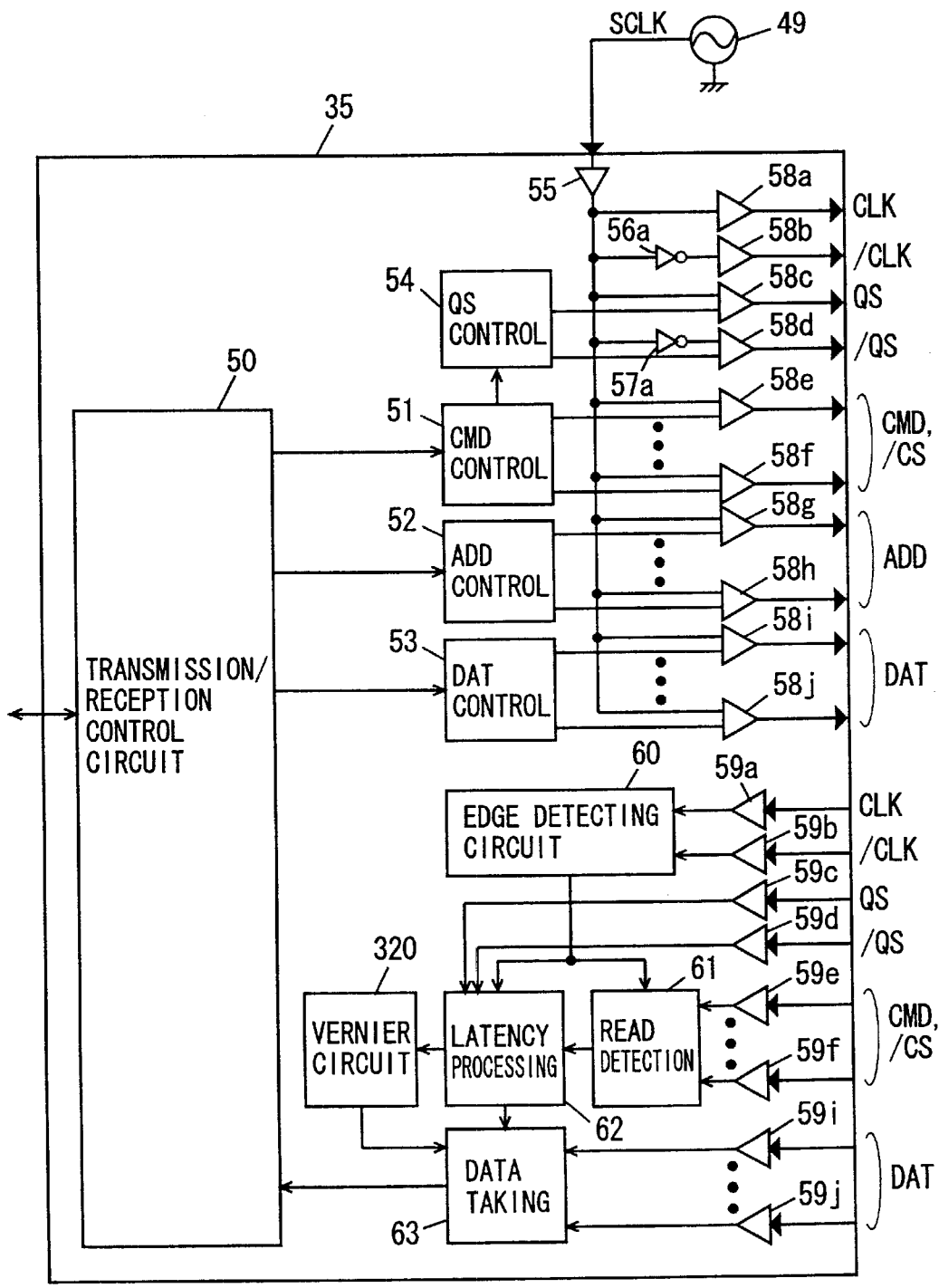
FIG. 47 is a schematic diagram representing a configuration of the memory controller used in the memory system in accordance with the seventh embodiment of the present invention.

FIG. 47 is a schematic diagram representing a configuration of memory controller 35 in accordance with the seventh embodiment of the present invention. The memory controller shown in FIG. 47 differs from the memory controller shown in FIG. 16 in the following points. Namely, to the data taking circuit 63, the taking clock signal is applied through a vernier circuit 320 which delays an output clock signal of latency processing circuit 62. Except for this point, the configuration is the same as that shown in FIG. 16, and corresponding portions are denoted by the same reference characters.

In memory controller 35 shown in FIG. 47, the taking timing in data taking circuit 63 is adjusted in accordance with phase difference between data DAT and strobe clock signals QS and /QS.

As to the vernier circuit 320, phase difference at the time of return between data DAT and strobe clock signals QS and /QS transmitted through the transmission path may be calculated simply and the delay time may be set based on the phase difference in vernier circuit 320 commonly for the memory chips. More specifically, phase difference between the data DAT and strobe clock signals QS and /QS on the transmission line represents the maximum value of phase difference between the data read from the memory chip and the strobe clock signal QS. Therefore, when the maximum delay time is set in the vernier circuit 320, accurate data taking is possible for the memory chips.

Further, the phase difference between the data DAT and strobe clock signals QS and /QS for each of the memory chips may be detected in the initial mode, and based on the phase difference in the worst case, the delay amount of vernier circuit 320 may be set.

Figure 48:
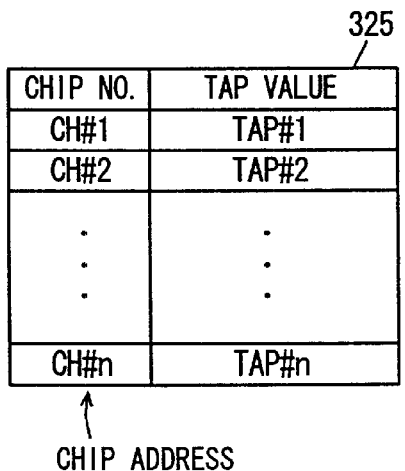
FIG. 48 is a schematic diagram representing a configuration of a memory circuit for setting an amount of delay in the vernier circuit shown in FIG. 47.

Further, as shown in FIG. 48, the delay amount of vernier circuit may be set for each of the memory chips in transmission/reception control circuit 50.

Referring to FIG. 48, transmission/reception control circuit 50 includes a memory circuit 325 storing tap values TAP#1 to TAP#n corresponding to chip numbers CH#1 to CH#n. Chip numbers CH#1 to CH#n are determined by the addresses of respective chips in the memory system. Tap value data TAP#1 to TAP#n are calculated by reading tap value information stored in the memory chips respectively, and based on the input tap value information. Reading of the tap information from respective memory chips is performed by applying a specific command from the memory controller to respective memory chips.

Figure 49:
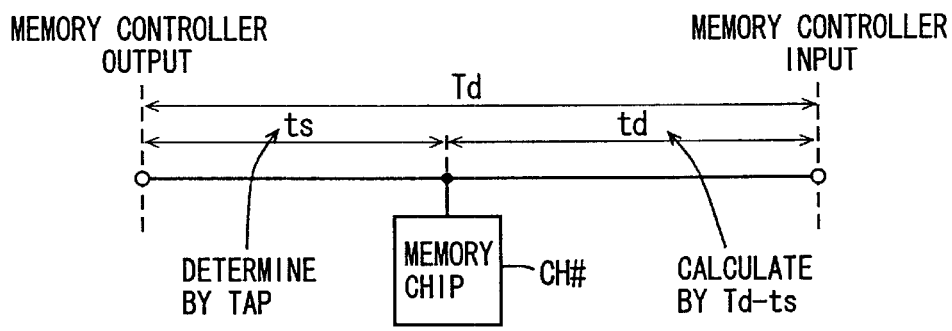
FIG. 49 is an illustration related to a method of calculating a tap value shown in FIG. 48.

FIG. 49 is a schematic diagram representing a configuration for calculating tap values TAP#1 to TAP#n. FIG. 49 shows one memory chip CH#0 among the memory chips as a representative. Memory chip CH#0 stores a tap value TAP (tap signals TAP0 to TAP11 of FIG. 45) as a timing delay value at the time of taking signals. The tap value information corresponds to phase difference between data DAT and strobe clock signal QS in memory chip CH#. In the memory controller, phase difference (delay time) Td between the strobe clock signal QS and data DAT on the transmission line of the memory system is detected and stored. The memory controller reads the tap information TAP from memory chip CH#, and calculates the phase difference between the strobe clock signal QS and data DAT from the memory chip CH# to the input section of the memory controller. This is calculated simply by subtracting delay time ts of memory chip CH# from the entire delay time Td.

Figure 50:
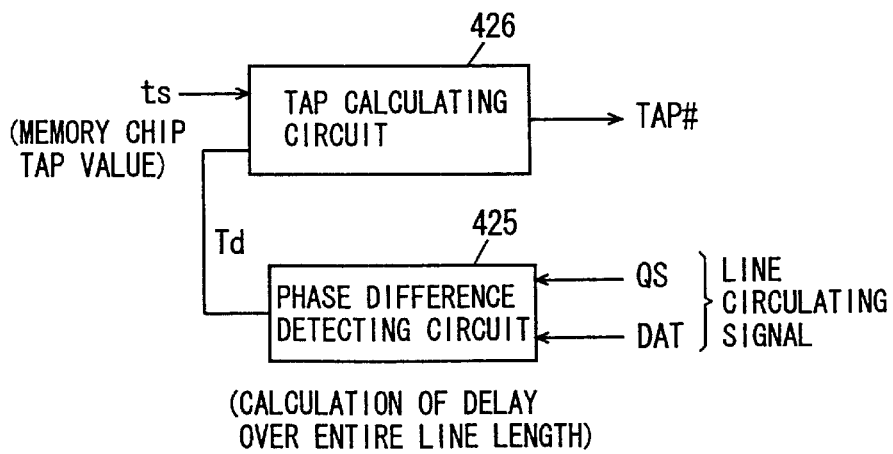
FIG. 50 is a schematic diagram representing the tap value calculating circuit shown in FIG. 48.

FIG. 50 is a schematic diagram representing a configuration of the tap calculating section included in the memory controller. Referring to FIG. 50, the tap calculating section includes a phase difference detecting circuit 425 receiving the data DAT and the strobe clock signal QS transmitted from the output section of the memory controller for detecting phase difference between the strobe clock signal QS and data DAT, and a tap calculating circuit 426 for calculating the tap value TAP# for each memory chip based on the detected phase difference (Td) of phase difference detecting circuit 425 and the delay time (tap value of memory chip) ts of the memory chip, and storing the calculated tap value in a storing circuit 325. Phase difference detecting circuit 425 detects phase difference between the data DAT and strobe clock signal QS circulating the line on the memory system. Thus, the delay time over the entire line length of the memory system is calculated.

Figure 51:
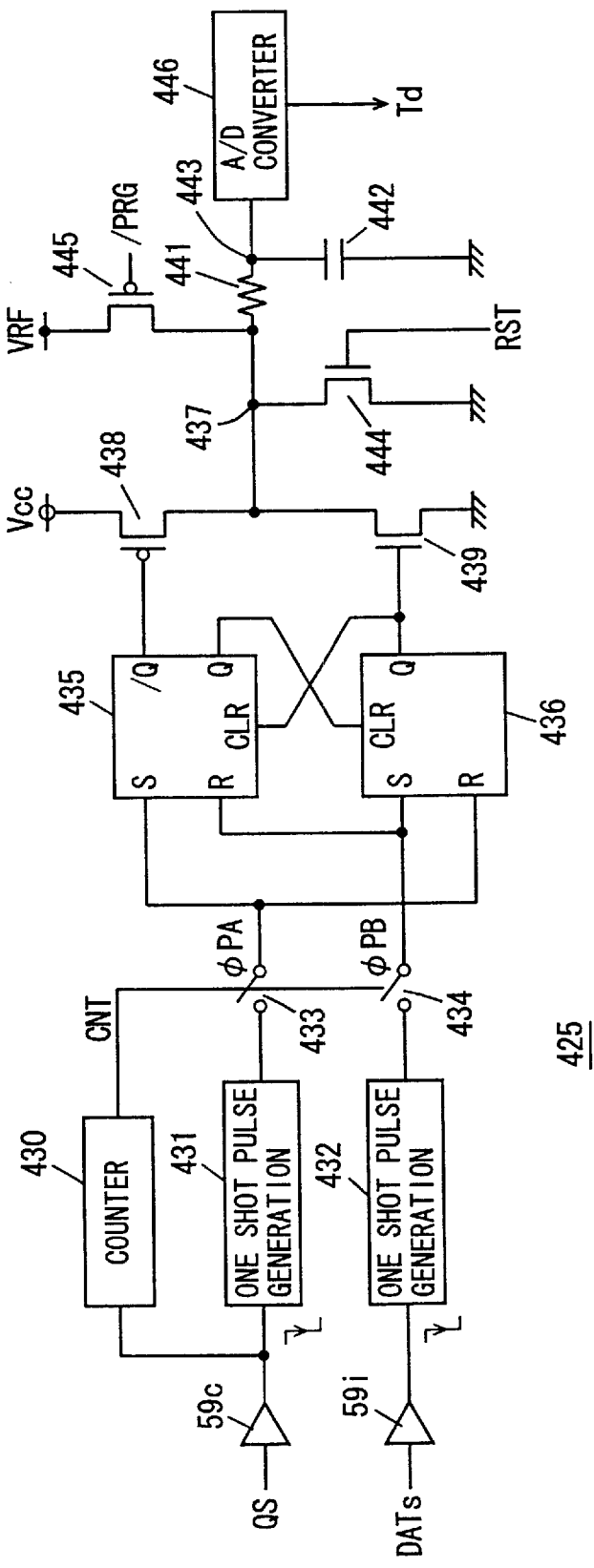
FIG. 51 is a schematic diagram representing a configuration of a phase difference detecting circuit shown in FIG. 50.

FIG. 51 is an illustration of an exemplary configuration of phase difference detecting circuit 425 shown in FIG. 50. Referring to FIG. 51, phase difference detecting circuit 425 includes: a counter 430 for counting in response to the rise of strobe clock signal QS from buffer circuit 59c (or from the edge detecting circuit) and outputting a count signal CNT; a one shot pulse generating circuit 430 for generating a one shot pulse signal in response to the fall of the strobe clock signal QS from buffer circuit 59c; a one shot pulse generating circuit 432 for generating a one shot pulse signal in response to the fall of data signal DAT from buffer circuit 59i; switch circuits 433 and 434 rendered conductive when count signal CNT from counter 430 is activated, for transmitting output signals from one shot pulse generating circuits 431 and 432, respectively; a set-reset flip flop 435 set when a pulse signal φPA applied through switch circuit 433 is active and reset when the pulse signal φPA is active; a set/reset flip flop 436 set in response to activation of the pulse signal φPB and reset in response to activation of the pulse signal φPA; a p channel MOS transistor 438 which is rendered conductive in response to a signal from an output /Q of set/reset flip flop 435 for charging a node 437; an n channel MOS transistor 439 which is rendered conductive in response to a signal from an output Q of set/reset flip flop 436 for discharging node 437; a resistance element 441 connected between nodes 437 and 443; and a capacitance element 442 connected between node 443 and the ground node.

Counter 430 causes count signal CNT to rise to the H level in response to the rise of strobe clock signal QS from buffer circuit 59c, and causes count signal CNT to fall to the L level in response to the next rise of the strobe clock signal QS. Therefore, the counter 430 holds the count signal CNT at the H level in the clock cycle period in which the strobe clock signal QS is applied for the first time. Switch circuits 433 and 434 are rendered conductive when the current signal CNT is at the H level.

Set/reset flip flop 435 receives a signal from output Q of set/reset flip flop 436 at a clear input CLR. Set/reset flip flop 436 receives a signal from output Q of set/reset flip flop 435 at a clear input CLR. Set/reset flip flops 435 and 436 are held in the reset state when the H level signal is applied to the clear inputs CLR, and kept reset even when an activating signal is applied to the set input S.

Resistance element 441 and capacitance element 442 constitute a delay circuit, and node 443 thereof is moderately charged/discharged in accordance with the resistance value R of resistance element 441 and capacitance value C of capacitance element 442.

The phase difference detecting circuit 425 further includes: an n channel MOS transistor 444 which is rendered conductive when the reset signal RST is active for discharging node 437 to the level of the ground voltage; a p channel MOS transistor 445 which is rendered conductive when the precharge designating signal /PRG is active for charging node 437 to the level of the reference voltage VRF; and an A/D converter 446 for converting the voltage at node 443 to digital information. From A/D converter 446, the time data (tap information) Td representing phase difference is output. The reference voltage VRF is at the level of the intermediate voltage of Vcc. The rate of charging/discharging (RC constant) of capacitance element 442 and resistance element 441 is selected at an appropriate value such that with the maximum phase difference, the capacitance element 442 is charged to level of the power supply voltage or discharged to the level of the ground voltage. An operation of the phase difference detecting circuit shown in FIG. 51 will be described with reference to FIGS. 52 and 53.

Figure 52:
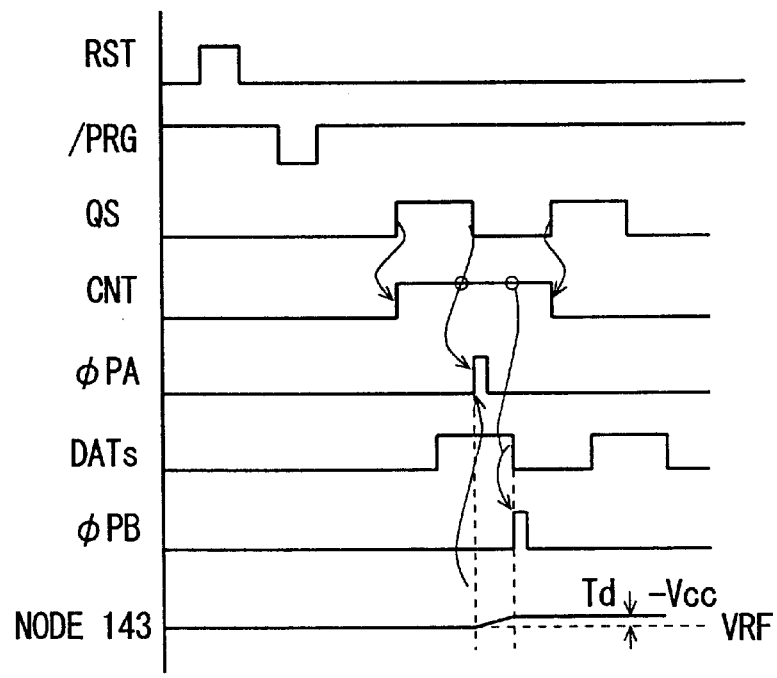
FIG. 52 is a timing chart related to an operation of the phase difference detecting circuit shown in FIG. 51.

FIG. 52 is a diagram of signal waveforms representing an operation when the phase of data signal DATs is delayed from strobe clock signal QS.

When the initialization command is transmitted, reset signal RST is activated, node 437 is discharged to the level of the ground voltage and initialization takes place. Thereafter, precharge designating signal /PRG is set to and kept at the L level for a prescribed time period, so that node 437 is charged to the level of the intermediate voltage VRF.

Thereafter, under the control of transmission/reception control circuit 50, strobe clock signal QS and data signal DATs are transmitted in phase. When the strobe clock signal QS and data signal DATs transmitted from the memory controller are returned to the memory controller, the phase of strobe clock signal QS is advanced from data signal DAT as can be seen from FIG. 52. In response to the rise of the strobe clock signal QS, counter 430 performs counting operation, and drives the count signal CNT to the H level. In response, switch circuits 433 and 434 are rendered conductive.

When the strobe clock signal QS attains to the L level, one shot pulse generating circuit 431 generates a one shot pulse, the pulse signal φPA is set to and kept at the H level for a prescribed time period by switch circuit 433, set/reset flip flop 435 is set, the signal from the output/Q thereof attains to the L level, and p channel MOS transistor 438 is rendered conductive to charge node 437. The charging current of node 437 is transmitted through resistance element 441 to capacitance element 442, and the voltage level of node 443 increases from the precharged voltage level of the reference voltage VRF.

Thereafter, when the data signal DATs arrives, one shot pulse generating circuit 432 generates a one shot pulse signal in response to the fall of the data signal DATs, and the pulse signal φPB from switch circuit 434 attains to and kept at the H level for a prescribed time period. In response, set/reset flip flop 435 is reset, MOS transistor 438 is rendered non-conductive, and charging operation of capacitance element 442 is completed. Set/reset flip flop 436 is set to the cleared state by the signal from output Q of set/reset flip flop 435, and even when the pulse signal φPB is applied, the signal from the output Q of the flip flop 436 is maintained at the L level.

When the strobe clock signal QS rises to the H level next, counter 430 performs counting operation, causes the count signal CNT to fall to the L level, and switch circuits 433 and 434 are rendered non-conductive. Thus, transmission of the pulse signals from one shot pulse generating circuits 431 and 432 is stopped. Therefore, at node 443, the information corresponding to the phase difference between strobe clock signal QS and data signal DATs is maintained. The voltage at node 443 is converted to digital information by A/D converter 446.

When the voltage amplitude of node 434 is small, an amplifier may be provided between node 443 and A/D converter 446.

An operation when the phase of data signal DATs is advanced from the phase of strobe clock signal QS will be described with reference to FIG. 53. First, data signal DATs rises to the H level and, thereafter, strobe clock signal QS rises to the H level. Here, data signal DATs is transmitted in a pattern of "1010 . . . ", in accordance with the strobe clock signal QS. In response to the rise of the strobe clock signal QS, count signal CNT from counter 430 attains to the H level, and switch circuits 433 and 434 are rendered conductive. When the count signal CNT attains to the H level, then data signal DATs fall to the L level (data pattern of 1010), pulse signal φPB attains to the H level, set/reset flip flop 436 is set, and MOS transistor 439 is rendered conductive. Accordingly, the voltage level of node 443 lowers gradually. Then, when strobe clock signal QS falls to the L level, pulse signal φPA attains to the H level, set/reset flip flop 436 is reset, and MOS transistor 439 is rendered non-conductive. Set/reset flip flop 435 is receiving the signal at output Q of set/reset flip flop 436 at the clear input CLR and maintained at the cleared state, and therefore setting by the pulse signal φPA is inhibited.

Thereafter, when the strobe clock signal QS attains to the H level, count signal CNT attains to the L level, switch circuits 433 and 434 are rendered non-conductive, and transmission of the pulse signal thereafter is inhibited. Accordingly, a voltage corresponding to the phase difference between data signal DATs and strobe clock signal QS is held at node 443.

Figure 53:
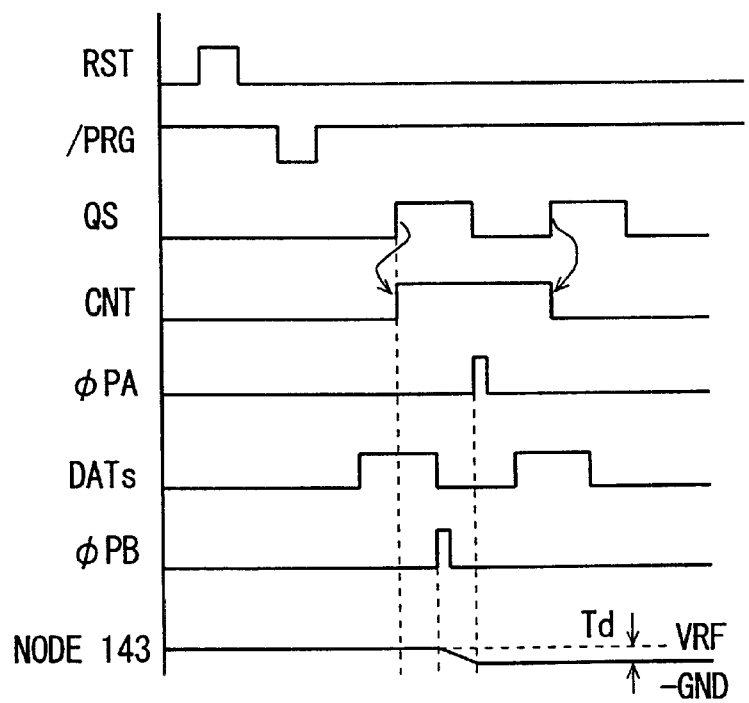
FIG. 53 is a timing chart related to an operation of the phase difference detecting circuit shown in FIG. 51.

In the operations shown in FIGS. 52 and 53, count signal CNT is kept at the H level for 1 clock cycle period of the strobe clock signal QS. Here, it is assumed that the maximum phase difference between the data signal DATs and strobe clock signal QS is half the cycle of the strobe clock signal QS. If the phase difference between the strobe clock signal QS and data signal DAT is larger than the half cycle of the strobe clock signal QS, the count period of counter 430 should be made longer. Alternatively, based on the tap information of the memory chip closest to the memory controller in the memory system, the delay amount over the entire line may be estimated, and the count value may be set based on the estimated value.

In the memory controller, a configuration for detecting match/mismatch of phases between data signal DATs and strobe clock signal may be used. Here, in the memory controller signal transmitting section, the strobe clock signal QS and data signal DAT are transmitted with the phases delayed until a match is detected at the memory controller signal input section. The phase difference over the entire line length may be detected based on the delay amount at the transmitting section.

The data signal DATs may be an OR of all the bits of data DAT. This enables generation of the pulse signal in accordance with the slowest data signal, and hence enables accurate data taking.

Further, using the strobe clock signal QS and data DAT transmitted from the memory chip, the vernier amount may be actually detected for each memory chip. In each memory chip, an average between the maximum and minimum values of the vernier amount allowing accurate taking of data is set as the vernier amount (delay amount) for each memory hip. In this case, data having a known pattern of "1010", for example, is written to the memory chip and thereafter the data pattern is read, and match/mismatch of the received data pattern is determined by the memory controller, so as to determine whether accurate data taking is performed or not.

Modification

Figure 54:
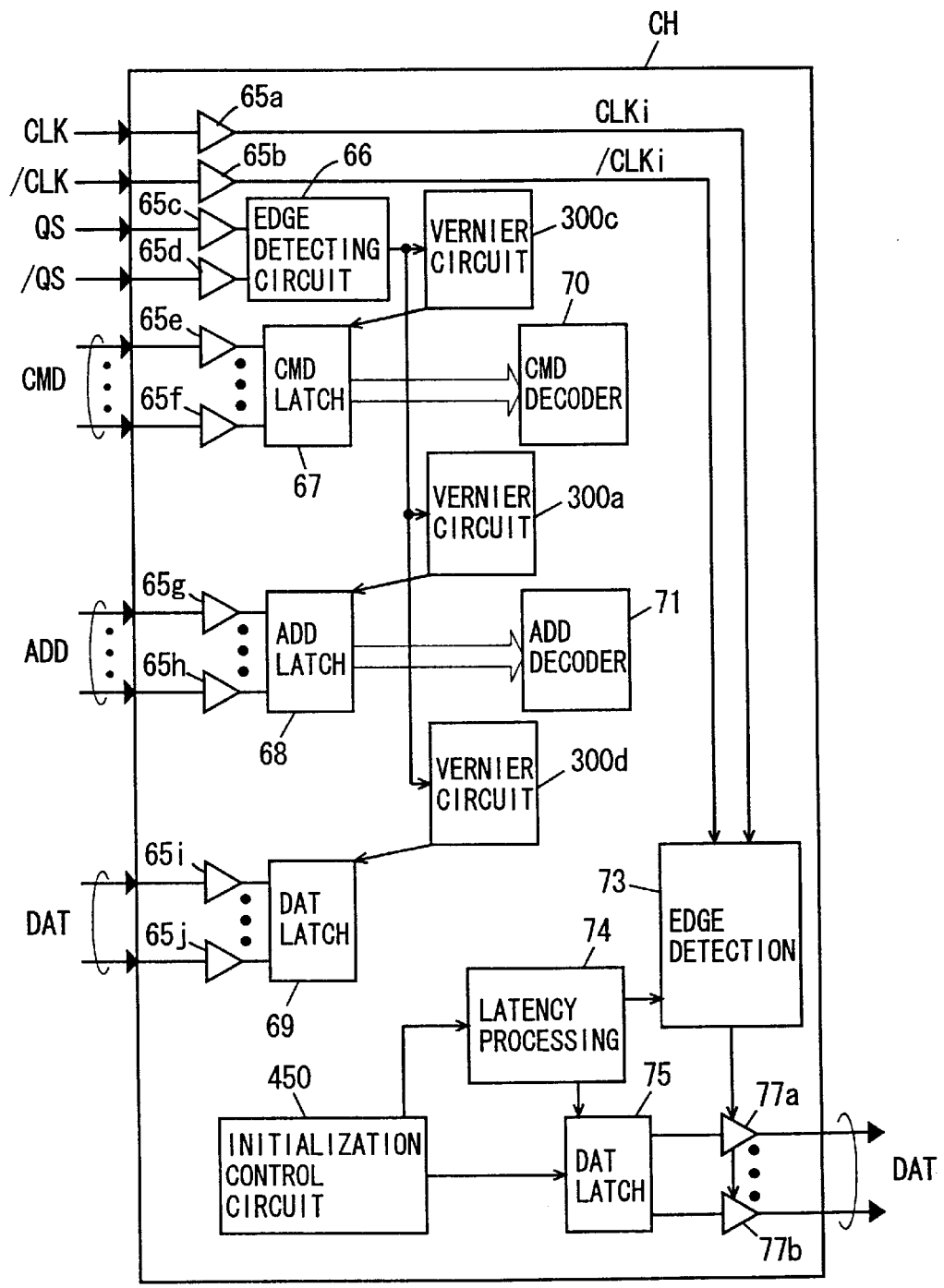
FIG. 54 is a schematic diagram representing a configuration of the memory chip in accordance with a modification of an eighth embodiment of the present invention.

FIG. 54 is a schematic diagram representing a configuration of a modification of the eighth embodiment in accordance with the present invention. In FIG. 54, vernier circuits 300c, 300a and 300d are provided for CMD latch 67, ADD latch 68 and DAT latch 69. For setting the vernier amount (delay amount) of vernier circuits 300c, 300a and 300d, initialization control circuit 450 is provided. Except this point, the configuration is the same as that shown in FIG. 20, and corresponding portions are denoted by the same reference characters. Detailed description thereof is not repeated.

When transmission lines have mutually different propagation delays, amounts of delay for the command CMD, address ADD and data DAT with respect to the edges of strobe clock signals QS and /QS are adjusted in the memory chip CH. Accordingly, signals can be taken accurately.

Figure 55:
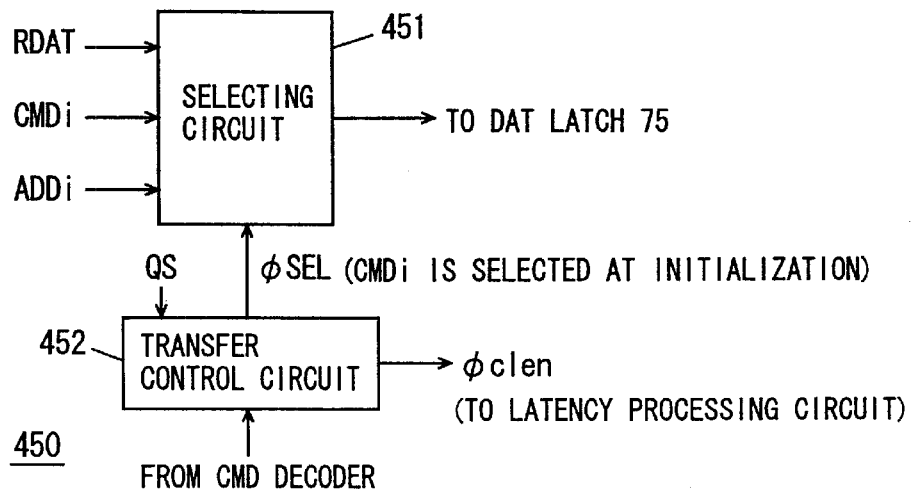
FIG. 55 is a schematic diagram representing a configuration of an initialization control circuit shown in FIG. 54.

FIG. 55 is a schematic diagram representing the configuration of initialization control circuit 450. Referring to FIG. 55, initialization control circuit 450 includes a selecting circuit 451 for selecting and applying to DAT latch 75 either of the data RDAT read from the memory circuit (not shown in FIG. 54), internal command CMDi applied from CMD latch 67 and internal address signal ADDi applied from ADD latch 68, and a transfer control circuit 452 for switching connection of selecting circuit 451 in accordance with an operation mode designating signal from CMD decoder 70. Transfer control circuit 452 applies an activating signal φclen to latency processing circuit 74.

At the time of initialization, transfer control circuit 452 sets selecting signal φSEL to a state for selecting internal command signal CMDi. At the time of initialization, transfer control circuit 452 sets latency processing circuit 74 always at the active state.

Therefore, at the time of initialization when the memory system is activated or at board assembly, selecting circuit 451 selects internal command signal CMDi and applies the selected signal to DAT latch 75. CMD latch 67 latches the command CMD applied through buffers 65b to 65f, in accordance with an output signal from vernier circuit 300c. When the strobe clock signal QS is applied, transfer control circuit 452 forces the activating signal φclen for latency processing circuit 74 to the active state after the lapse of a prescribed clock cycle (for example, after 1 clock cycle), so as to cause DAT latch 75 to latch internal command signal CMDi, and transmits the signal through buffer circuits 77a to 77d to the data bus.

In the memory controller, after the lapse of prescribed clock cycles from the return of command CMD, the command signal applied through the data bus is taken, and match/mismatch between the returned command (or the transmitted command) and the taken command is determined. This operation is repeated with the vernier amount (delay amount) of vernier circuit 300c changed variously, so as to determine optimal value for the delay amount of vernier circuit 300c for taking the command in the memory chip CH (arithmetic average value between the maximum and minimum vernier amounts when the command signal is taken normally). A configuration in which the set tap value is transmitted from the memory controller to the corresponding memory chip CH may be used. Alternatively, when the command is taken normally, the CMD decoder 70 receives the command CMD accurately and performs decoding operation, and therefore a circuit for saving the maximum and minimum values of the delay amount when the taking is successful of vernier circuit 300c under the control of CMD decoder 70 may be provided, and the optimal value of vernier circuit 300c may be set in accordance with the saved maximum and minimum values.

After the amount of delay of vernier circuit 300c for the command CMD is set, the amount of delay of vernier circuit 300a for the address signal ADD is adjusted. Here, as the command CMD is taken accurately, transfer control circuit 452 causes transition of selecting signal ϕSEL in response to the switch designation from CMD decoder 70 so as to cause selecting circuit 451 to select internal address signal ADDi. When the strobe clock signal QS is applied in this state, transfer control circuit 452 activates the latency processing circuit activating signal ϕclen, and returns the taken address signal to data bus through DAT latch 75 and buffer circuits 77a to 77d (see FIG. 54). In the memory controller, similar operation of determination is repeated on the address signal, and the optimal delay amount of vernier circuit 300a for the address signal of the memory chip CH is set. After the delay time of vernier circuit 300a for address signal ADD is set, the memory controller again generates a command to apply an instruction for transfer control circuit 452 to select read data RDAT. Further, in response to the read data selection designation, transfer control circuit 452 sets latency processing circuit 74 to a state activated in accordance with the read activating signal, which in turn is activated by the read command from the memory circuit.

For the data DAT, data having a prescribed pattern is written from the memory controller, the read command is applied thereafter, and the written data is read. In this case, read data RDAT is transmitted through DAT latch 75 to the data bus. In the memory controller, whether the returned data has the prescribed data pattern or not is determined, and the amount of delay of the vernier circuit 300d for the data is set.

A configuration in which the data latched in DAT latch 69 is selected in place of read data RDAT for the data DAT at the time of initialization may be used.

In the memory controller, the delay amount for the data is set in the vernier circuit. From the memory chip CH, strobe clock signals QS and /QS are not returned. Therefore, based on the delay time set for the vernier circuit 300d with respect to the data in the memory chip CH, the delay time of the vernier circuit for each memory chip CH is set in the memory controller.

At the time of initialization, in the memory controller, the applied signal may be taken based on the worst case of the maximum delay time of the memory chips CH, taking into consideration the difference in delay. times of signal propagation over the entire transmission line.

As described above, according to the eighth embodiment, vernier circuits for adjusting timings of taking input signals are provided for respective memory chips, and therefore, even when there is a skew among signals derived from difference in line parasitic capacitance and parasitic resistance, it is possible to take applied signals accurately in respective memory chips to perform designated operation.

Other Applications

The memory chip used in the memory system may be any semiconductor memory device which operates in synchronization with the clock signal. Other than the DRAM, it may be an SRAM (static random access memory) or a nonvolatile semiconductor memory device.

The memory controller may be a processor.

As described above, according to the present invention, signals are transmitted only in one direction to be transmitted to a plurality of memory chips. Therefore, the response time of respective memory chips does not vary, and hence a memory system operating at high speed can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A memory system, comprising:
a first signal bus arranged between a first port and a second port positioned opposing to said first port and coupled to said first and second port, for transferring signals including data along one-way direction from said first port to said second port; and
a plurality of first individual memory devices coupled in parallel to each other to said first signal bus for communicating the signals with said first signal bus, a sum of a time period required for the signals including a data read instructing signal to travel from said first port to each respective first individual memory device and a time period required for the data read out from each respective first individual memory device to travel from each respective first individual memory device to said second port being substantially equal with respect to said plurality of first individual first memory devices.

2. The memory system according to claim 1, wherein said first port includes an input terminal for receiving a signal from transmitting circuitry having a transmitting function, and
said second port includes an output terminal coupled to receiving circuitry having a receiving function, for receiving the signal from said first signal bus for transmission to said receiving circuitry.

3. The memory system according to claim 1, wherein said first signal bus includes a clock signal line for transmitting a clock signal applied from said first port, and said plurality of first individual memory devices operate in synchronization with said clock signal.

4. The memory system according to claim 1, wherein said first signal bus includes
a command bus for transmitting at least a command designating an operation to be executed, a data bus provided separate from said command bus for transmitting said data, a command clock signal line for transmitting a command clock signal to provide a timing of taking said command, and a data clock signal line provided separate from said command clock signal line for transmitting a data clock signal providing timing of taking said data.

5. The memory system according to claim 1, wherein said first port includes an input terminal receiving a signal from an externally provided external device, and a transmission unit coupled to said input terminal for outputting a signal to said first signal bus in accordance with a signal applied through said input terminal; and said second port includes an output terminal coupled to said external device, and a reception unit coupled to said first signal bus, receiving a signal on said first signal bus for transmitting a signal corresponding to a received signal to said external device by driving said output terminal in accordance with the received signal.

6. The memory system according to claim 1, wherein said plurality of first individual memory devices are formed integrally in a module, the module is arranged in plurality and the plurality of the modules are cascaded so that the first and second ports are connected successively.

7. A memory system, comprising:

a plurality of individual memory devices arranged on a first surface of a base board;

an interconnection line providing one-way signal communication commonly to said plurality of individual memory devices and arranged electrically continuous over said first surface and a second surface opposite to said first surface of said base board; and a control unit coupled commonly to said plurality of individual memory devices through said interconnection line for communicating a signal with said plurality of individual memory devices through said interconnection line, wherein along a one-way direction of said interconnection line, the sum of the length of said interconnection line from said control unit to an individual memory device of said plurality of the individual memory devices and the length of said interconnection line from said individual memory device of the individual memory devices to said control unit is constant with respect to each individual memory device of said plurality of individual memory devices.

8. The memory system according to claim 7, wherein said control unit includes a transmission unit arranged on the first surface of said base board at one end of said interconnection line, for transmitting a signal to said plurality of individual memory devices, and a reception unit arranged at another end of said interconnection line on the second surface of said base board, for receiving the signal transmitted through said line.

9. The memory system according to claim 7, wherein said control unit is arranged at one end of the line on the first surface of said base board and includes both (i) a transmission unit for transmitting a signal to said plurality of individual memory devices through said line, and (ii) a reception unit for receiving the signal transmitted through said line.

10. The memory system according to claim 7, wherein said control unit includes a first control unit arranged at one end side of said base board on the first surface of said base board for communicating a signal with the line, and a second control unit arranged at said one end side of said base board on the second surface of said base board, for communicating a signal with said line.

11. The memory system according to claim 7, further comprising a port arranged adjacent to said control unit for transmitting and receiving a signal between an external unit and said control unit.

12. The memory system according to claim 7, wherein said control unit includes a memory control circuit arranged at a first end side on the first surface of said base board and having at least a transmission function for controlling an operation of the individual memory devices; and lines of said interconnection line arranged on the first and second surface are electrically connected to each other through a via hole penetrating through said base board and formed at a second end side opposing to said first end side of said base board.

13. The memory system according to claim 12, wherein said memory control circuit further includes a receiving section for receiving a signal from said interconnection line, and said receiving section is coupled to the line of the interconnection line arranged on said second surface through a via hole penetrating through said base board formed adjacent to said first end side of said base board.

14. The memory system according to claim 1, wherein said first signal bus includes a clock signal line for transmitting a clock signal defining an operation cycle of said plurality of first individual memory devices, a command bus transmitting a command designating an operation mode, and a strobe clock signal line provided separate from said clock signal line for transmitting a strobe clock signal providing at least a timing of taking said command.

15. The memory system according to claim 1, wherein said first signal bus includes a data line for transmitting data, a command line for transmitting a command designating an operation mode, and a clock signal line for transmitting a clock signal defining an operation cycle of said plurality of first individual memory devices;

said memory system further comprising a controller for transmitting and receiving a signal through the first and second ports, said controller including a command detecting circuit coupled to said command line, for detecting a data output command designating data output, said data output command and being returned through said command line, and a data input circuit responsive to a data output command detection designation from said command detecting circuit for taking data applied through said data line after a data output latency cycle period of said clock signal.

16. The memory system according to claim 1, further comprising a controller for transmitting and receiving a signal through the first and second ports; wherein said first signal bus includes
- a clock signal line for transmitting a clock signal defining an operation cycle of said plurality of first individual memory devices,
- a data line for transmitting data output from any of said plurality of first individual memory devices, and
- a control signal line for transmitting a command application designating signal; and said controller includes
- a detecting circuit for detecting said command application designating signal returned through said clock signal line, and
- an input circuit for taking data on said data line after a latency cycle period of said clock signal in response to a detection designation signal from said detecting circuit.

17. The memory system according to claim 1, further comprising
- a controller for transferring command and data through said first signal bus through the first and second ports, said controller including a circuit for taking data on said first signal bus after a prescribed latency cycle period from transmission of a command requesting data output to said first signal bus.

18. The memory system according to claim 14, further comprising a controller for communicating a signal with said plurality of first individual memory devices through said first signal bus, said controller including an adjusting circuit for an amount of delay with respect to a latency of each of the first individual memory devices, said latency indicating a time period required from application of a data output requesting command to a specific first individual memory device to arrival of requested data from the specific first individual memory device to said controller.

19. The memory system according to claim 14, wherein each of said plurality of first individual memory devices includes
- variable delay circuitry having a delay amount made variable, for delaying and outputting said strobe clock signal, and
- an input circuit responsive to an output signal from said variable delay circuit for taking a signal transmitted through said first signal bus.

20. The memory system according to claim 19, wherein said input circuit includes
- an input buffer circuit comparing the signal on said first signal bus with a reference voltage for generating an internal signal in accordance with a result of comparison; and
- said variable delay circuitry includes a delay control circuit for setting the delay amount of said variable delay circuitry so as to increase a margin for a logic level determination level of said signal with respect to said reference voltage.

* * * * *